United States Patent
Kajiya et al.

(10) Patent No.: US 8,872,039 B2
(45) Date of Patent: Oct. 28, 2014

(54) CONDUCTIVE ELEMENT AND METHOD FOR PRODUCING THE SAME, WIRING ELEMENT, INFORMATION INPUT DEVICE, DISPLAY DEVICE, ELECTRONIC APPARATUS, AND MASTER

(75) Inventors: Shunichi Kajiya, Miyagi (JP); Kazuya Hayashibe, Miyagi (JP)

(73) Assignee: Sony Corporation, Tokyo (JP)

( * ) Notice: Subject to any disclaimer, the term of this patent is extended or adjusted under 35 U.S.C. 154(b) by 315 days.

(21) Appl. No.: 13/413,390

(22) Filed: Mar. 6, 2012

(65) Prior Publication Data

US 2012/0241198 A1 Sep. 27, 2012

(30) Foreign Application Priority Data

Mar. 25, 2011 (JP) ................. 2011-068342

(51) Int. Cl.
| | | |
|---|---|---|
| *H05K 1/03* | (2006.01) | |
| *G06F 3/041* | (2006.01) | |
| *H05K 3/06* | (2006.01) | |
| *G06F 3/044* | (2006.01) | |
| *G06F 3/047* | (2006.01) | |
| *G02F 1/167* | (2006.01) | |

(52) U.S. Cl.
CPC ...... *G06F 3/0412* (2013.01); *G02F 2001/1676* (2013.01); *H05K 3/06* (2013.01); *G06F 3/044* (2013.01); *G06F 3/047* (2013.01); *H05K 2201/0338* (2013.01); *Y10S 977/742* (2013.01); *Y10S 977/773* (2013.01); *Y10S 977/932* (2013.01)
USPC .......... 174/255; 427/98.4; 977/742; 977/773; 977/932

(58) Field of Classification Search
CPC ............. H05K 1/02; H05K 1/09; H05K 3/02; H05K 3/06; G06F 3/0412; G06F 3/044; B82Y 30/00; H01L 31/068; H01L 31/0236
USPC ........... 174/255; 427/98.4; 977/742, 773, 932
See application file for complete search history.

(56) References Cited

U.S. PATENT DOCUMENTS

| | | | | | |
|---|---|---|---|---|---|
| 4,556,790 | A | * | 12/1985 | Glass et al. .................. | 257/431 |
| 6,127,623 | A | * | 10/2000 | Nakamura et al. ........... | 136/256 |
| 2003/0111105 | A1 | * | 6/2003 | Tsukuda et al. .............. | 136/251 |
| 2008/0304155 | A1 | * | 12/2008 | Endoh et al. ................. | 359/558 |
| 2009/0071160 | A1 | * | 3/2009 | Keller et al. .................. | 60/753 |

FOREIGN PATENT DOCUMENTS

| | | |
|---|---|---|
| JP | 2005-149807 | 6/2005 |
| JP | 2009-266025 | 11/2009 |

* cited by examiner

*Primary Examiner* — Xiaoliang Chen
(74) *Attorney, Agent, or Firm* — K&L Gates LLP

(57) ABSTRACT

A conductive element includes a base having a first wavy surface, a second wavy surface, and a third wavy surface, a first layer provided on the first wavy surface, and a second layer provided on the second wavy surface. The first layer has a multilayer structure including two or more stacked sublayers, the second layer has a single-layer or multilayer structure including part of the sublayers constituting the first layer, and the first and second layers form a conductive pattern portion. The first, second, and third wavy surfaces satisfy the following relationship: $0 \leq (Am1/\lambda m1) < (Am2/\lambda m2) < (Am3/\lambda m3) \leq 1.8$ (Am1: mean amplitude of first wavy surface, Am2: mean amplitude of second wavy surface, Am3: mean amplitude of third wavy surface, $\lambda m1$: mean wavelength of first wavy surface, $\lambda m2$: mean wavelength of second wavy surface, $\lambda m3$: mean wavelength of third wavy surface).

21 Claims, 27 Drawing Sheets

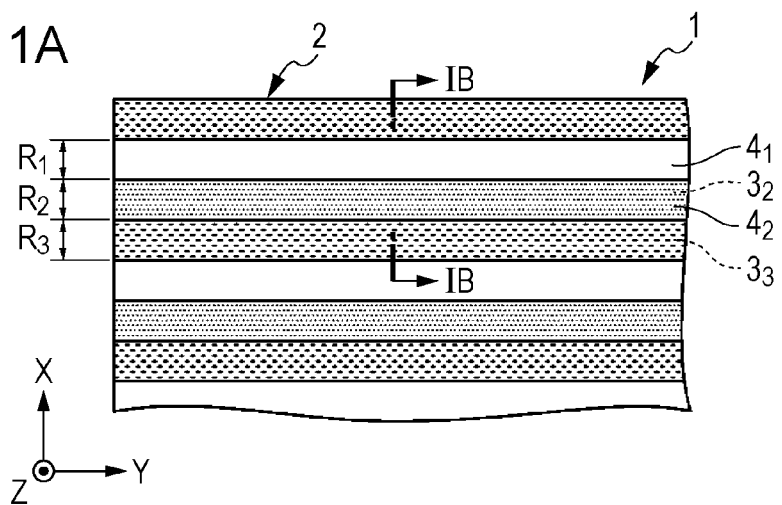
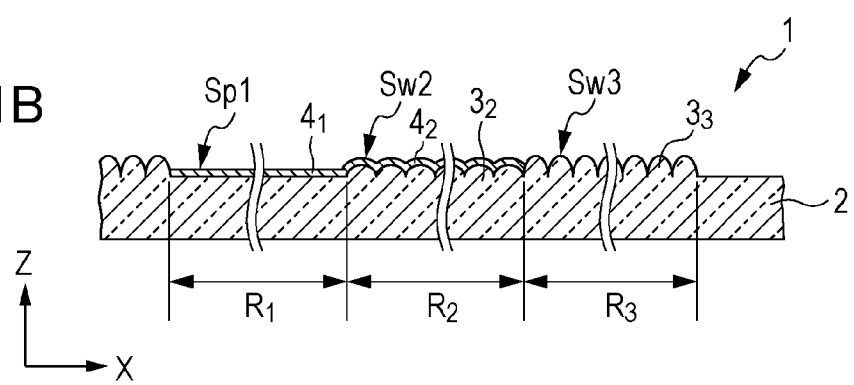
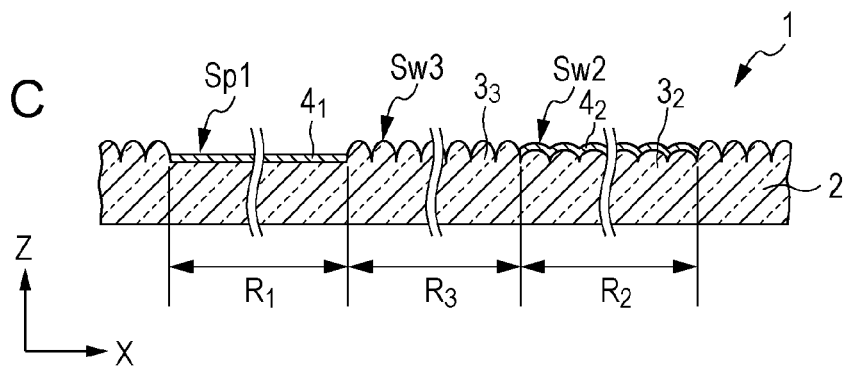

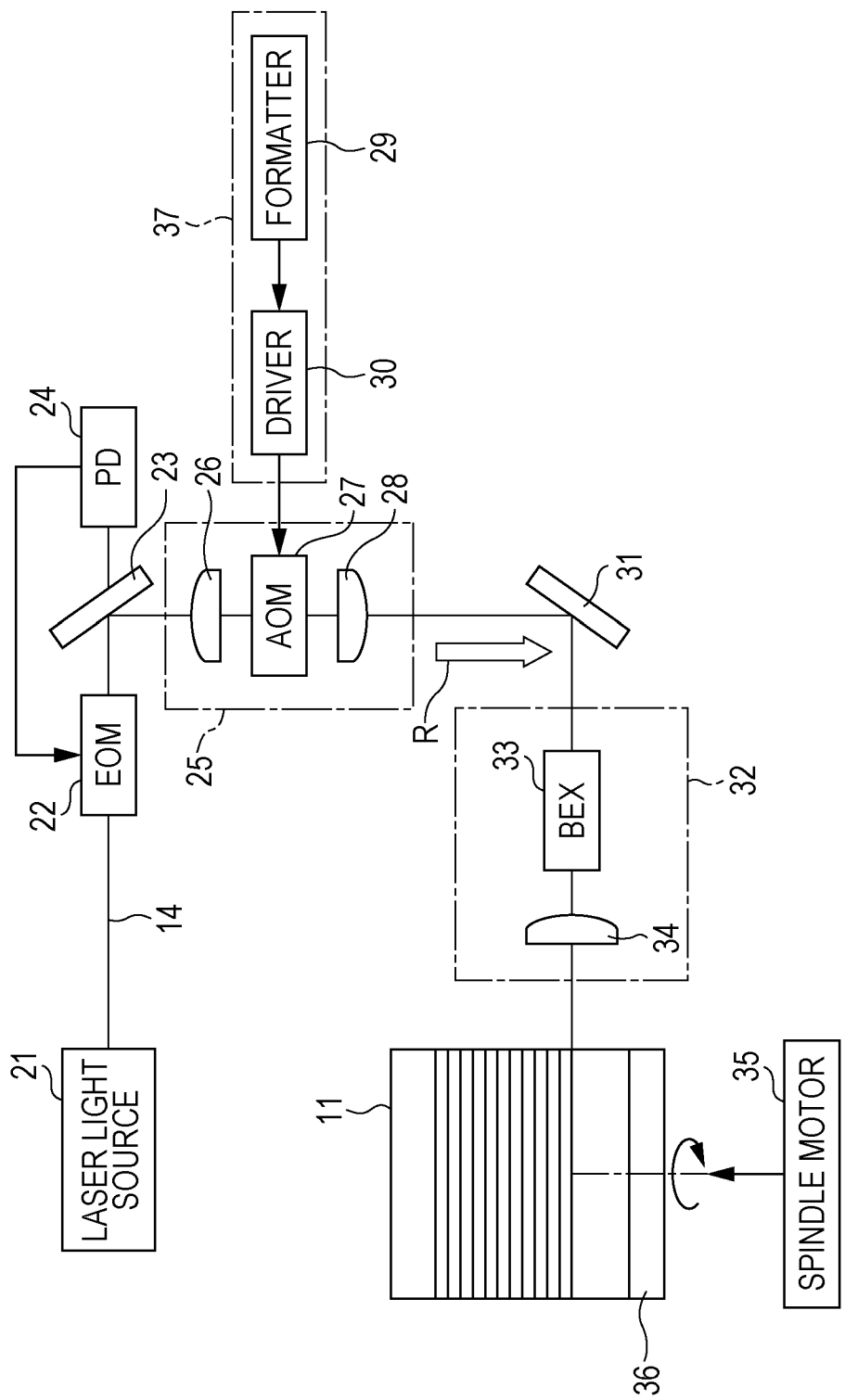

CONDUCTIVE ELEMENT AND METHOD FOR PRODUCING THE SAME, WIRING ELEMENT, INFORMATION INPUT DEVICE, DISPLAY DEVICE, ELECTRONIC APPARATUS, AND MASTER

CROSS REFERENCES TO RELATED APPLICATIONS

The present application claims priority to Japanese Priority Patent Application JP 2011-068342 filed in the Japan Patent Office on Mar. 25, 2011, the entire content of which is hereby incorporated by reference.

BACKGROUND

The present application relates to an electroconductive element (hereinafter referred to as "conductive element") and a method for producing the same, a wiring element, an information input device, a display device, an electronic apparatus, and a master. More specifically, the present application relates to a conductive element in which a conductive pattern portion is formed on a surface of a base.

Hitherto, a method for forming a circuit pattern using photolithography has been widely used as a method for forming a conductive layer having a predetermined circuit pattern on an insulating base composed of glass, a plastic, or the like. In such a method for forming a circuit pattern, a step and repeat method or a method similar to the step and repeat method is commonly used. Specifically, in this method, a circuit pattern is formed through the steps of "metal layer coating", "application of resist", "exposure, "development", "etching", and "resist removal". Thus, the method for forming a circuit pattern using photolithography has a low throughput.

In order to realize improvement in the throughput, a method for forming a circuit pattern using screen printing has been proposed. In this method for forming a circuit pattern using screen printing, a conductive layer having a predetermined circuit pattern is formed by applying, for example, a metal paste onto an insulating base through a mask using a squeegee, and then baking the metal paste. Since this method for forming a circuit pattern using screen printing provides a high throughput, applications of this method to various devices have been studied. For example, Japanese Unexamined Patent Application Publication No. 2009-266025 discloses a method for forming an electrode of a touch panel by using screen printing. Also, Japanese Unexamined Patent Application Publication No. 2005-149807 discloses a method for forming an electrode of an image forming apparatus by using screen printing.

However, screen printing is disadvantageous in that, for example, a mask is expensive, mask alignment with high accuracy is a complicated operation, and openings formed in the mask are susceptible to clogging. Therefore, besides screen printing, a method for forming a circuit pattern, the method being capable of realizing a high throughput, has been desired.

SUMMARY

It is desirable to provide a conductive element and a method for producing the same, a wiring element, an information input device, a display device, an electronic apparatus, and a master which can realize a high throughput.

According to an embodiment of the present application, there is provided a conductive element including a base having a first wavy surface, a second wavy surface, and a third wavy surface; a first layer provided on the first wavy surface; and a second layer provided on the second wavy surface, wherein the first layer has a multilayer structure in which two or more sublayers are stacked, the second layer has a single-layer or multilayer structure including part of the sublayers constituting the first layer, the first layer and the second layer form a conductive pattern portion, and the first wavy surface, the second wavy surface, and the third wavy surface satisfy the following relationship:

$$0 \leq (Am1/\lambda m1) < (Am2/\lambda m2) < (Am3/\lambda m3) \leq 1.8$$

where $Am1$ is a mean amplitude of vibrations of the first wavy surface, $Am2$ is a mean amplitude of vibrations of the second wavy surface, $Am3$ is a mean amplitude of vibrations of the third wavy surface, $\lambda m1$ is a mean wavelength of the first wavy surface, $\lambda m2$ is a mean wavelength of the second wavy surface, and $\lambda m3$ is a mean wavelength of the third wavy surface.

According to another embodiment of the present application, there is provided a method for producing a conductive element, the method including forming a stacked film on a surface of a base having a first wavy surface, a second wavy surface, and a third wavy surface by stacking two or more sublayers; and forming a conductive pattern portion by removing the stacked film located on the third wavy surface, among the first wavy surface, the second wavy surface, and the third wavy surface, by leaving, as a first layer, the stacked film located on the first wavy surface, and leaving, as a second layer, part of the sublayers constituting the stacked film located on the second wavy surface, wherein the first wavy surface, the second wavy surface, and the third wavy surface satisfy the following relationship:

$$0 \leq (Am1/\lambda m1) < (Am2/\lambda m2) < (Am3/\lambda m3) \leq 1.8$$

where $Am1$ is a mean amplitude of vibrations of the first wavy surface, $Am2$ is a mean amplitude of vibrations of the second wavy surface, $Am3$ is a mean amplitude of vibrations of the third wavy surface, $\lambda m1$ is a mean wavelength of the first wavy surface, $\lambda m2$ is a mean wavelength of the second wavy surface, and $\lambda m3$ is a mean wavelength of the third wavy surface.

According to embodiments of the present application, a conductive pattern portion can be formed as follows: A stacked film is formed on a first wavy surface, a second wavy surface, and a third wavy surface of a base. Next, the stacked film located on the third wavy surface, among the first wavy surface, the second wavy surface, and the third wavy surface, is removed, the stacked film located on the first wavy surface is left as a first layer, and part of sublayers constituting the stacked film located on the second wavy surface is left as a second layer by utilizing a difference in the state of the stacked film formed on the first wavy surface, the second wavy surface, and the third wavy surface.

As described above, according to embodiments of the present application, it is possible to provide a conductive element that has a high accuracy and that realizes a high throughput.

Additional features and advantages are described herein, and will be apparent from the following Detailed Description and the figures.

BRIEF DESCRIPTION OF THE FIGURES

FIG. 1A is a plan view illustrating a configuration example of a conductive element according to a first embodiment of the present application;

FIG. 1B is a cross-sectional view taken along line IB-IB in FIG. 1A;

FIG. 1C is a cross-sectional view illustrating a modification of the order of arrangement of a first region, a second region, and a third region;

FIG. 7 is a schematic view illustrating a configuration example of a roll master exposure apparatus;

DETAILED DESCRIPTION

Embodiments of the present application will now be described with reference to the drawings.

First Embodiment (An Embodiment in which Conductive Pattern Portions are Formed on a Surface of a Base by Utilizing a Difference Among a Planar Surface and Two Types of Wavy Surfaces)

[Configuration of Conductive Element]

Figure 2A:
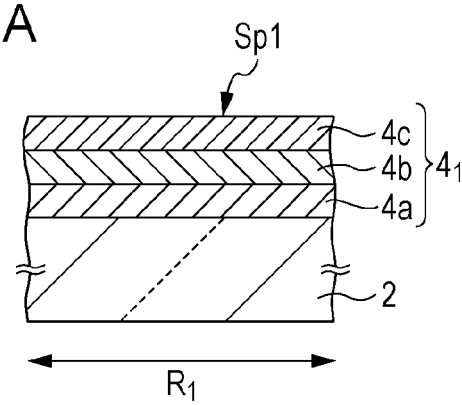
FIG. 2A is an enlarged cross-sectional view of a portion of the first region illustrated in FIG. 1B.
Figure 2B:
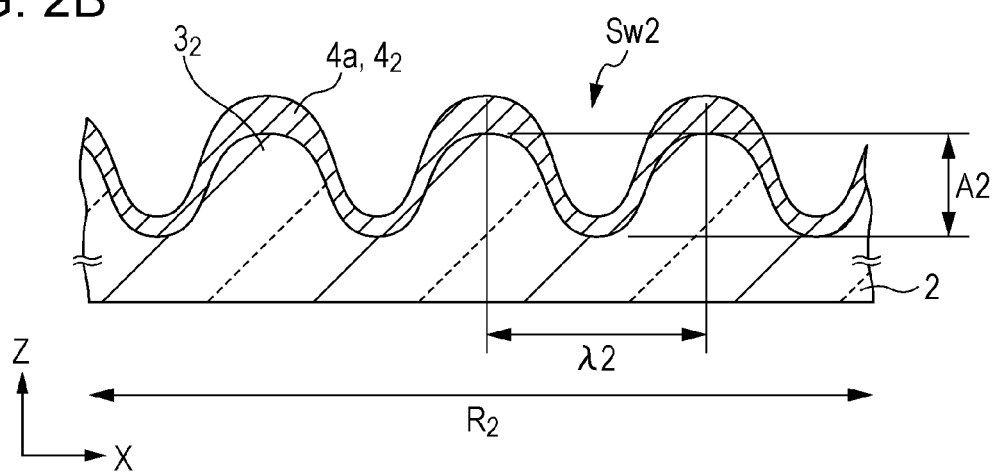
FIG. 2B is an enlarged cross-sectional view of a portion of the second region illustrated in FIG. 1B.
Figure 2C:
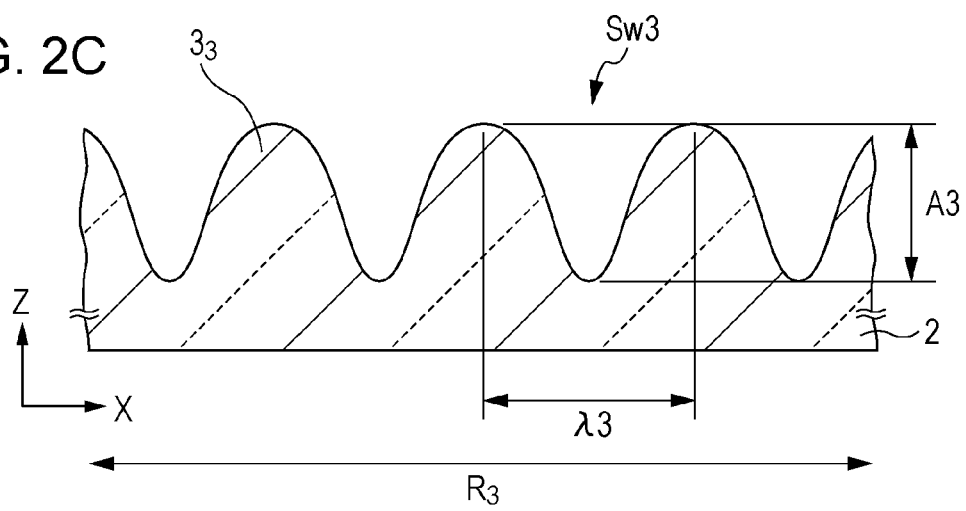
FIG. 2C is an enlarged cross-sectional view of a portion of the third region illustrated in FIG. 1B.

FIG. 1A is a plan view illustrating a configuration example of an electroconductive element (conductive element) according to a first embodiment of the present application. FIG. 1B is a cross-sectional view taken along line IB-IB in FIG. 1A. FIG. 2A is an enlarged cross-sectional view of a portion of a first region illustrated in FIG. 1B. FIG. 2B is an enlarged cross-sectional view of a portion of a second region illustrated in FIG. 1B. FIG. 2C is an enlarged cross-sectional view of a portion of a third region illustrated in FIG. 1B. In the description below, two directions orthogonal to each other in a main surface of a conductive element 1 are referred to as "X-axis direction" and "Y-axis direction", and a direction perpendicular to the main surface is referred to as "Z-axis direction".

The conductive element 1 according to the first embodiment includes a base 2 having a first region $R_1$, a second region $R_2$, and a third region $R_3$, a first layer $4_1$ formed in the first region $R_1$, and a second layer $4_2$ formed in the second region $R_2$. The first layer $4_1$ is continuously formed in the first region $R_1$ so as to form a conductive pattern portion. The second layer $4_2$ is continuously formed in the second region $R_2$ so as to form a conductive pattern portion. The first layer $4_1$ and the second layer $4_2$ may form separate conductive pattern portions. Alternatively, the first layer $4_1$ and the second layer $4_2$ may form a single conductive pattern portion.

The conductive pattern portion is, for example, a wiring pattern portion or an electrode pattern portion. Preferably, the first layer $4_1$ has a multilayer structure in which two or more sublayers are stacked, and contains at least a sublayer having electrical conductivity. Preferably, the second layer $4_2$ has a single-layer structure or multilayer structure including part of the sublayers constituting the first layer $4_1$, and contains at least a sublayer having electrical conductivity. Herein, "part of sublayers constituting the first layer $4_1$" refers to sublayers obtained by removing at least one sublayer from the top of the first layer $4_1$ having a multilayer structure, or sublayers obtained by causing at least one sublayer from the top of the first layer $4_1$ having a multilayer structure to be discontinuous, for example, to form island shapes, and keeping the remaining sublayers continuous.

This conductive element 1 is, for example, a printed board or an image display device. Examples of the printed board include a rigid board, a flexible board, and a flexible-rigid board. Examples of the image display device include liquid crystal display devices, and electroluminescence (EL) devices (such as an organic EL device and an inorganic EL device).

In FIG. 1B, the first region $R_1$, the second region $R_2$, and the third region $R_3$ are arranged in that order. However, this order is an example, and the order of these regions may be changed to a desired order in accordance with, for example, the design of a circuit or an element. For example, as illustrated in FIG. 1C, the third region $R_3$ may be arranged between the first region $R_1$ and the second region $R_2$ so that the first layer $4_1$ and the second layer $4_2$ function as separate conductive pattern portions. Specifically, the first layer $4_1$ formed on the first region $R_1$ may function as a first conductive pattern portion, and the second layer $4_2$ formed on the second region $R_2$ may function as a second conductive pattern portion.

(First Region and Second Region)

On a surface of the first region $R_1$ of the base 2, for example, a planar surface Sp1 is formed. The first layer $4_1$ is continuously formed on the planar surface Sp1. On a surface of the second region $R_2$ of the base 2, for example, a wavy surface Sw2 is formed. The second layer $4_2$ is continuously formed on the wavy surface Sw2. On the other hand, on a surface of the third region $R_3$ of the base 2, for example, a wavy surface Sw3 is formed, and a layer such as the first layer $4_1$ or the second layer $4_2$ is not formed on the wavy surface Sw3. Accordingly, the third region $R_3$ functions as an insulating region for insulating between two portions of the first layer $4_1$, between two portions of the second layer $4_2$, or between a portion of the first layer $4_1$ and a portion of the second layer $4_2$. In contrast, the first layer $4_1$ that is continuously formed in the first region $R_1$ has electrical conductivity in a direction in which the first region $R_1$ extends and functions as a conductive pattern portion. Similarly, the second layer $4_2$ that is continuously formed in the second region $R_2$ also has electrical conductivity in a direction in which the second region $R_2$ extends and functions as a conductive pattern portion.

The planar surface Sp1, the wavy surface Sw2, and the wavy surface Sw3 preferably satisfy the following relationship:

$$(Am1/\lambda m1)=0, 0<(Am2/\lambda m2)<(Am3/\lambda m3) \leq 1.8$$

wherein Am1 is a mean amplitude of vibrations of the planar surface Sp1, Am2 is a mean amplitude of vibrations of the wavy surface Sw2, Am3 is a mean amplitude of vibrations of the wavy surface Sw3, $\lambda m1$ is a mean wavelength of the planar surface Sp1, $\lambda m2$ is a mean wavelength of the wavy surface Sw2, and $\lambda m3$ is a mean wavelength of the wavy surface Sw3.

Since the planar surface Sp1 is considered to be a wavy surface having a mean amplitude Am1 of vibrations of "zero", the mean amplitude Am1 of vibrations, the mean wavelength $\lambda m1$, and the ratio (Am1/$\lambda m1$) of the planar surface Sp1 can be defined as described above.

In the case where the ratio (Am3/$\lambda m3$) is greater than 1.8, detachment failure may occur in a step of transferring the wavy surface Sw3 and the wavy surface Sw3 tends to be damaged.

Herein, the mean wavelength $\lambda m2$ and the mean amplitude Am2 of vibrations of the wavy surface Sw2 are determined as follows. First, the conductive element 1 is cut along a cross section so as to include a position at which the amplitude of vibrations of the wavy surface Sw2 becomes the maximum. An image of the cross section is taken using a transmission electron microscope (TEM). Next, a wavelength $\lambda 2$ and an amplitude A2 of vibrations of the wavy surface Sw2 are determined from the TEM image. This measurement is repeatedly performed at ten positions that are randomly selected from the conductive element 1. The measured values are simply averaged (arithmetically averaged) to determine the mean wavelength $\lambda m2$ and the mean amplitude Am2 of vibrations of the wavy surface Sw2. Next, the ratio (Am2/$\lambda m2$) of the wavy surface Sw2 is determined using the mean wavelength $\lambda m2$ and the mean amplitude Am2 of vibrations.

The mean wavelength $\lambda m3$, the mean amplitude Am3 of vibrations, and the ratio (Am3/$\lambda m3$) of the wavy surface Sw3 are also determined as in the wavelength $\lambda m2$, the mean amplitude Am2 of vibrations, and the ratio (Am2/$\lambda m2$) of the wavy surface Sw2.

The wavy surface Sw2 and the wavy surface Sw3 are each a one-dimensional or two-dimensional wavy surface. Both the wavy surface Sw2 and the wavy surface Sw3 may be one-dimensional wavy surfaces or two-dimensional wavy surfaces. However, the wavy surfaces Sw2 and Sw3 are not limited thereto. Alternatively, one of the wavy surface Sw2 and the wavy surface Sw3 may be a one-dimensional wavy surface and the other may be a two-dimensional wavy surface.

The cross-sectional shape obtained by cutting the wavy surface Sw2 or the wavy surface Sw3 in one direction so as to include a position at which the amplitude of vibrations of the wavy surface Sw2 or the wavy surface Sw3 becomes the maximum is, for example, a triangular-wave shape, a sine-wave shape, a wave shape in which a quadratic curve or a part of a quadratic curve is repeated, or a shape similar to any of these shapes. Examples of the quadratic curve include a circle, an ellipse, and a parabola.

The wavelength $\lambda 2$ of the wavy surface Sw2 and the wavelength $\lambda 3$ of the wavy surface Sw3 are each preferably 100 μm or less, and more preferably in the range of 100 nm or more and 100 μm or less. If the wavelength $\lambda 2$ and the wavelength $\lambda 3$ are less than 100 nm, the formation of the wavy surface Sw2 and the wavy surface Sw3 tends to be difficult. On the other hand, if the wavelength $\lambda 2$ and the wavelength $\lambda 3$ exceed 100 μm, a problem in terms of step coverage may occur in steps of imprinting and a film formation, and thus defects tend to be generated.

From the standpoint of reducing the reflection of light from the surface of the conductive element, the wavelength $\lambda 2$ and the wavelength $\lambda 3$ are preferably equal to or less than a wavelength band of light for which reflection is to be reduced. The wavelength band of light for which reflection is to be reduced is, for example, an ultraviolet wavelength band, a visible wavelength band, or an infrared wavelength band. Herein, the term "ultraviolet wavelength band" refers to a wavelength band of 10 nm or more and 360 nm or less, the term "visible wavelength band" refers to a wavelength band of 360 nm or more and 830 nm or less, and the term "infrared wavelength band" refers to a wavelength band of 830 nm or more and 1 mm or less. Specifically, the wavelength $\lambda 2$ and the wavelength $\lambda 3$ are each preferably in the range of 100 nm or more and 350 nm or less, more preferably 100 nm or more and 320 nm or less, and still more preferably 110 nm or more and 280 nm or less. If the wavelength $\lambda 2$ and the wavelength $\lambda 3$ are less than 100 nm, the formation of the wavy surface Sw2 and the wavy surface Sw3 tends to be difficult. On the other hand, if the wavelength $\lambda 2$ and the wavelength $\lambda 3$ exceed 350 nm, diffraction of visible light tends to occur.

Both the wavy surface Sw2 and the wavy surface Sw3 may be wavy surfaces having a wavelength on the order of nanometers or micrometers. However, the wavy surfaces Sw2 and Sw3 are not limited thereto. One of the wavy surface Sw2 and the wavy surface Sw3 may be a wavy surface having a wavelength on the order of nanometers, and the other may be a wavy surface having a wavelength on the order of micrometers.

It is preferable that part of sublayers constituting the first layer $4_1$ or the second layer $4_2$ (hereinafter referred to as "third layer") be not completely present as a residual layer in the third region $R_3$. However, the third layer may be present as a residual layer to such an extent that the third layer does not form a conductive pattern portion and the third region $R_3$ functions as an insulating region.

In the case where the third layer is present as a residual layer, the first layer $4_1$, the second layer $4_2$, and the third layer preferably satisfy the following relationship:

$$S1 > S2 > S3$$

wherein S1 is a unit area of the first layer $4_1$, S2 is a unit area of the second layer $4_2$, and S3 is a unit area of the third layer.

Specifically, in the case where this relationship is satisfied, it is preferable that the first layer $4_1$ be continuously formed in the first region $R_1$ and the second layer $4_2$ be continuously formed in the second region $R_2$, whereas the third layer be discontinuously formed in the third region $R_3$, for example, in the form of islands.

In the case where the third layer is present as a residual layer, the first layer $4_1$, the second layer $4_2$, and the third layer preferably satisfy the following relationship:

$$d1 > d2 > d3$$

wherein d1 is a mean thickness of the first layer $4_1$, d2 is a mean thickness of the second layer $4_2$, and d3 is a mean thickness of the third layer.

Specifically, in the case where this relationship is satisfied, it is preferable that the mean thickness of the third layer be smaller than the mean thickness of the first layer $4_1$ and the mean thickness of the second layer $4_2$ to the extent that the third layer does not substantially exhibit electrical conductivity, and the third region $R_3$ functions as an insulating region.

Note that since the third layer does not function as a conductive pattern portion as described above, the illustration of the third layer is omitted in FIGS. 1B, 1C, and 2C. In addition, FIG. 1A illustrates an example in which each of the first region $R_1$, the second region $R_2$, and the third region $R_3$ has a linear shape. However, the shapes of the first region $R_1$, the second region $R_2$, and the third region $R_3$ are not limited thereto and may be changed to desired shapes in accordance with, for example, the design of a circuit or an element.

(Base)

The base 2 is, for example, a transparent or opaque base. Examples of the material of the base 2 include organic materials such as plastic materials and inorganic materials such as glass.

Examples of the glass that can be used include soda-lime glass, lead glass, hard glass, quartz glass, and liquid crystal glass (refer to "Kagaku Binran (Handbook of Chemistry)" Kiso-hen (Basic edition), P. I-537, edited by The Chemical Society of Japan). From the standpoint of various properties such as optical properties, e.g., transparency, refractive index, and dispersion, furthermore, impact resistance, heat resistance, and durability, preferable examples of the plastic material include (meta)acrylic resins such as polymethyl methacrylate and copolymers of methyl methacrylate and a vinyl monomer, e.g., another alkyl(meta)acrylate or styrene; polycarbonate resins such as polycarbonate and diethylene glycol bisallyl carbonate (CR-39); thermosetting (meta)acrylic resins such as a homopolymer or copolymer of (brominated) bisphenol A di(meth)acrylate, and a polymer or copolymer of a urethane-modified monomer of (brominated) bisphenol A mono(meth)acrylate; polyesters such as, in particular, polyethylene terephthalate, polyethylene naphthalate, and an unsaturated polyester; acrylonitrile-styrene copolymers; polyvinyl chloride; polyurethanes; epoxy resins; polyarylates; polyether sulfones; polyether ketones; cycloolefin polymers (trade names: ARTON and ZEONOR), and cycloolefin copolymers. Furthermore, aramid resins may also be used in consideration of heat resistance.

In the case where a plastic material is used as the base 2, in order to further improve, for example, the surface energy, coatability, slipping property, and flatness of the surface of the plastic material, an undercoat layer may be provided as a surface treatment. Examples of the material of this undercoat layer include organoalkoxy metal compounds, polyesters, acrylic-modified polyesters, and polyurethanes. Alternatively, in order to achieve the same effect as the formation of the undercoat layer, a corona discharge treatment, a UV-irradiation treatment, or the like may be performed on the surface of the base 2.

In the case where the base 2 is a plastic film, the base 2 can be prepared by, for example, stretching any of the above resins, or by dissolving any of the above resins in a solvent, applying the resulting solution to form a film, and drying the film. The thickness of the base 2 is, for example, about 25 to 500 µm.

Examples of the shape of the base 2 include, but are not limited to, a film shape, a plate shape, and a block shape. Herein, it is defined that the term "film shape" includes a sheet shape.

(Structures)

The wavy surface Sw2 is, for example, a recessed and projecting surface on which a large number of structures $3_2$ are arranged in the second region $R_2$. The wavy surface Sw3 is, for example, a recessed and projecting surface on which a large number of structures $3_3$ are arranged in the third region $R_3$. The structures $3_2$ and the structures $3_3$ each have, for example, a projecting shape with respect to the surface of the base 2. The structures $3_2$ and $3_3$ may be formed separately from the base 2 or integrally with the base 2. In the case where the structures $3_2$ and $3_3$ are formed separately from the base 2, a bottom base layer may be optionally provided between the base 2 and the structures $3_2$ and $3_3$. The bottom base layer is a layer that is integrally formed with the structures $3_2$ and $3_3$ on the bottom surface side of the structures $3_2$ and $3_3$, and is formed by curing, for example, the same energy ray-curable resin composition as the structures $3_2$ and $3_3$. The thickness of the bottom base layer is not particularly limited, and can be appropriately selected.

Aspect ratios of the structures $3_2$ and the structures $3_3$ preferably satisfy the following relationship:

$$0<(Hm2/Pm2)<(Hm3/Pm3)\leq1.8$$

wherein Hm2 is a mean height of the structures $3_2$, Hm3 is a mean height of the structures $3_3$, Pm2 is a mean array pitch of the structures $3_2$, and Pm3 is a mean array pitch of the structures $3_3$.

In the case where the ratio (Hm3/Pm3) is greater than 1.8, detachment failure may occur in a step of transferring the structures $3_3$, and the structures $3_3$ tend to be damaged.

Herein, the mean array pitch Pm2 and the mean height Hm2 of the structures $3_2$ are determined as follows. First, the conductive element 1 is cut along a cross section so as to include a position at which the heights of the structures $3_2$ become the maximum. An image of the cross section is taken using a transmission electron microscope (TEM). Next, an array pitch P2 and a height H2 of a structure $3_2$ are determined from the TEM image. This measurement is repeatedly performed at ten positions that are randomly selected from the conductive element 1. The measured values are simply averaged (arithmetically averaged) to determine the mean array pitch Pm2 and the mean height Hm2 of the structures $3_2$. Next, the aspect ratio (Hm2/Pm2) of the structures $3_2$ is determined using the mean array pitch Pm2 and the mean height Hm2.

The mean array pitch Pm3, the mean height Hm3, and the aspect ratio (Hm3/Pm3) of the structures $3_3$ are also determined as in the mean array pitch Pm2, the mean height Hm2, and the aspect ratio (Hm2/Pm2) of the structures $3_2$.

Arrangements of the structures $3_2$ and the structures $3_3$ each may be, for example, a one-dimensional arrangement or a two-dimensional arrangement. Both the structures $3_2$ and the structures $3_3$ may be one-dimensionally arranged or two-dimensionally arranged. However, the arrangements of the structures $3_2$ and the structures $3_3$ are not limited thereto. Either the structures $3_2$ or the structures $3_3$ may be one-dimensionally arranged, and the remaining structures $3_3$ or $3_2$ may be two-dimensionally arranged.

The arrangements of the structures $3_2$ and the structures $3_3$ each may be, for example, a regular arrangement or an irregular arrangement. An appropriate arrangement is preferably selected from the above arrangements in accordance with a method for preparing a master, etc. Both the structures $3_2$ and the structures $3_3$ may be regularly arranged or irregularly arranged. However, the arrangements of the structures $3_2$ and the structures $3_3$ are not limited thereto. Either the structures $3_2$ or the structures $3_3$ may be regularly arranged, and the remaining structures $3_3$ or $3_2$ may be irregularly arranged.

The array pitch P2 of the structures $3_2$ and the array pitch P3 of the structures $3_3$ are each preferably 100 µm or more, and more preferably in the range of 100 nm or more and 100 µm or less. If the array pitch P2 and the array pitch P3 are less than 100 nm, the formation of the structures $3_2$ and the structures $3_3$ tends to be difficult. On the other hand, if the array pitch P2 and the array pitch P3 exceed 100 µm, a problem in terms of step coverage may occur in steps of imprinting and a film formation, and thus defects tend to be generated.

From the standpoint of reducing the reflection of light from the surface of the conductive element, the array pitch P2 and the array pitch P3 are preferably equal to or less than a wavelength band of light for which reflection is to be reduced. The wavelength band of light for which reflection is to be reduced is, for example, an ultraviolet wavelength band, a visible wavelength band, or an infrared wavelength band. Herein, the term "ultraviolet wavelength band" refers to a wavelength band of 10 nm or more and 360 nm or less, the term "visible wavelength band" refers to a wavelength band of 360 nm or more and 830 nm or less, and the term "infrared wavelength band" refers to a wavelength band of 830 nm or more and 1 mm or less. Specifically, the array pitch P2 and the array pitch P3 are each preferably in the range of 100 nm or more and 350 nm or less, more preferably 100 nm or more and 320 nm or less, and still more preferably 110 nm or more and 280 nm or less. If the array pitch P2 and the array pitch P3 are less than 100 nm, the formation of the structures $3_2$ and the structures $3_3$ tends to be difficult. On the other hand, if the array pitch P2 and the array pitch P3 exceed 350 nm, diffraction of visible light tends to occur.

Both the structures $3_2$ and the structures $3_3$ may be arranged at an array pitch on the order of nanometers or micrometers. However, the arrangements of the structures $3_2$ and $3_3$ are not limited thereto. Either the structures $3_2$ or the structures $3_3$ may be arranged at an array pitch on the order of nanometers, and the remaining structures $3_3$ or the structures $3_2$ may be arranged at an array pitch on the order of micrometers.

A second region $R_2$ in which a plurality of structures $3_2$ are one-dimensionally or two-dimensionally arranged will be described with reference to FIGS. 3A to 4B. A third region $R_3$ in which a plurality of structures $3_3$ are one-dimensionally or two-dimensionally arranged is the same as the second region $R_2$ except that the aspect ratio of the structures $3_3$ is different from the aspect ratio of the structures $3_2$. Therefore, a specific description of the third region $R_3$ is omitted.

Figure 3A:
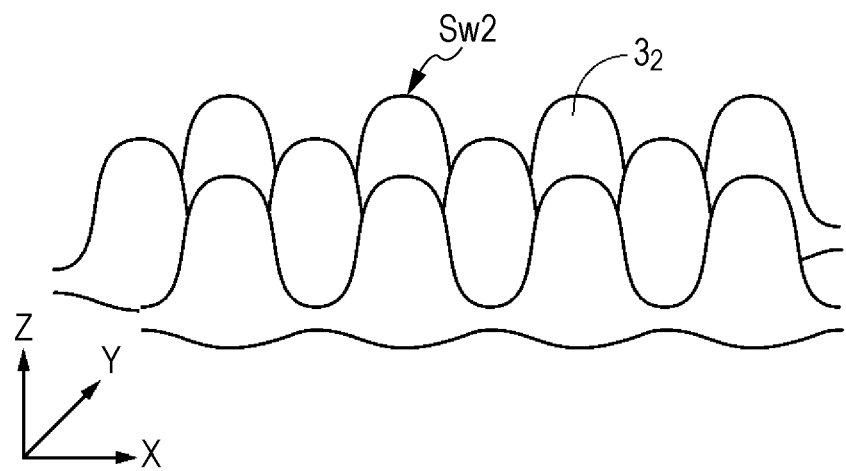
FIG. 3A is an enlarged perspective view illustrating a second region in which a plurality of structures are two-dimensionally arranged.
Figure 3B:
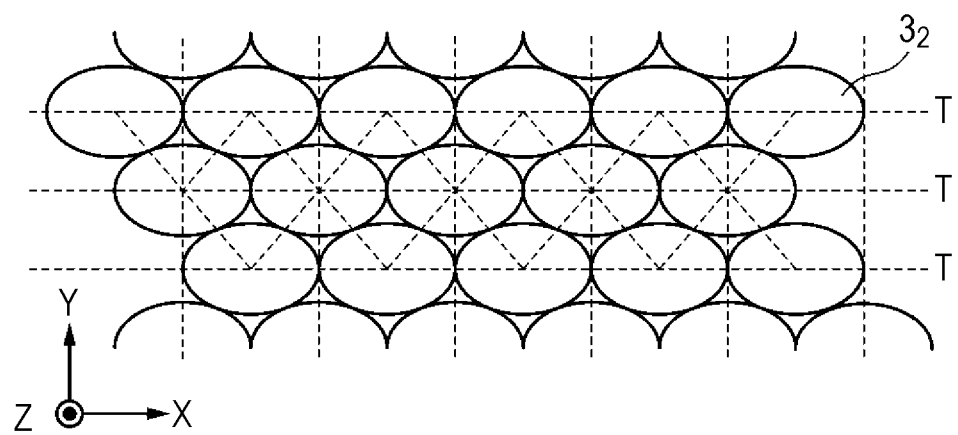
FIG. 3B is an enlarged plan view illustrating the second region in which a plurality of structures are two-dimensionally arranged.

FIG. 3A is an enlarged perspective view illustrating a second region in which a plurality of structures are two-dimensionally arranged. FIG. 3B is an enlarged plan view illustrating the second region in which a plurality of structures are two-dimensionally arranged. A plurality of structures $3_2$ are, for example, two-dimensionally arranged on a plurality of rows of tracks T in a second region $R_2$ to form a two-dimensional wavy surface Sw2. The shape of each of the tracks T may be a linear shape, an arc shape, or the like. The tracks T having any of these shapes may be arranged in a meandering (wobbling) manner. The plurality of structures $3_2$ arranged on the plurality of rows of tracks T may have, for example, a predetermined regular arrangement pattern. Examples of the regular arrangement pattern include lattice patterns such as a tetragonal lattice pattern and a hexagonal lattice pattern. These lattice patterns may be distorted. The structures $3_2$ may be arranged so that the heights of the structures $3_2$ regularly or irregularly vary over the surface of the base 2. Alternatively, the structures $3_2$ may be randomly arranged.

Each of the structures $3_2$ preferably has a slope inclined with respect to the surface of the base 2. Specific examples of the shapes of the structures $3_2$ include a conical shape, a columnar shape, a needle shape, a semispherical shape, a semi-elliptical shape, and a polygonal pyramid shape. However, the shapes of the structures $3_2$ are not limited thereto and may be other shapes. Examples of the conical shape include, but are not limited to, a conical shape having a sharpened top portion, a conical shape having a flat top portion, and a conical shape having a convex or concave curved surface at an apex portion thereof. The conical surface of the cone may be curved to have a concave or convex shape. In the case where a roll master is prepared using a roll master exposure apparatus (refer to FIG. 7) described below, the shape of each of the structures $3_2$ is preferably an elliptical cone shape having a convex curved shape on an apex portion thereof or a truncated elliptical cone shape having a flat top portion, and it is preferable to coincide a major-axis direction of ellipses forming bottom surfaces of the elliptical cones with a direction in which tracks T extend.

Figure 4A:
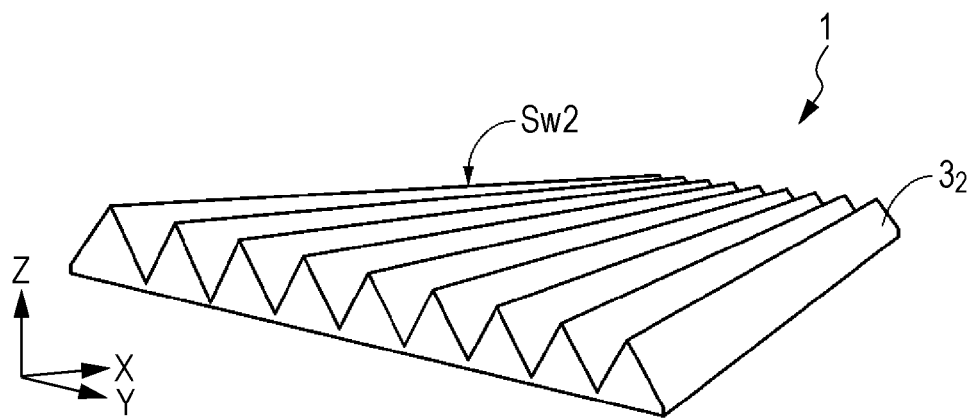
FIG. 4A is an enlarged perspective view illustrating a second region in which a plurality of structures are one-dimensionally arranged.
Figure 4B:
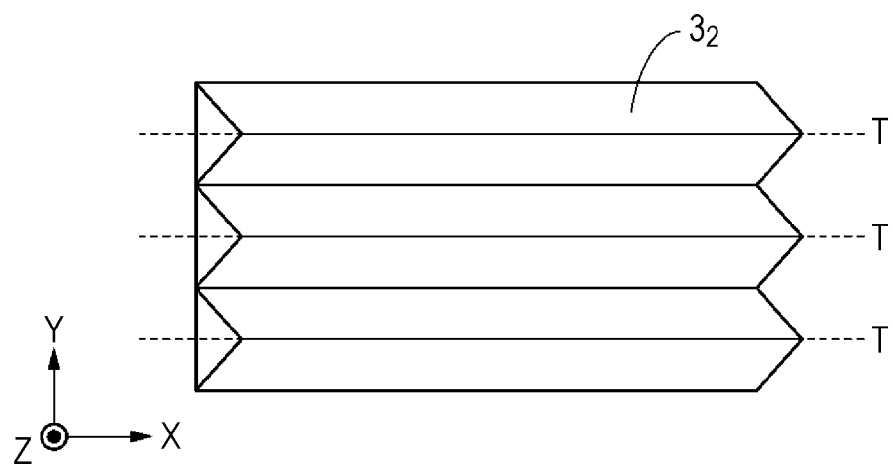
FIG. 4B is an enlarged plan view illustrating the second region in which a plurality of structures are one-dimensionally arranged.

FIG. 4A is an enlarged perspective view illustrating a second region in which a plurality of structures are one-dimensionally arranged. FIG. 4B is an enlarged plan view illustrating the second region in which a plurality of structures are one-dimensionally arranged. A plurality of structures $3_2$ are, for example, one-dimensionally arranged along a plurality of rows of tracks T in a second region $R_2$ to form a one-dimensional wavy surface Sw2. The shape of each of the tracks T may be a linear shape, an arc shape, or the like. The tracks T having any of these shapes may be arranged in a meandering (wobbling) manner.

The structures $3_2$ are each, for example, a columnar structure extending in one direction. Examples of the cross-sectional shape of the columnar structure include, but are not limited to, a triangular shape, a triangular shape having a curvature R at an apex thereof, a polygonal shape, a semi-spherical shape, a semi-elliptical shape, and a parabolic shape. Specific examples of the shape of each of the structures $3_2$ include, but are not limited to, a lenticular shape and a prism shape. The thicknesses of the structures $3_2$ may change in the direction in which the tracks extend. The structures $3_2$ may be intermittently arranged in the direction in which the tracks extend.

(First Layer and Second Layer)

As illustrated in FIG. 2A, a first layer $4_1$ includes, for example, a conductive sublayer $4a$ formed on a first region $R_1$, a first functional sublayer $4b$ formed on the conductive sublayer $4a$, and a second functional sublayer $4c$ formed on the first functional sublayer $4b$. An adhesive sublayer may be optionally provided between sublayers constituting the first layer $4_1$.

As illustrated in FIG. 2B, a second layer $4_2$ includes, for example, the conductive sublayer $4a$. In the case where the second layer $4_2$ includes two or more sublayers, an adhesive sublayer may be optionally provided between the sublayers constituting the second layer $4_2$.

The second layer $4_2$ is preferably formed to conform to the surface shape of the wavy surface Sw2 so as not to inhibit an antireflection effect provided by the wavy surface Sw2 in the second region $R_2$. The surface shape of the second layer $4_2$ is preferably substantially similar to the surface shape of the wavy surface Sw2. This is because a change in the refractive index profile due to the formation of the second layer $4_2$ is suppressed and a good antireflection property and/or a good transmission property can be maintained. In the case where a third layer is present as a residual layer in the third region $R_3$, the third layer is preferably formed to conform to the surface shape of the wavy surface Sw3 so as not to inhibit an antireflection effect provided by the wavy surface Sw3 in the third region $R_3$. The surface shape of the third layer is preferably substantially similar to the surface shape of the wavy surface Sw3.

Examples of the conductive sublayer $4a$ include, but are not limited to, a metal sublayer, a transparent conductive sublayer, a metal oxide sublayer, and a transition metal compound sublayer. The material of the first functional sublayer $4b$ is preferably a material that is different from at least materials of the conductive sublayer $4a$ and the second functional sublayer $4c$. The material of the first functional sublayer $4b$ is more preferably a material in which a difference in the dissolution rate from the conductive sublayer $4a$ and the second functional sublayer $4c$ is generated in a removal step. The material of the second functional sublayer $4c$ is preferably a material that is different from at least the materials of the conductive sublayer $4a$ and the first functional sublayer $4b$. The material of the second functional sublayer $4c$ is more preferably a material in which a difference in the dissolution rate from the conductive sublayer $4a$ and the first functional sublayer $4b$ is generated in the removal step.

An example of the transparent conductive sublayer is an inorganic transparent conductive sublayer. The inorganic transparent conductive sublayer preferably contains a transparent oxide semiconductor as a main component. Examples of the transparent oxide semiconductor that can be used include binary compounds such as $SnO_2$, $InO_2$, $ZnO$, and $CdO$; and ternary compounds and multi-element (complex) oxides that contain at least one element selected from Sn, In, Zn, and Cd, which are constituent elements of the binary compounds. Specific examples of the transparent oxide semiconductor include indium tin oxide (ITO), zinc oxide (ZnO), aluminum-doped zinc oxide (AZO($Al_2O_3$, ZnO)), SZO, fluorine-doped tin oxide (FTO), tin oxide ($SnO_2$), gallium-doped zinc oxide (GZO), and indium zinc oxide (IZO($In_2O_3$, ZnO)). In particular, from the standpoint of high reliability, a low resistivity, etc., indium tin oxide (ITO) is preferable. From the standpoint of improving electrical conductivity, the material of the inorganic transparent conductive sublayer is preferably in a mixed state of an amorphous phase and a polycrystalline phase. As the material of the metal sublayer, it is possible to use at least one selected from the group consisting of Ag, Al, Au, Pt, Pd, Ni, Cr, Nb, W, Mo, Ti, Cu, and Nd.

The first functional sublayer $4b$ preferably has solubility in a solution different from the solubility of at least the conductive sublayer $4a$ in the solution. The first functional sublayer $4b$ is preferably composed of a material different from the material of the conductive sublayer 4a. Specifically, a metal is preferably used as the first functional sublayer 4b. For example, at least one selected from the group consisting of Ag, Al, Au, Pt, Pd, Ni, Cr, Nb, W, Mo, Ti, Cu, and Nd can be used as the metal.

Examples of the material of the first functional sublayer 4b include dielectric materials and transparent conductive materials. Specifically, it is preferable to use at least one selected from the group consisting of oxides, nitrides, sulfides, carbides, fluorides, and transition metal compounds. For example, at least one selected from the group consisting of oxides and transition metal compounds can be used. Examples of the oxides include oxides of at least one element selected from the group consisting of In, Zn, Sn, Al, Si, Ge, Ti, Ga, Ta, Nb, Hf, Zr, Cr, Bi, and Mg. Examples of the nitrides include nitrides of at least one element selected from the group consisting of In, Sn, Ge, Cr, Si, Al, Nb, Mo, Ti, W, Ta, and Zn. An example of the sulfides is zinc sulfide. Examples of the carbides include carbides of at least one element selected from the group consisting of In, Sn, Ge, Cr, Si, Al, Ti, Zr, Ta, and W. Examples of the fluorides include fluorides of at least one element selected from the group consisting of Si, Al, Mg, Ca, and La. Examples of the transition metal compounds include at least one compound selected from the group consisting of Al, AlTi, AlCu, Cu, Ag, AgPdCu, Mo, Sn, Ti, W, Au, Pt, Pd, Ni, Nb, and Cr. Examples of mixtures containing two or more of the above materials include ZnS—$SiO_2$, $SiO_2$—$Cr_2O_3$—$ZrO_2$, $In_2O_3$—$CeO_2$, $In_2O_3$—$Ga_2O_3$, $Sn_2O_3$—$Ta_2O_5$, and $TiO_2$—$SiO_2$.

The first functional sublayer 4b preferably includes at least one of a sublayer in a mixed state of an amorphous phase and a polycrystalline phase and a sublayer in a polycrystalline state.

The second functional sublayer 4c is a sublayer for protecting the conductive sublayer 4a and the first functional sublayer 4b. The second functional sublayer 4c preferably has solubility in a solution different from the solubility of at least the conductive sublayer 4a or the first functional sublayer 4b in the solution. The second functional sublayer 4c is preferably composed of a material different from the materials of the conductive sublayer 4a and the first functional sublayer 4b or a material different from the material of the first functional sublayer 4b. Specifically, a metal is preferably used as the second functional sublayer 4c. For example, at least one selected from the group consisting of Ag, Al, Au, Pt, Pd, Ni, Cr, Nb, W, Mo, Ti, Cu, and Nd can be used as the metal.

Examples of the material of the second functional sublayer 4c include dielectric materials and transparent conductive materials. Specifically, it is preferable to use at least one selected from the group consisting of oxides, nitrides, sulfides, carbides, fluorides, and transition metal compounds. For example, at least one selected from the group consisting of oxides and transition metal compounds can be used. Examples of the oxides include oxides of at least one element selected from the group consisting of In, Zn, Sn, Al, Si, Ge, Ti, Ga, Ta, Nb, Hf, Zr, Cr, Bi, and Mg. Examples of the nitrides include nitrides of at least one element selected from the group consisting of In, Sn, Ge, Cr, Si, Al, Nb, Mo, Ti, W, Ta, and Zn. An example of the sulfides is zinc sulfide. Examples of the carbides include carbides of at least one element selected from the group consisting of In, Sn, Ge, Cr, Si, Al, Ti, Zr, Ta, and W. Examples of the fluorides include fluorides of at least one element selected from the group consisting of Si, Al, Mg, Ca, and La. Examples of the transition metal compounds include at least one compound selected from the group consisting of Al, AlTi, AlCu, Cu, Ag, AgPdCu, Mo, Sn, Ti, W, Au, Pt, Pd, Ni, Nb, and Cr. Examples of mixtures containing two or more of the above materials include ZnS—$SiO_2$, $SiO_2$—$Cr_2O_3$—$ZrO_2$, $In_2O_3$—$CeO_2$, $In_2O_3$—$Ga_2O_3$, $Sn_2O_3$—$Ta_2O_5$, and $TiO_2$—$SiO_2$.

The second functional sublayer 4c preferably includes at least one of a sublayer in a mixed state of an amorphous phase and a polycrystalline phase and a sublayer in a polycrystalline state, but is not limited thereto.

The adhesive sublayer is a sublayer for improving adhesion between sublayers. Examples of the adhesive sublayer include, but are not limited to, a metal sublayer, an oxide sublayer, a transition metal compound sublayer.

The surface resistance of the stacked film (first layer $4_1$) in the first region $R_1$ is preferably 5,000 Ω/sq. or less. When the surface resistance exceeds 5,000 Ω/sq., the resistance becomes excessively high, and the stacked film does not tend to be used as an electrode.

[Configuration of Roll Master]

Figure 5A:
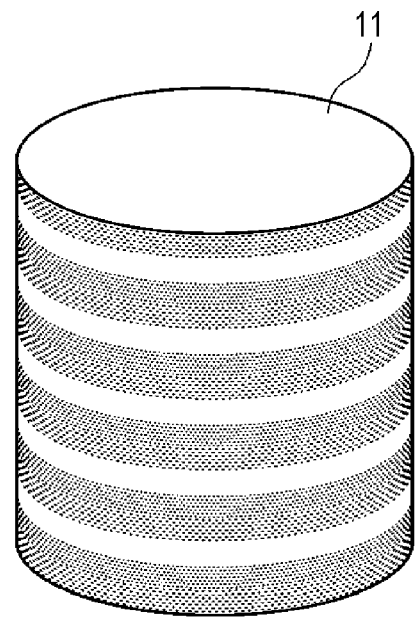
FIG. 5A is a perspective view illustrating a configuration example of a roll master for preparing a base.
Figure 5B:
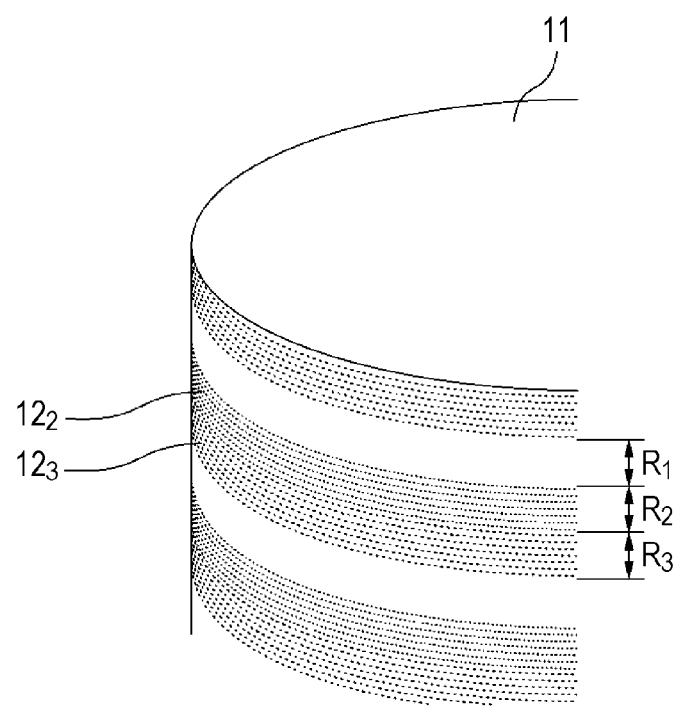
FIG. 5B is an enlarged perspective view illustrating a portion of the roll master illustrated in FIG. 5A.

FIG. 5A is a perspective view illustrating a configuration example of a roll master for preparing a base. FIG. 5B is an enlarged perspective view illustrating a portion of the roll master illustrated in FIG. 5A. A roll master 11 is a master for forming the planar surface Sp1, the wavy surface Sw2, and the wavy surface Sw3 on a surface of the base described above. The roll master 11 has, for example, a columnar shape or a cylindrical shape. A large number of first regions $R_1$, second regions $R_2$, and third regions $R_3$ are set on the surface of the circular column or the cylinder. The material of the roll master 11 is, for example, glass, but is not particularly limited thereto. The shapes and the order of arrangement of the first regions $R_1$, the second regions $R_2$, and the third regions $R_3$ illustrated in FIGS. 5A and 5B are an example and are not limited thereto. The shapes and the order of arrangement of the first regions $R_1$, the second regions $R_2$, and the third regions $R_3$ are appropriately selected in accordance with the shapes of desired conductive pattern portions.

Figure 6A:
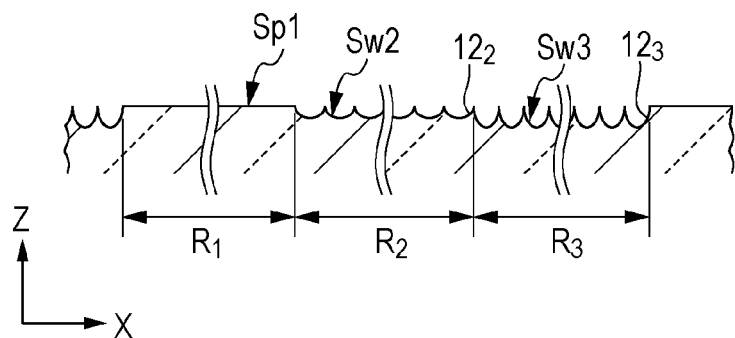
FIG. 6A is an enlarged cross-sectional view of a portion of a roll master.
Figure 6B:
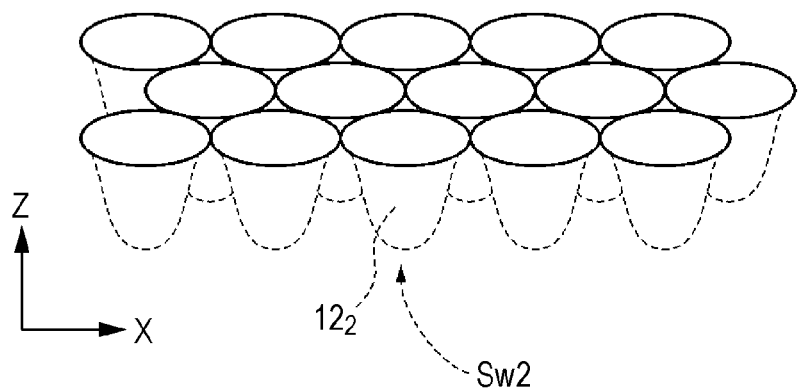
FIG. 6B is an enlarged perspective view illustrating a portion of a second region.
Figure 6C:
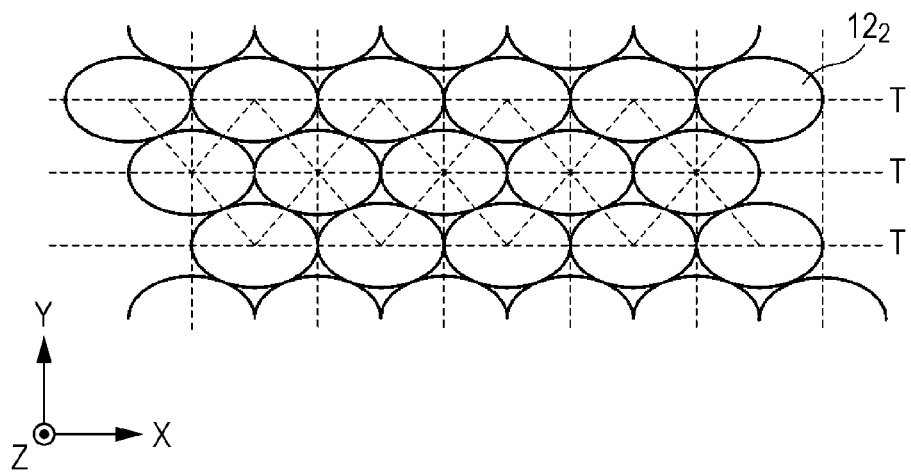
FIG. 6C is an enlarged plan view illustrating a portion of the second region.

FIG. 6A is an enlarged cross-sectional view of a portion of the roll master. FIG. 6B is an enlarged perspective view illustrating a portion of the second region $R_2$. FIG. 6C is an enlarged plan view illustrating a portion of the second region $R_2$. The third region $R_3$ is the same as the second region $R_2$ except that the ratio (Am/λm) (Am: mean amplitude of vibrations of wavy surface, λm: mean wavelength of wavy surface) of the wavy surface Sw3 in the third region $R_3$ is larger than the ratio of the wavy surface Sw2 in the second region $R_2$. Therefore, illustration of the third region $R_3$ is omitted.

The first region $R_1$, the second region $R_2$, and the third region $R_3$ of the roll master 11 correspond to the first region $R_1$, the second region $R_2$, and the third region $R_3$ of the base 2, respectively. That is, a planar surface Sp1 formed in the first region $R_1$ of the roll master 11 is used for forming the planar surface Sp1 in the first region $R_1$ of the base 2. A wavy surface Sw2 formed in the second region $R_2$ of the roll master 11 is used for forming the wavy surface Sw2 in the second region $R_2$ of the base 2. A wavy surface Sw3 formed in the third region $R_3$ of the roll master 11 is used for forming the wavy surface Sw3 in the third region $R_3$ of the base 2. Specifically, the wavy surface Sw2 and the wavy surface Sw3 of the roll master 11 have shapes that are the inverse of the recessed and projecting shapes of the wavy surface Sw2 and the wavy surface Sw3 of the base 2. That is, structures $12_2$ and structures $12_3$ of the roll master 11 respectively have shapes that are the inverse of the recessed and projecting shapes of the structures $3_2$ and the structures $3_3$ on the surface of the base 2.

[Configuration of Exposure Apparatus]

FIG. 7 is a schematic view illustrating a configuration example of a roll master exposure apparatus. The configuration of the roll master exposure apparatus will now be described with reference to FIG. 7. This roll master exposure apparatus can be constructed on the basis of, for example, an optical-disk recording apparatus.

A laser light source 21 is a light source for exposing a resist layer formed on a surface of a roll master 11 serving as a recording medium and oscillates a laser beam 14 having a wavelength λ of, for example, 266 nm for recording. The laser beam 14 emitted from the laser light source 21 goes straight while maintaining the form of a collimated beam and enters an electro-optical modulator (EOM) 22. The laser beam 14 passing through the electro-optical modulator 22 is reflected at a mirror 23, and is guided to a modulation optical system 25.

The mirror 23 is constituted by a polarization beam splitter and has a function of reflecting one polarized component and transmitting the other polarized component. The polarized component passing through the mirror 23 is received by a photodiode (PD) 24, and phase modulation of the laser beam 14 is conducted by controlling the electro-optical modulator 22 on the basis of the received light signal.

In the modulation optical system 25, the laser beam 14 is focused by a condenser lens 26 to an acousto-optic modulator (AOM) 27 composed of glass ($SiO_2$) or the like. The laser beam 14 is subjected to intensity modulation by the acousto-optic modulator 27 and diverged, and is then converted to a collimated beam by a lens 28. The laser beam 14 emitted from the modulation optical system 25 is reflected at a mirror 31 and guided to a movable optical table 32 horizontally and in parallel.

The movable optical table 32 includes a beam expander (BEX) 33 and an objective lens 34. The laser beam 14 guided to the movable optical table 32 is shaped into a desired beam shape with the beam expander 33 and is then applied to a resist layer on the roll master 11 through the objective lens 34. The roll master 11 is placed on a turntable 36 connected to a spindle motor 35. An exposure step of the resist layer is conducted by intermittently irradiating the resist layer with the laser beam 14 while the roll master 11 is rotated and the laser beam 14 is moved in a height direction of the roll master 11. The formed latent images have substantially elliptical shapes each having a major axis extending in the circumferential direction. The movement of the laser beam 14 is conducted by a movement of the movable optical table 32 in the direction indicated by an arrow R.

The exposure apparatus includes a control mechanism 37 for forming, on the resist layer, a latent image corresponding to a predetermined one-dimensional pattern or two-dimensional pattern. The control mechanism 37 includes a formatter 29 and a driver 30. The formatter 29 includes a polarity inversion unit. This polarity inversion unit controls the irradiation timing of the laser beam 14 applied to the resist layer. The driver 30 controls the acousto-optic modulator 27 on the basis of an output from the polarity inversion unit.

In this roll master exposure apparatus, signals are generated by synchronizing a polarity inversion formatter signal with a rotation controller of the recording apparatus in each track in such a manner that a two-dimensional pattern is spatially linked, and intensity modulation is conducted by the acousto-optic modulator 27. A desired two-dimensional pattern such as a tetragonal lattice or hexagonal lattice pattern can be recorded by patterning at a constant angular velocity (CAV) and an appropriate number of rotations, an appropriate modulation frequency, and an appropriate feed pitch.

[Method for Producing Conductive Element]

An example of a method for producing the conductive element 1 according to the first embodiment of the present application will now be described with reference to FIGS. 8A to 10C. In this method, some or all of a transfer step and subsequent steps are preferably performed in a roll-to-roll process in consideration of productivity.

(Step of Forming Resist Layer)

Figure 8A:
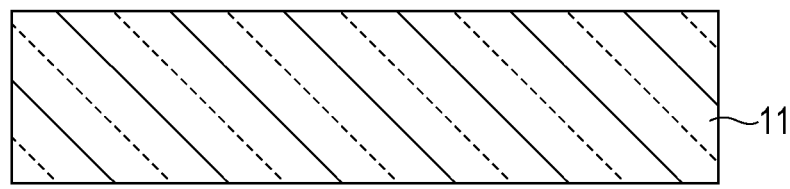
FIGS. 8A to 8C are process drawings illustrating an example of a method for producing a conductive element according to the first embodiment of the present application.
Figure 8B:
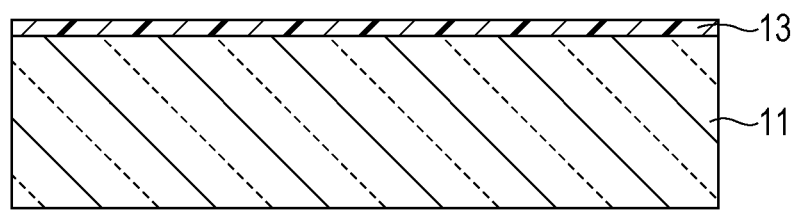

First, as illustrated in FIG. 8A, a columnar or cylindrical roll master 11 is prepared. The roll master 11 is, for example, a glass master. Next, as illustrated in FIG. 8B, a resist layer 13 is formed on a surface of the roll master 11. For example, either an organic resist or an inorganic resist may be used as the material of the resist layer 13. Examples of the organic resist that can be used include novolak resists and chemically amplified resists. Examples of the inorganic resist that can be used include metal compounds containing at least one metal.

(Exposure Step)

Figure 8C:
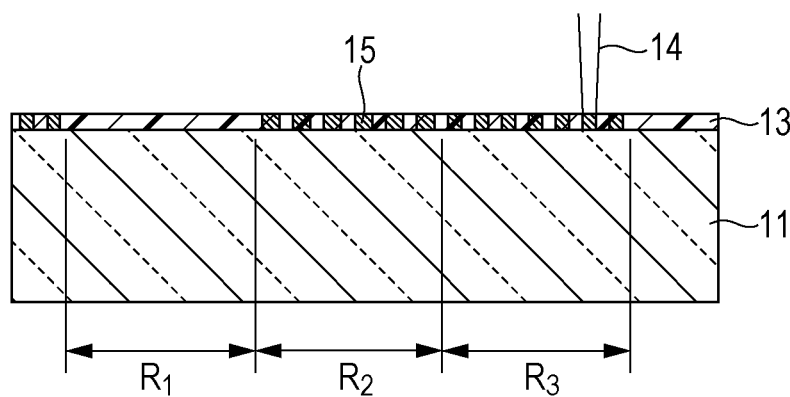

Next, as illustrated in FIG. 8C, the resist layer 13 is irradiated with a laser beam (exposure beam) 14 using the roll master exposure apparatus described above while the roll master 11 is rotated. In this step, the irradiation of the laser beam 14 is performed while the laser beam 14 is moved in a height direction of the roll master 11 (in a direction parallel to the central axis of the columnar or cylindrical roll master 11). In this case, latent images are formed in a second region $R_2$ and a third region $R_3$ to form exposed portions, whereas no latent image is formed in a first region $R_1$ to form a non-exposed portion. Latent images 15 corresponding to the trajectory of the laser beam 14 are formed at a pitch of a wavelength of visible light or less, for example.

The latent images 15 are arranged, for example, so as to form a plurality of rows of tracks on the surface of the roll master 11 and form a predetermined one-dimensional pattern or a two-dimensional pattern. Each of the latent images 15 has, for example, a long rectangular shape extending in a direction in which the tracks extend, or an elliptical shape, the major axis direction of which is a direction in which the tracks extend.

(Development Step)

Figure 9A:
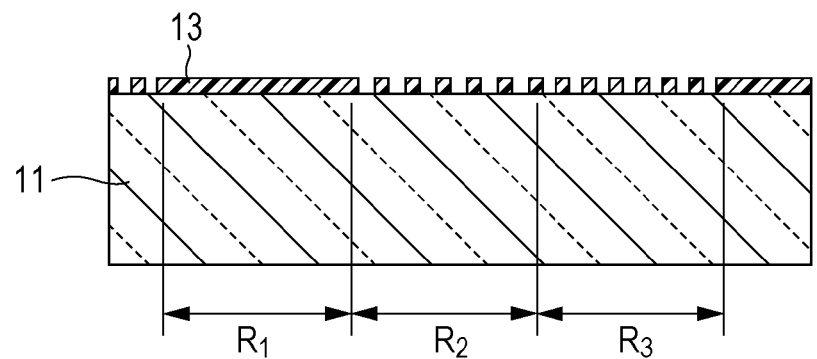
FIGS. 9A to 9C are process drawings illustrating the example of the method for producing a conductive element according to the first embodiment of the present application.

Next, as illustrated in FIG. 9A, the resist layer 13 is developed by dropping a developer on the resist layer 13 while the roll master 11 is rotated. As illustrated in the figure, in the case where the resist layer 13 is composed of a positive resist, in the exposed portions exposed with the laser beam 14, the dissolution rate of the resist in a developer becomes higher than that in the non-exposed portions. Accordingly, a pattern corresponding to the latent images (exposed portions) 15 is formed on the resist layer 13. Thus, a plurality of openings are formed in the resist layer 13 on the second region $R_2$ and the third region $R_3$. In contrast, no opening is formed in the resist layer 13 on the first region $R_1$, and the entire first region $R_1$ remains covered with the resist layer 13. Specifically, a mask having an opening pattern only in the second region $R_2$ and the third region $R_3$ is formed on the surface of the roll master 11. The opening pattern may be a one-dimensional pattern or a two-dimensional pattern. A one-dimensional pattern and a two-dimensional pattern may be used in combination.

(Etching Step)

Figure 9B:
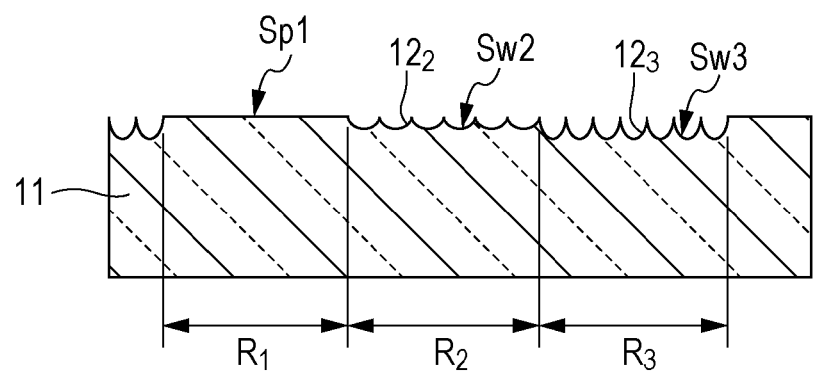

Next, the surface of the roll master 11 is subjected to a roll-etching process using, as a mask, the pattern (resist pattern) of the resist layer 13 formed on the roll master 11. As a result, as illustrated in FIG. 9B, in the second region $R_2$ and the third region $R_3$ on the surface of the roll master 11, etching proceeds through the openings, and recessed structures $12_2$ and structures $12_3$ are formed. These structures $12_2$ and structures $12_3$ each have, for example, a columnar shape extending in a direction in which the tracks extend, an elliptical cone shape or truncated elliptical cone shape, the major axis direction of which is a direction in which the tracks extend. In contrast, in the first region $R_1$ on the surface of the roll master 11, etching is not performed because the entire first region $R_1$ is covered with the resist layer 13. Accordingly, a flat surface of the roll master 11 is maintained. For example, dry etching can be employed as the etching method. Thus, the roll master 11 is prepared.

(Transfer Step)

Figure 9C:
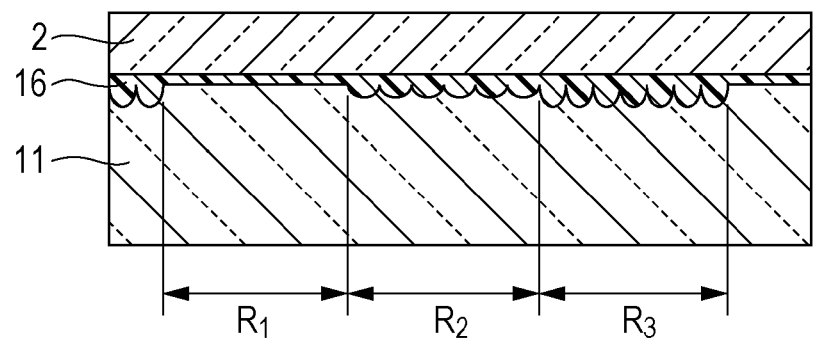
Figure 10A:
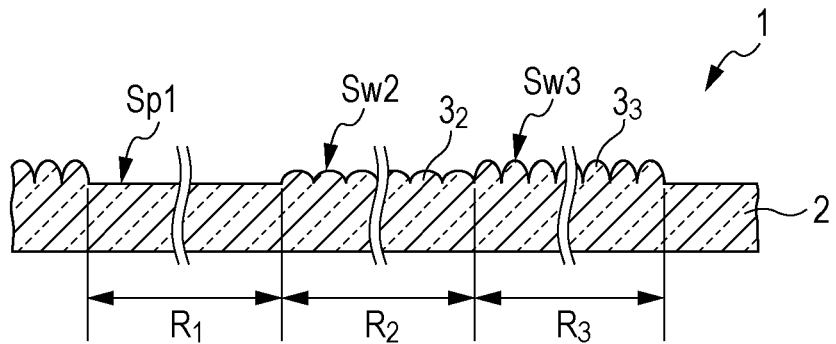
FIGS. 10A to 10C are process drawings illustrating the example of the method for producing a conductive element according to the first embodiment of the present application.

Next, for example, as illustrated in FIG. 9C, a base 2, such as a film to which a transfer material 16 is applied is brought into close contact with the roll master 11, and the transfer material 16 is cured by irradiating the base 2 with energy rays such as ultraviolet rays. The base 2 integrated with the cured transfer material 16 is then detached from the roll master 11, thus obtaining the base 2 including a first region $R_1$ having a planar surface Sp1 thereon, a second region $R_2$ having a wavy surface Sw2 thereon, and a third region $R_3$ having a wavy surface Sw3 thereon, as illustrated in FIG. 10A.

As the transfer material 16, for example, an energy ray-curable resin composition can be used. Energy ray-curable resin compositions are resin compositions that can be cured by irradiation of energy rays. The term "energy rays" refers to energy rays that can function as a trigger of a polymerization reaction such as radical polymerization, cationic polymerization, or anionic polymerization, and examples of the energy rays include electron beams, ultraviolet rays, infrared rays, laser beams, visible rays, ionizing radiations (such as X-ray, α-rays, β-rays, and γ-rays), microwaves, and radio-frequency waves. The energy ray-curable resin composition may be used in combination with other resins, if necessary. For example, the energy ray-curable resin composition may be used in combination with other curable resins such as thermosetting resins. The energy ray-curable resin composition may be an organic-inorganic hybrid material. Two or more energy ray-curable resin compositions may be used in combination. An ultraviolet-curable resin composition that is cured by ultraviolet rays is preferably used as the energy ray-curable resin composition. The ultraviolet-curable resin composition contains, for example, an ultraviolet-curable material, an initiator, a filler, a functional additive, etc.

Examples of the ultraviolet-curable material include monofunctional monomers, bifunctional monomers, and polyfunctional monomers. Specifically, the following materials may be used alone or as a mixture of two or more materials.

Examples of the monofunctional monomers include carboxylic acids (acrylic acid), hydroxy alkyl acrylates (2-hydroxyethyl acrylate, 2-hydroxypropyl acrylate, and 4-hydroxybutyl acrylate), alkyl acrylates and alicyclic acrylates (isobutyl acrylate, t-butyl acrylate, isooctyl acrylate, lauryl acrylate, stearyl acrylate, isobornyl acrylate, and cyclohexyl acrylate), and other functional monomers (2-methoxyethyl acrylate, methoxyethylene glycol acrylate, 2-ethoxyethyl acrylate, tetrahydrofurfuryl acrylate, benzyl acrylate, ethyl carbitol acrylate, phenoxyethyl acrylate, N,N-dimethylaminoethyl acrylate, N,N-dimethylaminopropylacrylamide, N,N-dimethylacrylamide, acryloylmorpholine, N-isopropylacrylamide, N,N-diethylacrylamide, N-vinylpyrrolidone, 2-(perfluorooctyl)ethyl acrylate, 3-perfluorohexyl-2-hydroxypropyl acrylate, 3-perfluorooctyl-2-hydroxypropyl acrylate, 2-(perfluorodecyl)ethyl acrylate, 2-(perfluoro-3-methylbutyl)ethyl acrylate, 2,4,6-tribromophenol acrylate, 2,4,6-tribromophenol methacrylate, 2-(2,4,6-tribromophenoxy)ethyl acrylate, and 2-ethylhexyl acrylate.

Examples of the bifunctional monomers include tri(propylene glycol)diacrylate, trimethylolpropane diallyl ether, and urethane acrylate.

Examples of the polyfunctional monomers include trimethylolpropane triacrylate, dipentaerythritol penta-/hexaacrylate, and ditrimethylolpropane tetraacrylate.

Examples of the initiator include 2,2-dimethoxy-1,2-diphenylethan-1-one, 1-hydroxy-cyclohexyl phenyl ketone, and 2-hydroxy-2-methyl-1-phenylpropan-1-one.

As the filler, for example, inorganic fine particles or organic fine particles can be used. Examples of the inorganic fine particles include fine particles of a metal oxide such as $SiO_2$, $TiO_2$, $ZrO_2$, $SnO_2$, or $Al_2O_3$.

Examples of the functional additive include a leveling agent, a surface control agent, and an anti-foaming agent.

Examples of the material of the base 2 include methyl methacrylate (co)polymers, polycarbonates, styrene (co) polymers, methyl methacrylate-styrene copolymers, cellulose diacetate, cellulose triacetate, cellulose acetate butyrate, polyesters, polyamides, polyimides, polyethersulfones, polysulfones, polypropylene, polymethylpentene, polyvinyl chloride, polyvinyl acetal, polyetherketones, polyurethanes, and glass.

The method of forming the base 2 is not particularly limited. For example, an injection molding method, an extrusion molding method, or a cast molding method can be employed. A surface treatment such as a corona treatment may be optionally conducted on the surface of the base 2.

(Step of Forming Stacked Film)

Figure 10B:
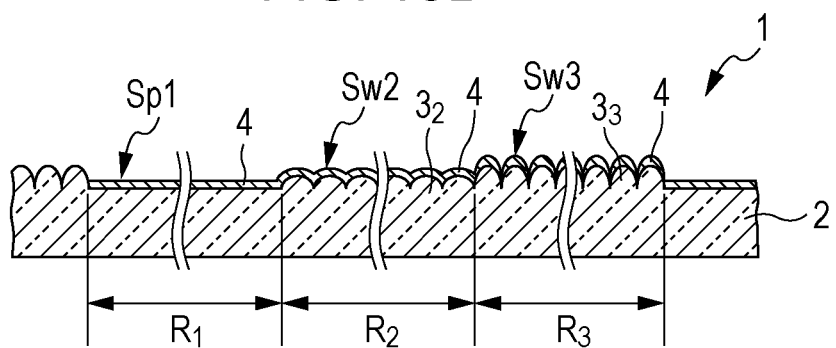

Next, as illustrated in FIG. 10B, two or more sublayers are stacked in the first region $R_1$, the second region $R_2$, and the third region $R_3$ on the surface of the base 2 to form a stacked film 4. Specifically, for example, a conductive sublayer, a first functional sublayer, and a second functional sublayer are stacked in that order in the first region $R_1$, the second region $R_2$, and the third region $R_3$ on the surface of the base 2 to form the stacked film 4. Examples of the method for forming the stacked film 4 include chemical vapor deposition methods (CVD: a technique in which a thin film is deposited from a vapor phase using a chemical reaction) such as thermal CVD, plasma CVD, and photo-CVD; and physical vapor deposition methods (PVD: a technique in which a material that is physically vaporized in a vacuum is condensed on a substrate to form a thin film) such as vacuum vapor deposition, plasma-enhanced vapor deposition, sputtering, and ion plating. The stacked film 4 may be formed while hating the base 2.

(Annealing Step)

Next, an annealing treatment is optionally performed on the stacked film 4. Consequently, the stacked film 4 or a sublayer such as an inorganic transparent conductive sublayer included in the stacked film 4 becomes a mixed state of an amorphous phase and a polycrystalline phase, for example.

(Step of Removing Stacked Film)

Figure 10C:
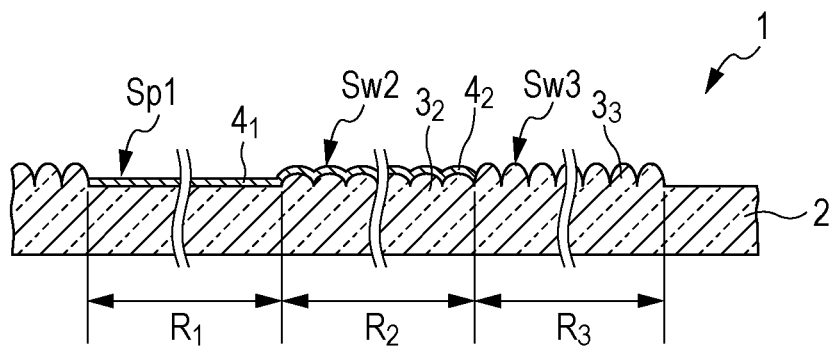

Next, as illustrated in FIG. 10C, an etching treatment is performed on the surface of the base 2 on which the stacked film 4 is formed. Consequently, the stacked film 4 is removed in the third region $R_3$. On the other hand, the stacked film 4 remains as a first layer $4_1$ in the first region $R_1$, and part of sublayers constituting the stacked film 4 remains as a second layer $4_2$ in the second region $R_2$. More specifically, for example, in the third region $R_3$, the conductive sublayer, the first functional sublayer, and the second functional sublayer are removed. On the other hand, in the first region $R_1$, the conductive sublayer, the first functional sublayer, and the second functional sublayer remain as the first layer $4_1$, and in the second region $R_2$, the conductive sublayer remains as the second layer $4_2$. Accordingly, the first layer $4_1$ formed in the first region $R_1$ and the second layer $4_2$ formed in the second region $R_2$ function as conductive pattern portions, whereas the third region $R_3$ functions as an insulating region between the conductive pattern portions. In this removal step, dry etching or wet etching can be used. Dry etching and wet etching may be used in combination. Examples of the dry etching include plasma etching or reactive ion etching (RIE). As an etchant of the wet etching, for example, at least one selected from sulfuric acid, hydrochloric acid, nitric acid, and ferric chloride can be used. Alternatively, oxalic acid, a mixed acid of phosphoric acid, acetic acid, and nitric acid, or an aqueous solution of ceric ammonium nitrate may be used as the etchant.

Herein, the term "remove" refers to (1) the stacked film 4 being completely eliminated from the third region $R_3$, (2) the stacked film 4 being made to be discontinuous (for example, in the form of islands) to such an extent that the stacked film 4 does not exhibit electrical conductivity in the third region $R_3$, and (3) the thickness of the stacked film 4 being reduced to such an extent that the stacked film 4 does not exhibit electrical conductivity in the third region $R_3$.

More specifically, it is preferable to substantially remove the stacked film 4 located on the wavy surface Sw3 and to leave the stacked film 4 located on the planar surface Sp1 and the stacked film 4 located on the wavy surface Sw2 so as to be continuously connected to each other by utilizing a difference in, for example, the state of the stacked film 4 formed on the planar surface Sp1, the wavy surface Sw2, and the wavy surface Sw3. Thus, conductive pattern portions can be selectively formed on the planar surface Sp1 and the wavy surface Sw2, among the planar surface Sp1, the wavy surface Sw2, and the wavy surface Sw3.

Alternatively, it is preferable to remove the stacked film 4 located on the wavy surface Sw3 so as to be discontinuous in the form of, for example, islands and to leave the stacked film 4 located on the planar surface Sp1 and the stacked film 4 located on the wavy surface Sw2 so as to be continuously connected to each other by utilizing a difference in, for example, the state of the stacked film 4 formed on the planar surface Sp1, the wavy surface Sw2, and the wavy surface Sw3. Thus, conductive pattern portions can be selectively formed on the planar surface Sp1 and the wavy surface Sw2, among the planar surface Sp1, the wavy surface Sw2, and the wavy surface Sw3.

Alternatively, it is preferable to remove the stacked film 4 located on the wavy surface Sw3 so that the thickness of the stacked film 4 located on the wavy surface Sw3 is significantly smaller than the thickness of the stacked film 4 located on the planar surface Sp1 and the thickness of the stacked film 4 located on the wavy surface Sw2 by utilizing a difference in, for example, the state of the stacked film 4 formed on the planar surface Sp1, the wavy surface Sw2, and the wavy surface Sw3. Thus, conductive pattern portions can be selectively formed on the planar surface Sp1 and the wavy surface Sw2, among the planar surface Sp1, the wavy surface Sw2, and the wavy surface Sw3.

(Washing Step)

Next, the surface of the base after the removal step is washed, if necessary.

Through the above steps, the desired conductive element 1 is obtained.

In the first embodiment, a stacked film 4 is formed by stacking two or more sublayers on a surface of a base having a planar surface Sp1, a wavy surface Sw2, and a wavy surface Sw3. Next, the stacked film 4 located on the wavy surface Sw3, among the planar surface Sp1, the wavy surface Sw2, and the wavy surface Sw3, is removed, the stacked film 4 located on the planar surface Sp1 is left as a first layer $4_1$, and part of the sublayers constituting the stacked film 4 located on the wavy surface Sw2 is left as a second layer $4_2$ by utilizing a difference in the state of the stacked film 4 formed on the planar surface Sp1, the wavy surface Sw2, and the wavy surface Sw3. Thus, conductive pattern portions are formed. Accordingly, a conductive element that has a high accuracy and that realizes a high throughput can be obtained.

Second Embodiment (An Embodiment in which Conductive Pattern Portions are Formed on a Surface of a Base by Utilizing a Difference Among Three Types of Wavy Surfaces)

Figure 11A:
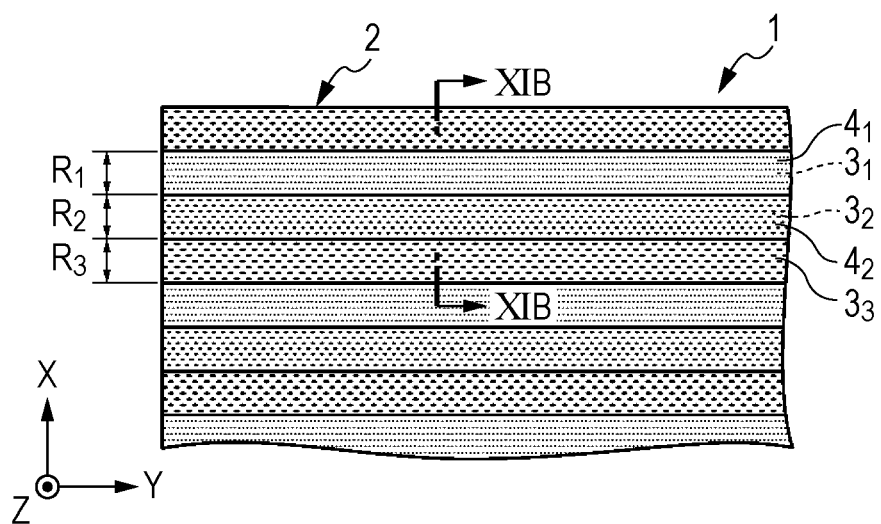
FIG. 11A is a plan view illustrating a configuration example of a conductive element according to a second embodiment of the present application.
Figure 11B:
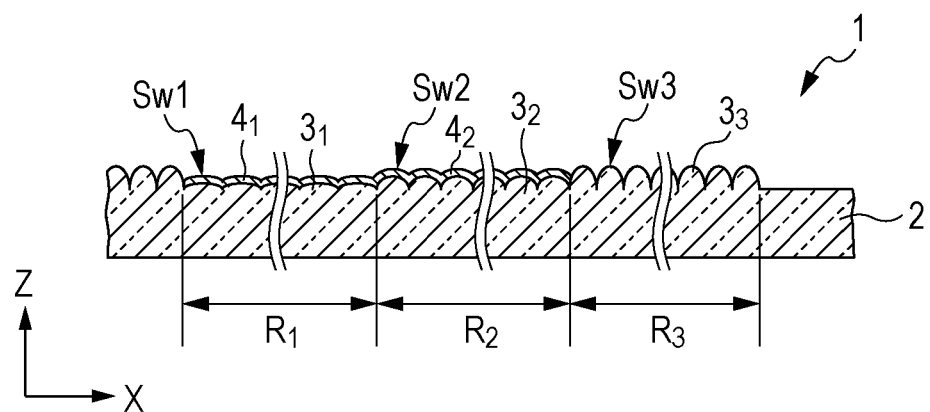
FIG. 11B is a cross-sectional view taken along line XIB-XIB in FIG. 11A.
Figure 12A:
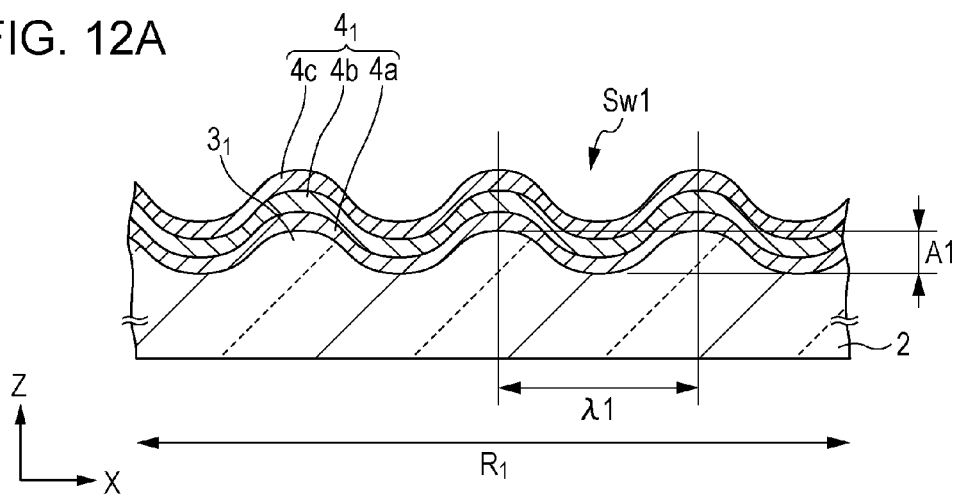
FIG. 12A is an enlarged cross-sectional view of a portion of a first region illustrated in FIG. 11B.
Figure 12B:
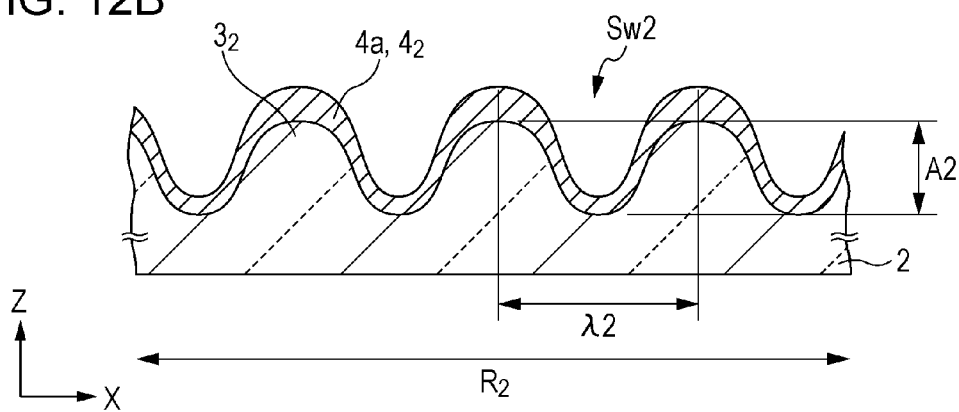
FIG. 12B is an enlarged cross-sectional view of a portion of a second region illustrated in FIG. 11B.
Figure 12C:
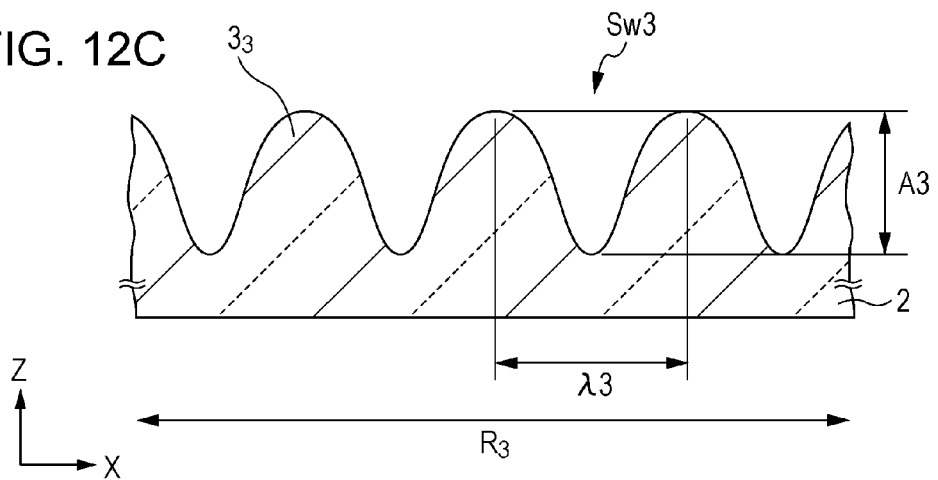
FIG. 12C is an enlarged cross-sectional view of a portion of a third region illustrated in FIG. 11B.

FIG. 11A is a plan view illustrating a configuration example of a conductive element according to a second embodiment of the present application. FIG. 11B is a cross-sectional view taken along line XIB-XIB in FIG. 11A. FIG. 12A is an enlarged cross-sectional view of a portion of a first region illustrated in FIG. 11B. FIG. 12B is an enlarged cross-sectional view of a portion of a second region illustrated in FIG. 11B. FIG. 12C is an enlarged cross-sectional view of a portion of a third region illustrated in FIG. 11B. A conductive element 1 of the second embodiment differs from the conductive element of the first embodiment in that a first region has a wavy surface Sw1.

(First Region)

On a surface of a first region $R_1$ of a base, a wavy surface Sw1 is formed. A first layer $4_1$ is continuously formed on the wavy surface Sw1. The wavy surface Sw1 is the same as the wavy surface Sw2 except that the wavy surface Sw1 has a ratio (Am/λm) (Am: mean amplitude of vibrations of wavy surface, λm: mean wavelength of wavy surface) smaller than that of the wavy surface Sw2. Specifically, the wavy surface Sw1, the wavy surface Sw2, and the wavy surface Sw3 preferably satisfy the following relationship:

$$0 \leq (Am1/\lambda m1) < (Am2/\lambda m2) < (Am3/\lambda m3) \leq 1.8$$

wherein Am1 is a mean amplitude of vibrations of the wavy surface Sw1, Am2 is a mean amplitude of vibrations of the wavy surface Sw2, Am3 is a mean amplitude of vibrations of the wavy surface Sw3, λm1 is a mean wavelength of the wavy surface Sw1, λm2 is a mean wavelength of the wavy surface Sw2, and λm3 is a mean wavelength of the wavy surface Sw3.

In the case where the ratio (Am3/λm3) is greater than 1.8, detachment failure may occur in a step of transferring the wavy surface Sw3 and the wavy surface Sw3 tends to be damaged.

The mean wavelength λm1, the mean amplitude Am1 of vibrations, and the ratio (Am1/λm1) of the wavy surface Sw1 are measured as in the wavy surfaces Sw2 and Sw3 in the first embodiment.

The shape, the wavelength, the amplitude of vibrations of the wavy surface Sw1, the wavy surface Sw2, and the wavy surface Sw3 can be independently selected. Specifically, for example, the wavy surface Sw1, the wavy surface Sw2, and the wavy surface Sw3 can be each independently a one-dimensional wavy surface or a two-dimensional wavy surface. The wavelengths and the amplitudes of vibrations of the wavy surface Sw1, the wavy surface Sw2, and the wavy surface Sw3 can be each independently a wavelength and an amplitude of vibrations on the order of nanometers or micrometers.

(Structures)

The wavy surface Sw1 is a recessed and projecting surface on which a large number of structures $3_1$ are arranged in the first region $R_1$. The structures $3_1$ are the same as the structures $3_2$ except that the structures $3_1$ have a ratio (Hm/Pm) (Hm: mean height of structures, Pm: mean array pitch of structures) smaller than the ratio of the structures $3_2$. Specifically, the structures $3_1$, the structures $3_2$, and the structures $3_3$ preferably satisfy the following relationship:

$$0<(Hm1/Pm1)<(Hm2/Pm2)<(Hm3/Pm3)\leq 1.8$$

wherein Hm1 is a mean height of the structures $3_1$, Hm2 is a mean height of the structures $3_2$, Hm3 is a mean height of the structures $3_3$, Pm1 is a mean array pitch of the structures $3_1$, Pm2 is a mean array pitch of the structures $3_2$, and Pm3 is a mean array pitch of the structures $3_3$.

In the case where the ratio (Hm3/Pm3) is greater than 1.8, detachment failure may occur in a step of transferring the structures $3_3$, and the structures $3_3$ tend to be damaged.

The mean array pitch Pm1, the mean height Hm1, and the ratio (Hm1/Pm1) of the structures $3_1$ are measured as in the structures $3_2$ and the structures $3_3$ in the first embodiment.

(First Layer)

The first layer $4_1$ is preferably formed to conform to the surface shape of the wavy surface Sw1 so as not to inhibit an antireflection effect provided by the structures $3_1$ in the first region $R_1$. The surface shape of the first layer $4_1$ is preferably substantially similar to the surface shape of the wavy surface Sw1. This is because a change in the refractive index profile due to the formation of the first layer $4_1$ is suppressed and a good antireflection property and/or a good transmission property can be maintained.

[Configuration of Roll Master]

Figure 13A:
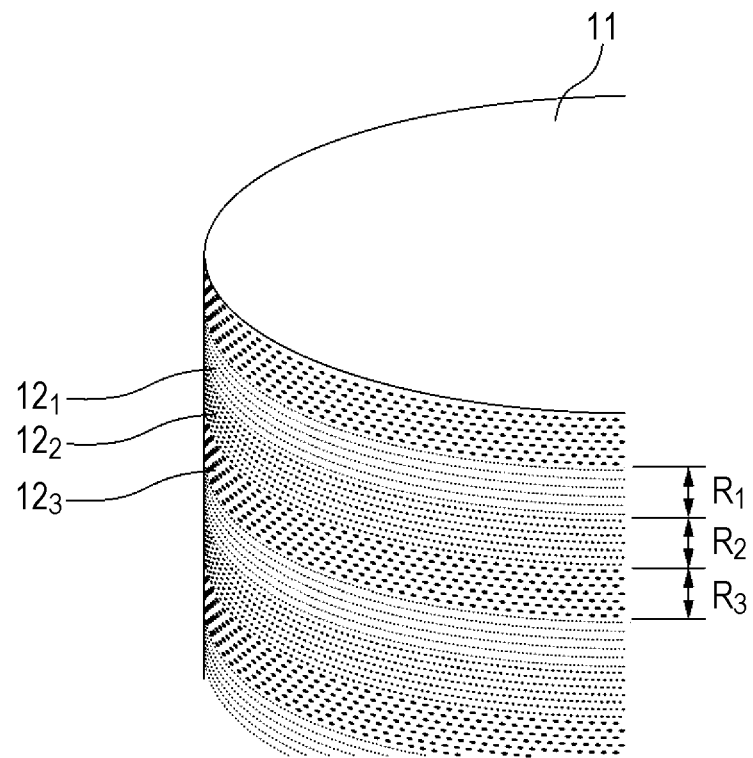
FIG. 13A is an enlarged perspective view illustrating a portion of a roll master for preparing a base.
Figure 13B:
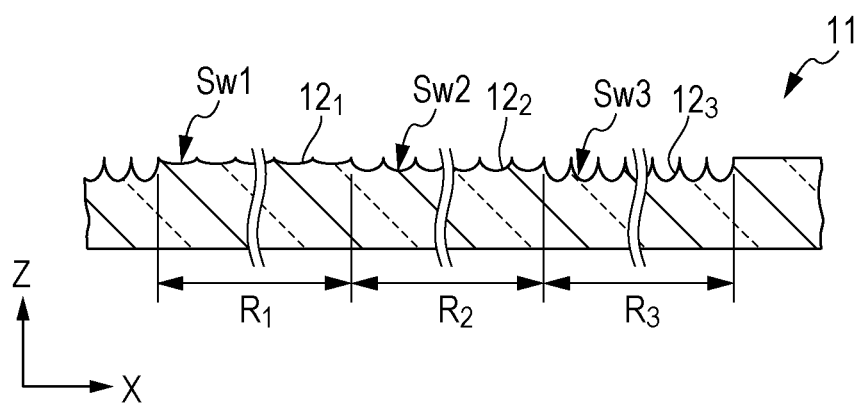
FIG. 13B is an enlarged cross-sectional view of a portion of the roll master illustrated in FIG. 13A.

FIG. 13A is an enlarged perspective view illustrating a portion of a roll master for preparing a base 2. FIG. 13B is an enlarged cross-sectional view of a portion of the roll master illustrated in FIG. 13A. A roll master 11 according to the second embodiment differs from the roll master of the first embodiment in that a first region $R_1$ has a wavy surface Sw1.

The wavy surface Sw1 of the roll master 11 is formed by, for example, arranging recessed structures $12_1$ at a pitch of a wavelength of visible light or less. The wavy surface Sw1 of the roll master 11 has a shape that is the inverse of the recesses and projections of the wavy surface Sw1 of the base 2.

[Method For Producing Conductive Element]

A method for producing the conductive element according to the second embodiment differs from the method of the first embodiment in that conductive pattern portions are formed by changing the rate of removing the stacked film 4 formed in the first region $R_1$, the second region $R_2$, and the third region $R_3$ by utilizing a difference (for example, a difference in the ratio (Am/λm)) among the wavy surface Sw1, the wavy surface Sw2, and the wavy surface Sw3.

In a step of removing a stacked film in the second embodiment, the stacked film 4 is removed in the third region $R_3$, whereas the stacked film 4 is left in the first region $R_1$ and the second region $R_2$ by performing a removing treatment on the surface of the base having the stacked film 4 thereon. Thus, conductive pattern portions can be selectively formed on the wavy surface Sw1 and the wavy surface Sw2, among the wavy surface Sw1, the wavy surface Sw2, and the wavy surface Sw3.

More specifically, it is preferable to substantially remove the stacked film 4 located on the wavy surface Sw3 and to leave the stacked film 4 located on the wavy surface Sw1 and the stacked film 4 located on the wavy surface Sw2 so as to be continuously connected to each other by utilizing a difference in, for example, the state of the stacked film 4 formed on the wavy surface Sw1, the wavy surface Sw2, and the wavy surface Sw3. Thus, conductive pattern portions can be selectively formed on the wavy surface Sw1 and the wavy surface Sw2, among the wavy surface Sw1, the wavy surface Sw2, and the wavy surface Sw3.

Alternatively, it is preferable to remove the stacked film 4 located on the wavy surface Sw3 so as to be discontinuous in the form of, for example, islands and to leave the stacked film 4 located on the wavy surface Sw1 and the stacked film 4 located on the wavy surface Sw2 so as to be continuously connected to each other by utilizing a difference in, for example, the state of the stacked film 4 formed on the wavy surface Sw1, the wavy surface Sw2, and the wavy surface Sw3. Thus, conductive pattern portions can be selectively formed on the wavy surface Sw1 and the wavy surface Sw2, among the wavy surface Sw1, the wavy surface Sw2, and the wavy surface Sw3.

Alternatively, it is preferable to remove the stacked film 4 located on the wavy surface Sw3 so that the thickness of the stacked film 4 located on the wavy surface Sw3 is significantly smaller than the thickness of the stacked film 4 located on the wavy surface Sw1 and the thickness of the stacked film 4 located on the wavy surface Sw2 by utilizing a difference in, for example, the state of the stacked film 4 formed on the wavy surface Sw1, the wavy surface Sw2, and the wavy surface Sw3. Thus, conductive pattern portions can be selectively formed on the wavy surface Sw1 and the wavy surface Sw2, among the wavy surface Sw1, the wavy surface Sw2, and the wavy surface Sw3.

In the second embodiment, since the wavy surface Sw1, the wavy surface Sw2, and the wavy surface Sw3 are respectively formed in the first region $R_1$, the second region $R_2$, and the third region $R_3$, the antireflection property of the conductive element 1 can be improved. In this configuration, the shapes of the first layer $4_1$ and the second layer $4_2$ that function as conductive pattern portions preferably conform to the shapes of the wavy surface Sw1 and the wavy surface Sw2, respectively. This is because a decrease in the effect of the antireflection property and/or the transmission property can be suppressed.

By forming a wavy surface Sw1, a wavy surface Sw2, and a wavy surface Sw3 that are subjected to a modulation (for example, an amplitude modulation and/or a frequency modulation) on a surface of a base 2, and forming a stacked film 4 on the surface of the base 2, the state of the stacked film 4 can be changed in accordance with a difference in the modulation among the wavy surface Sw1, the wavy surface Sw2, and the wavy surface Sw3 formed on the surface of the base 2. Accordingly, the solubility of the stacked film 4 in a removal solution can be changed in accordance with the difference in the modulation among the wavy surface Sw1, the wavy surface Sw2, and the wavy surface Sw3 of the base 2. That is, desired conductive pattern portions can be formed on the surface of the base 2 by utilizing the difference in the modulation among the wavy surface Sw1, the wavy surface Sw2, and the wavy surface Sw3 of the base 2.

In the case where the wavy surface Sw1, the wavy surface Sw2, and the wavy surface Sw3 on the surface of the base 2 are composed of nanostructures $3_1$, nanostructures $3_2$, and nanostructures $3_3$, respectively, visibility and optical properties can also be improved. In this case, a desired electrical resistance can be realized without degrading optical properties.

Third Embodiment (An Embodiment in which Conductive Pattern Portions are Formed on Both Main Surfaces of a Base)

Figure 14A:
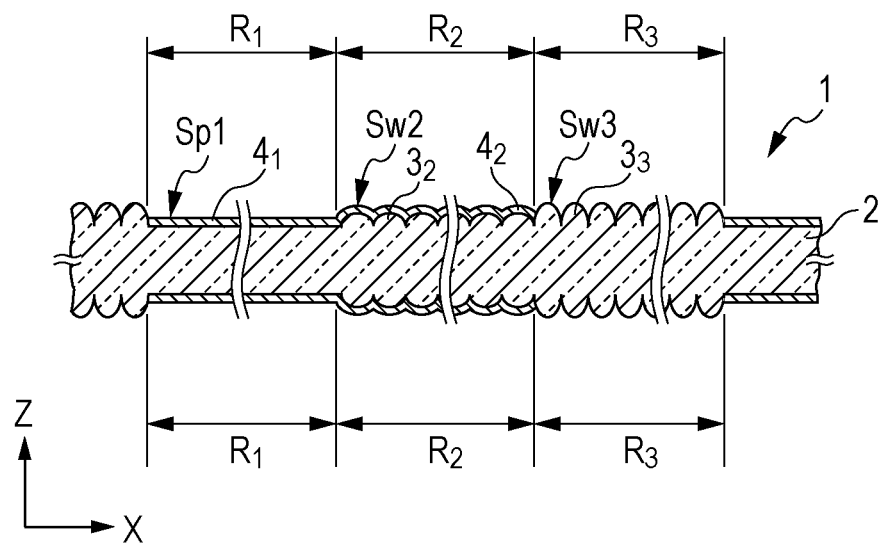
FIG. 14A is a cross-sectional view illustrating a configuration example of a conductive element according to a third embodiment of the present application.

FIG. 14A is a cross-sectional view illustrating a configuration example of a conductive element according to a third embodiment of the present application. A conductive element 1 of the third embodiment differs from the conductive element of the first embodiment in that a planar surface Sp1, a wavy surface Sw2, and a wavy surface Sw3 are formed on both main surfaces of a base 2, and conductive pattern portions are formed on the two main surfaces of the base 2. In FIG. 14A, the positions, the areas, the shapes, the order of arrangement, etc. of the planar surface Sp1, the wavy surface Sw2, and the wavy surface Sw3 are the same between the two main surfaces of the base 2. However, the positions, the areas, the shapes, the order of arrangement, etc. of the planar surface Sp1, the wavy surface Sw2, and the wavy surface Sw3 on the two main surfaces of the base 2 are not limited to this example, and can be set to desired positions, areas, and shapes, a desired order of arrangement, etc. in accordance with, for example, the design of a circuit or an element.

Figure 14B:
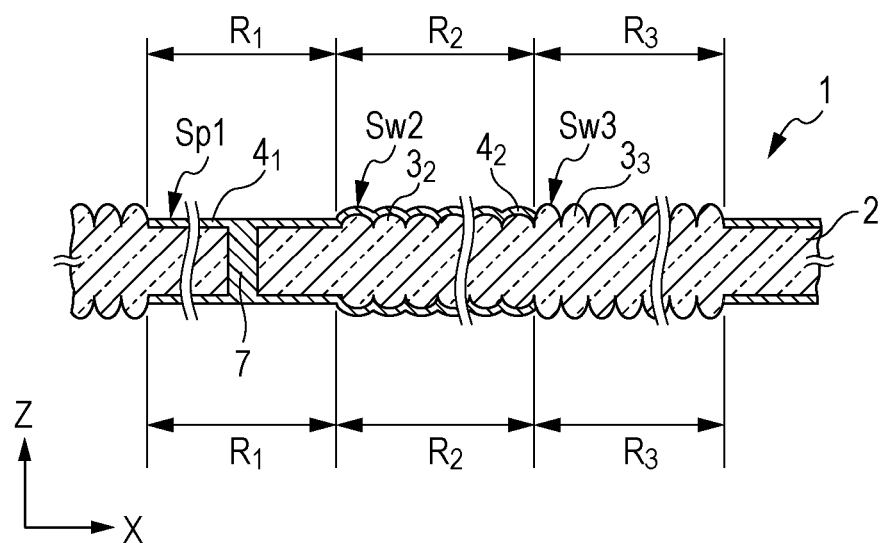
FIG. 14B is a cross-sectional view illustrating a modification of the conductive element according the third embodiment of the present application.

Alternatively, as illustrated in FIG. 14B, a through-hole (via-hole) may be formed in the planar surface Sp1 of the base 2, and the thorough-hole may be filled with a conductive material 7 such as a conductive ink so that conductive pattern portions, such as circuits, formed on both surfaces of the base 2 may be electrically connected to each other. The position of the through-hole is not limited to the planar surface Sp1. Alternatively, the through-hole may be formed in the wavy surface Sw2. In the case where the planar surface Sp1 and the wavy surface Sw2 are provided on the two main surfaces of the base 2 so as to face each other, a through-hole may be formed in each of the planar surface Sp1 and the wavy surface Sw2, and the conductive pattern portions formed on the main surfaces of the base 2 may be electrically connected to each other.

In the third embodiment, since conductive pattern portions are formed on both surfaces of the base 2, a large number of circuits and the like can be mounted on the conductive element 1, as compared with the first embodiment.

Fourth Embodiment
(An Embodiment in which Structures Each have a Recessed Shape)

Figure 15A:
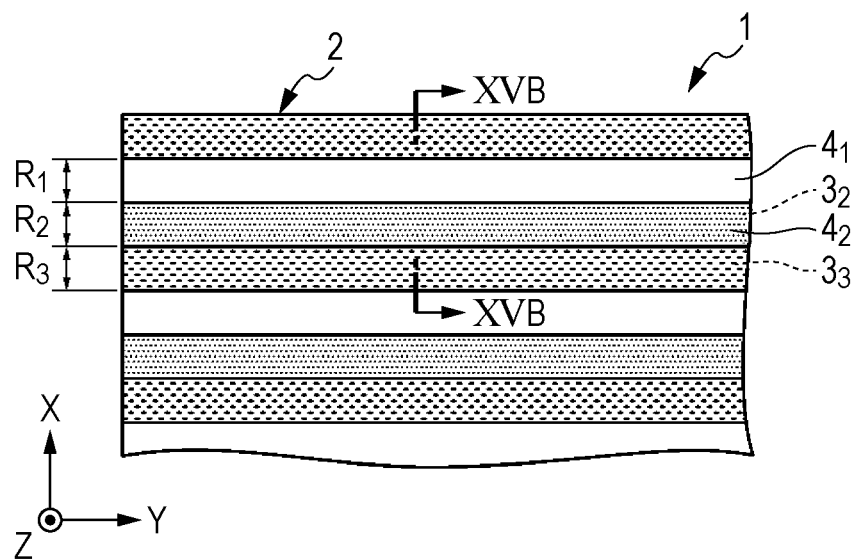
FIG. 15A is a plan view illustrating a configuration example of a conductive element according to a fourth embodiment of the present application.
Figure 15B:
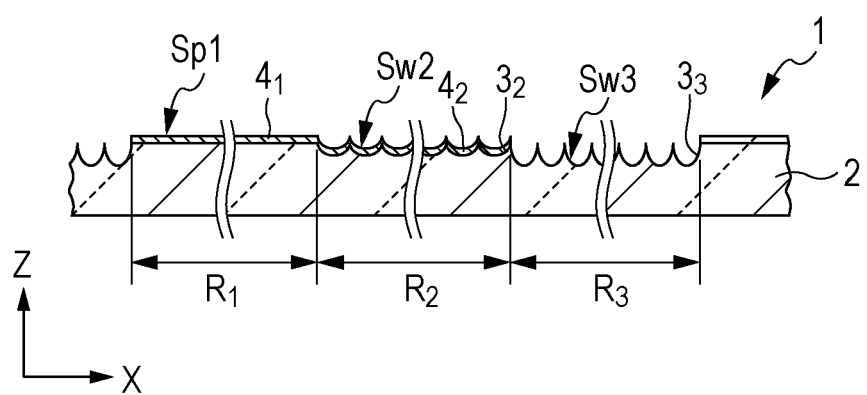
FIG. 15B is a cross-sectional view taken along line XVB-XVB in FIG. 15A.
Figure 16A:
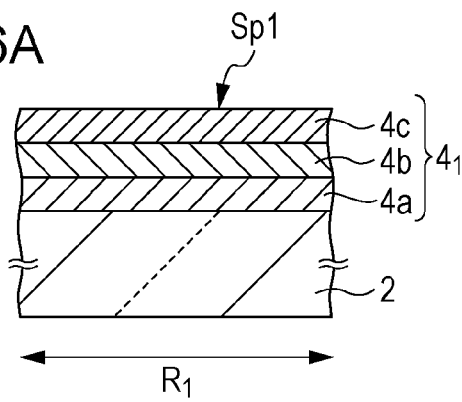
FIG. 16A is an enlarged cross-sectional view of a portion of a first region illustrated in FIG. 15B.
Figure 16B:
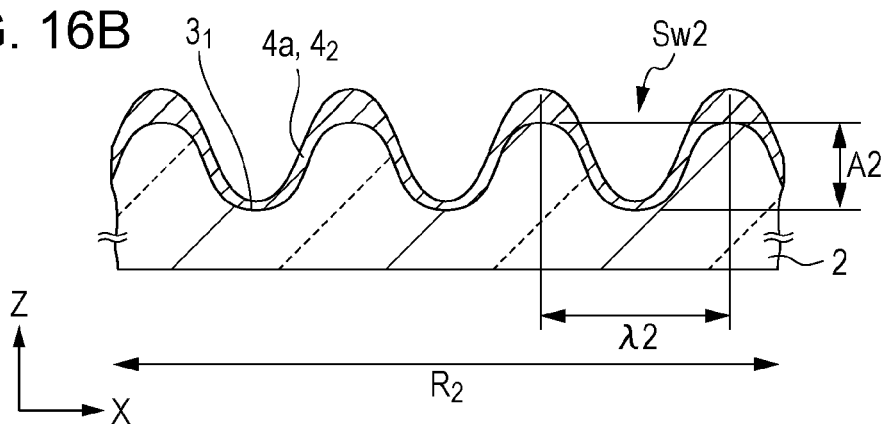
FIG. 16B is an enlarged cross-sectional view of a portion of a second region illustrated in FIG. 15B.
Figure 16C:
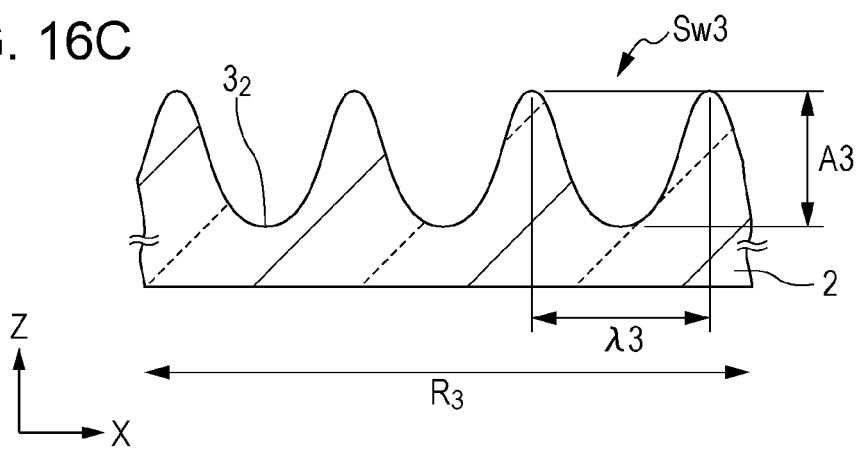
FIG. 16C is an enlarged cross-sectional view of a portion of a third region illustrated in FIG. 15B.

FIG. 15A is a plan view illustrating a configuration example of a conductive element according to a fourth embodiment of the present application. FIG. 15B is a cross-sectional view taken along line XVB-XVB in FIG. 15A. FIG. 16A is an enlarged cross-sectional view of a portion of a first region illustrated in FIG. 15B. FIG. 16B is an enlarged cross-sectional view of a portion of a second region illustrated in FIG. 15B. FIG. 16C is an enlarged cross-sectional view of a portion of a third region illustrated in FIG. 15B. A conductive element 1 according to the fourth embodiment differs from the conductive element of the first embodiment in that structures $3_2$ and structures $3_3$ each have a recessed shape with respect to the surface of a base 2. Alternatively, either the structures $3_2$ or the structures $3_3$ may each have a recessed structure and the remaining structures $3_3$ or $3_2$ may each have a projecting structure. Recessed structures $3_2$ and $3_3$ and projecting structures $3_2$ and $3_3$ may be mixed in a second region $R_2$ and a third region $R_3$.

In the fourth embodiment, other configurations are the same as those of the first embodiment.

In the fourth embodiment, since the structures 3 have a recessed shape obtained by inverting the shape of the projecting structures 3 in the first embodiment, the same advantages as those of the first embodiment can be achieved.

Fifth Embodiment
(An Embodiment in which a First Layer and a Second Layer have Other Configurations)
[Configuration of Conductive Element]

Figure 17A:
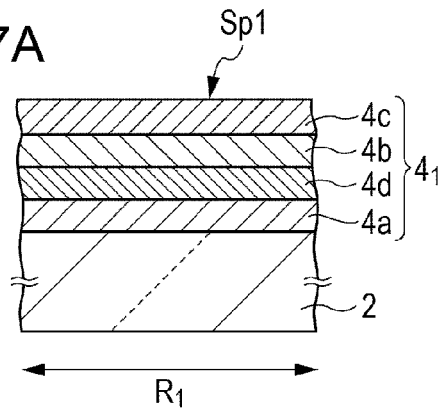
FIG. 17A is a cross-sectional view of a first region of a conductive element according to a fifth embodiment of the present application.
Figure 17B:
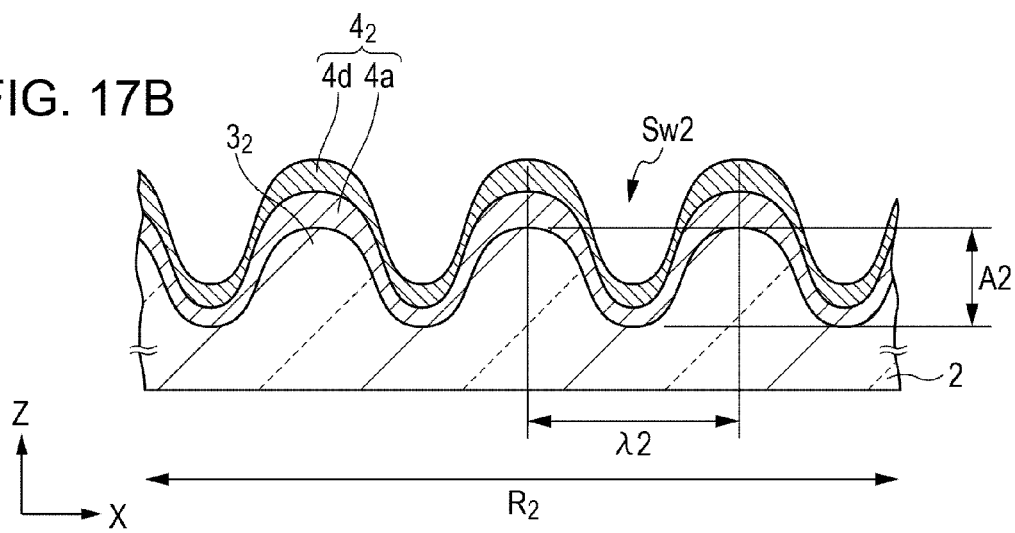
FIG. 17B is a cross-sectional view of a second region of the conductive element according to the fifth embodiment of the present application.
Figure 17C:
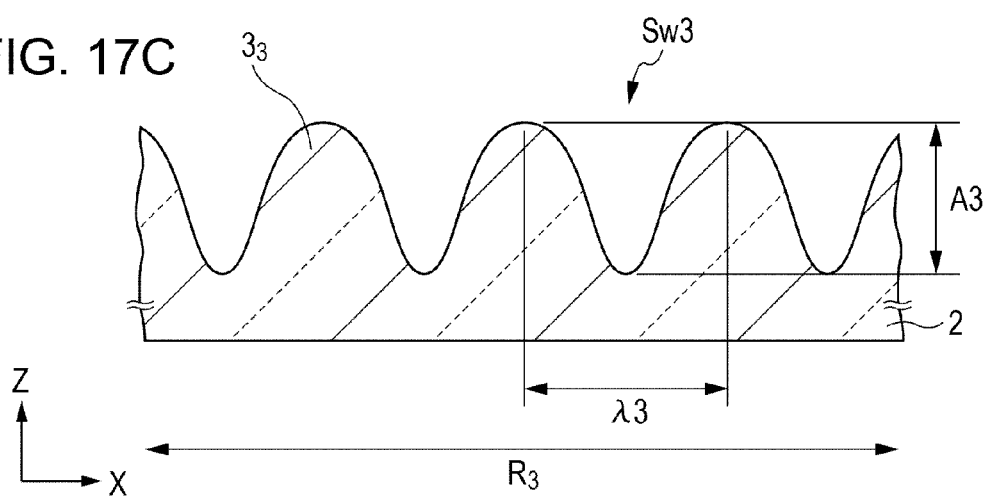
FIG. 17C is a cross-sectional view of a third region of the conductive element according to the fifth embodiment of the present application.

FIG. 17A is a cross-sectional view of a first region of a conductive element according to a fifth embodiment of the present application. FIG. 17B is a cross-sectional view of a second region of the conductive element according to the fifth embodiment of the present application. FIG. 17C is a cross-sectional view of a third region of the conductive element according to the fifth embodiment of the present application.

The conductive element according to the fifth embodiment is the same as the conductive element of the first embodiment except that a first layer $4_1$ and a second layer $4_2$ have the following configurations: The first layer $4_1$ further includes a second functional sublayer $4d$ between a conductive sublayer $4a$ and a first functional sublayer $4b$. The second layer $4_2$ further includes the second functional sublayer $4d$ on the conductive sublayer $4a$.

The second functional sublayer $4d$ preferably has solubility in a solution different from the solubility of at least the conductive sublayer $4a$ or the first functional sublayer $4b$ in the solution. The second functional sublayer $4d$ is preferably composed of a material different from the materials of the conductive sublayer $4a$ and the first functional sublayer $4b$, or a material different from the material of the first functional sublayer $4b$. Specifically, a metal is preferably used as the second functional sublayer $4d$. For example, at least one selected from the group consisting of Ag, Al, Au, Pt, Pd, Ni, Cr, Nb, W, Mo, Ti, Cu, and Nd can be used as the metal.

Examples of the material of the second functional sublayer $4d$ include dielectric materials and transparent conductive materials. Specifically, it is preferable to use at least one selected from the group consisting of oxides, nitrides, sulfides, carbides, fluorides, and transition metal compounds. For example, at least one selected from the group consisting of oxides and transition metal compounds can be used. Examples of the oxides include oxides of at least one element selected from the group consisting of In, Zn, Sn, Al, Si, Ge, Ti, Ga, Ta, Nb, Hf, Zr, Cr, Bi, and Mg. Examples of the nitrides include nitrides of at least one element selected from the group consisting of In, Sn, Ge, Cr, Si, Al, Nb, Mo, Ti, W, Ta, and Zn. An example of the sulfides is zinc sulfide. Examples of the carbides include carbides of at least one element selected from the group consisting of In, Sn, Ge, Cr, Si, Al, Ti, Zr, Ta, and W. Examples of the fluorides include fluorides of at least one element selected from the group consisting of Si, Al, Mg, Ca, and La. Examples of the transition metal compounds include at least one compound selected from the group consisting of Al, AlTi, AlCu, Cu, Ag, AgPdCu, Mo, Sn, Ti, W, Au, Pt, Pd, Ni, Nb, and Cr. Examples of mixtures containing two or more of the above materials include ZnS—SiO$_2$, SiO$_2$—Cr$_2$O$_3$—ZrO$_2$, In$_2$O$_3$—CeO$_2$, In$_2$O$_3$—Ga$_2$O$_3$, Sn$_2$O$_3$—Ta$_2$O$_5$, and TiO$_2$—SiO$_2$.

The second functional sublayer $4d$ preferably includes at least one of a sublayer in a mixed state of an amorphous phase and a polycrystalline phase and a sublayer in a polycrystalline state, but is not limited thereto.

[Method for Producing Conductive Element]
A method for producing a conductive element according to the fifth embodiment is the same as the method of the first embodiment except for the step of forming a stacked film and the step of removing the stacked film. Accordingly, only the step of forming a stacked film and the step of removing the stacked film will be described below.

(Step of Forming Stacked Film)
Two or more sublayers are stacked in a first region $R_1$, a second region $R_2$, and a third region $R_3$ on a surface of a base to form a stacked film 4. Specifically, for example, a conductive sublayer $4a$, a second functional sublayer $4d$, a first functional sublayer $4b$, and a second functional sublayer $4c$ are stacked in that order in the first region $R_1$, the second region $R_2$, and the third region $R_3$ on the surface of the base to form the stacked film 4.

(Step of Removing Stacked Film)
A removal treatment is performed on the surface of the base on which the stacked film 4 is formed. Consequently, the stacked film 4 is removed in the third region $R_3$. On the other hand, the stacked film 4 remains as a first layer $4_1$ in the first region $R_1$, and part of sublayers constituting the stacked film 4 remains as a second layer $4_2$ in the second region $R_2$. More specifically, for example, in the third region $R_3$, the conductive sublayer $4a$, the second functional sublayer $4d$, the first functional sublayer $4b$, and the second functional sublayer $4c$ are removed. On the other hand, in the first region $R_1$, the conductive sublayer $4a$, the second functional sublayer $4d$, the first functional sublayer $4b$, and the second functional sublayer $4c$ remain as the first layer $4_1$, and in the second region $R_2$, the conductive sublayer $4a$ and the second functional sublayer $4d$ remain as the second layer $4_2$. Accordingly, the first layer $4_1$ formed in the first region $R_1$ and the second layer $4_2$ formed in the second region $R_2$ function as conductive pattern portions, whereas the third region $R_3$ functions as an insulating region between the conductive pattern portions.

Sixth Embodiment (An Application to a Display Device)

Figure 18A:
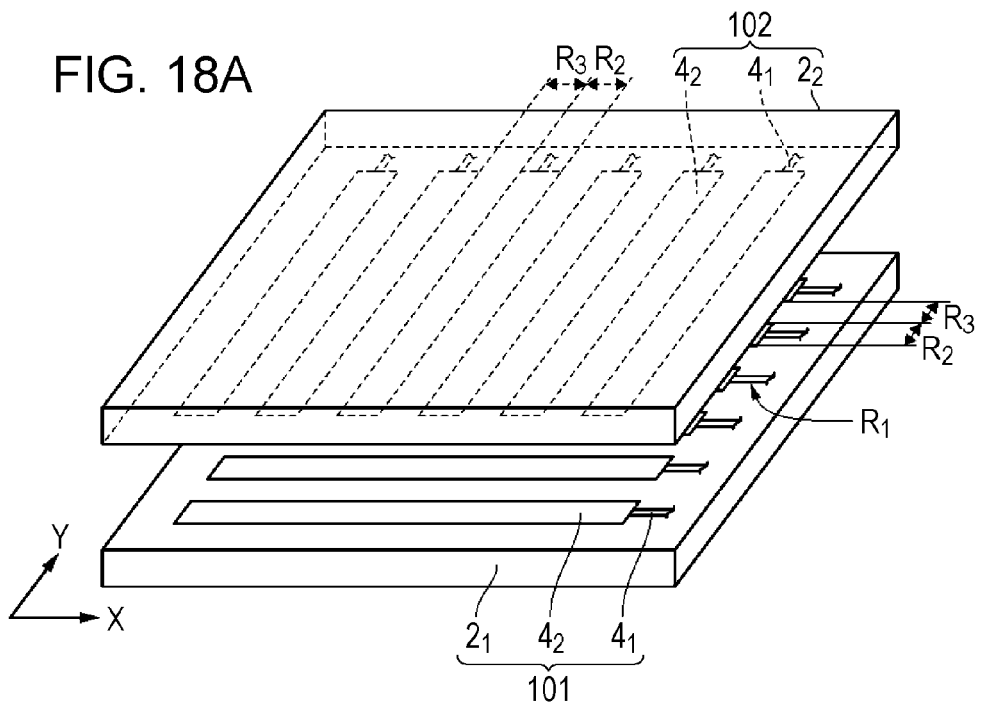
FIG. 18A is a perspective view illustrating a configuration example of a liquid crystal display device according to a sixth embodiment of the present application.

FIG. 18A is a perspective view illustrating a configuration example of a liquid crystal display device according to a sixth embodiment of the present application. As illustrated in FIG. 18A, the liquid crystal display device is a display device driven by a passive matrix driving method (also referred to as "simple matrix driving method"), and includes a first conductive element 101 and a second conductive element 102 arranged so as to face each other with a predetermined distance therebetween, and a liquid crystal layer (not illustrated) arranged between the first conductive element 101 and the second conductive element 102.

As illustrated in FIG. 18A, a linear second region $R_2$ and a linear third region $R_3$ are alternately repeatedly set on one of two main surfaces of a first base $2_1$, the one main surface facing a second base $2_2$. The surface structures of the second region $R_2$ and the third region $R_3$ are respectively similar to the surface structures of the second region $R_2$ and the third region $R_3$ of any of the first to fifth embodiments described above.

Figure 19A:
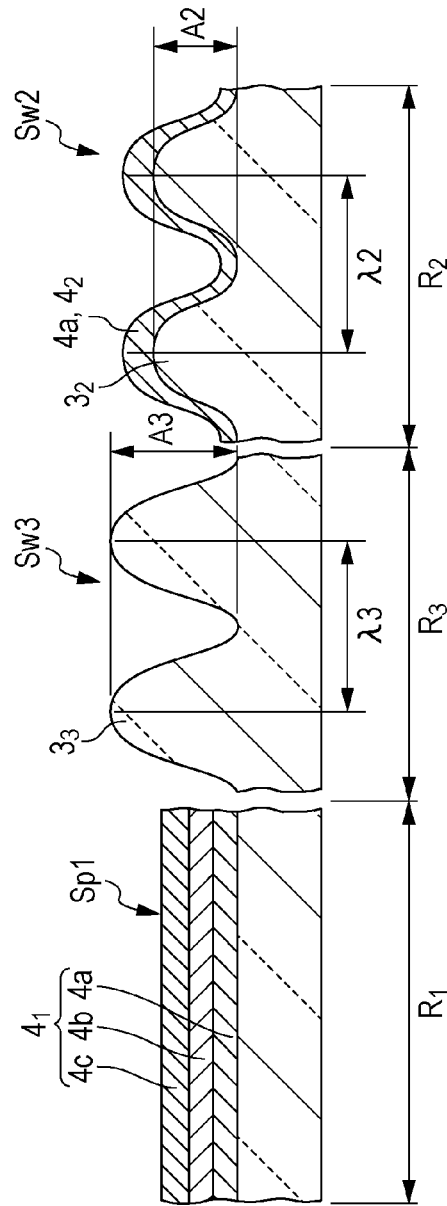
FIG. 19A is a cross-sectional view illustrating a first example of surface structures of a first conductive element and a second conductive element.

For example, as illustrated in FIG. 19A, a wavy surface Sw2 is formed in the second region $R_2$ on the surface of the first base, and a second layer $4_2$ is continuously formed on the wavy surface Sw2. On the other hand, a wavy surface Sw3 is formed in the third region $R_3$ on the surface of the first base, and a layer such as a first layer $4_1$ or the second layer $4_2$ is not formed on the wavy surface Sw3. Accordingly, a plurality of horizontal (X) electrodes (first electrodes) composed of the continuously formed second layer $4_2$ are formed in a stripe shape on one of the two main surfaces of the first base $2_1$, the one main surface facing the second base $2_2$.

As illustrated in FIG. 18A, a linear second region $R_2$ and a linear third region $R_3$ are alternately repeatedly set on one of two main surfaces of the second base $2_2$, the one main surface facing the first base $2_1$. The surface structures of the second region $R_2$ and the third region $R_3$ are respectively similar to the surface structures of the second region $R_2$ and the third region $R_3$ of any of the first to fifth embodiments described above.

For example, as illustrated in FIG. 19A, a wavy surface Sw2 is formed in the second region $R_2$ on the surface of the second base, and a second layer $4_2$ is continuously formed on the wavy surface Sw2. On the other hand, a wavy surface Sw3 is formed in the third region $R_3$ on the surface of the second base, and a layer such as a first layer $4_1$ or the second layer $4_2$ is not formed on the wavy surface Sw3. Accordingly, a plurality of vertical (Y) electrodes (second electrodes) composed of the continuously formed second layer $4_2$ are formed in a stripe shape on one of the two main surfaces of the second base $2_2$, the one main surface facing the first base $2_1$.

The second regions $R_2$ of the first base $2_1$ and the second regions $R_2$ of the second base $2_2$ are in an orthogonal relation to each other. That is, the second layer (horizontal electrode) $4_2$ of the first base $2_1$ and the second layer (vertical electrode) $4_2$ of the second base $2_2$ are in an orthogonal relation to each other.

Figure 18B:
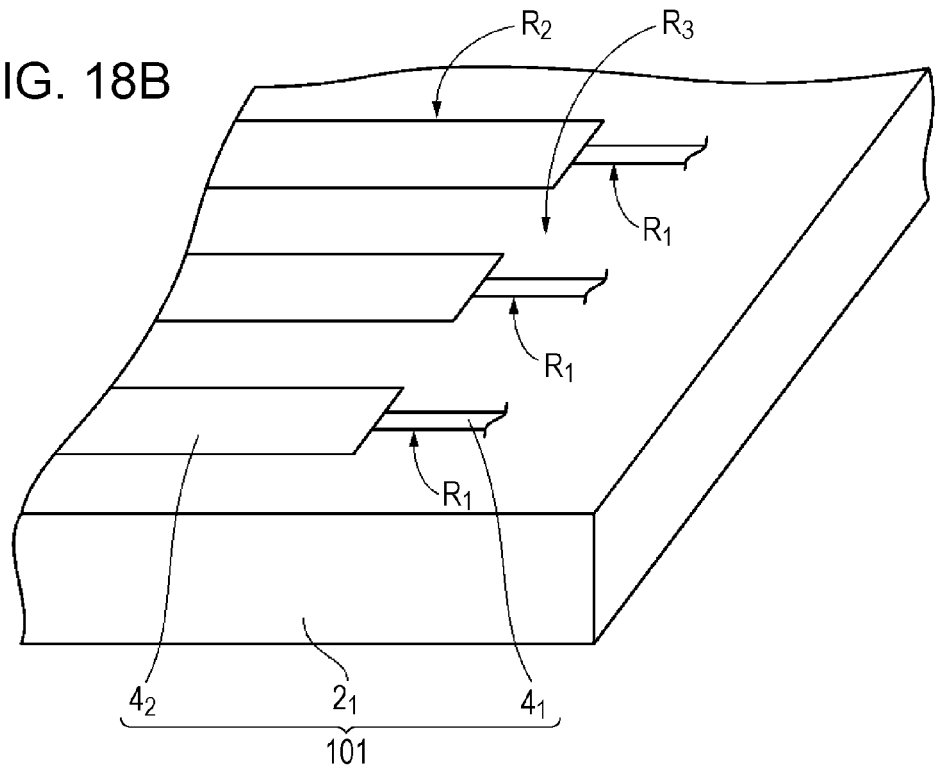
FIG. 18B is an enlarged perspective view of a surface of a first conductive element.

FIG. 18B is an enlarged perspective view of a surface of the first conductive element. As illustrated in FIG. 18B, a first region $R_1$ is set at an end of the second region $R_2$ of the first base $2_1$. The first region $R_1$ has, for example, a long, narrow shape such as a linear shape. An end of the first region $R_1$ is connected to an end of the second region $R_2$, and another end of the first region $R_1$ is connected to, for example, a terminal formation region provided on a peripheral portion of the first base $2_1$. The third region $R_3$ is set in the peripheral portion other than the two ends of the first region $R_1$. The surface structure of the first region $R_1$ is similar to the surface structure of the first region $R_1$ of any of the first to fifth embodiments described above.

For example, as illustrated in FIG. 19A, a planar surface Sp1 is formed in the first region $R_1$ on the surface of the first base, and a first layer $4_1$ is continuously formed on the planar surface Sp1. On the other hand, for example, the wavy surface Sw3 is formed in the third region $R_3$ on the surface of the first base, and a layer such as the first layer $4_1$ or the second layer $4_2$ is not formed on the wavy surface Sw3. Accordingly, the first layer $4_1$ which is a wiring is led from an end of the second layer $4_2$ which is a horizontal electrode, and extends to the terminal formation region. The first layer $4_1$ which is a wiring is electrically connected to a driving circuit through a terminal formed in this terminal formation region.

Figure 19B:
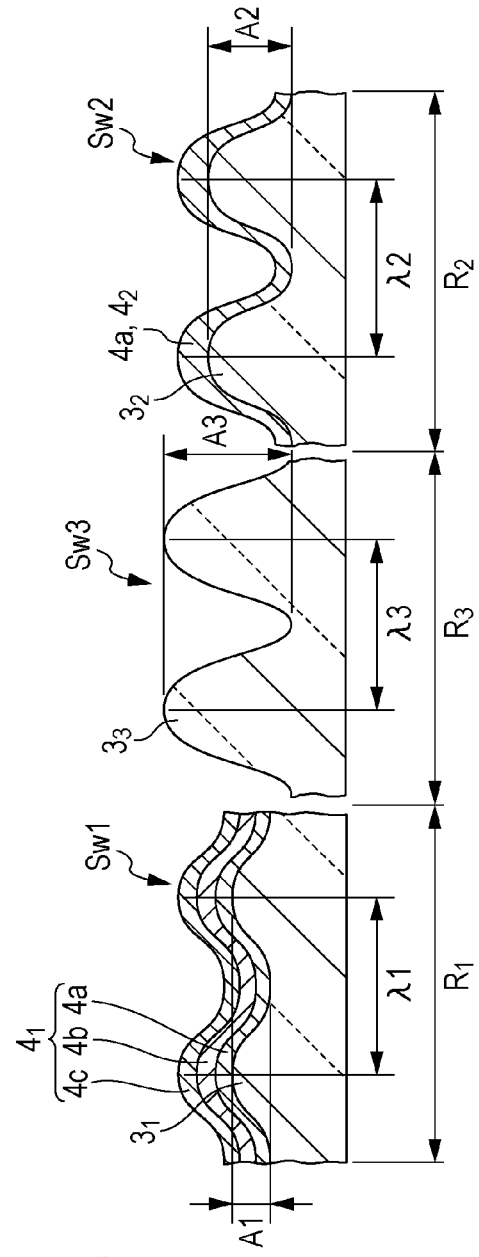
FIG. 19B is a cross-sectional view illustrating a second example of surface structures of a first conductive element and a second conductive element.

Alternatively, as illustrated in FIG. 19B, a wavy surface Sw1 may be formed in the first region $R_1$, and the first layer $4_1$ may be continuously formed on the wavy surface Sw1.

The first region $R_1$ is set at an end of the second region $R_2$ of the second base $2_2$ as in the first base $2_1$, and the first layer $4_1$ is continuously formed in this first region $R_1$. Accordingly, the first layer $4_1$ which is a wiring is led from an end of the second layer $4_2$ which is a vertical electrode, and extends to the terminal formation region.

In the sixth embodiment, for example, electrodes and wiring of a liquid crystal display device can be formed by utilizing a difference in the ratio (Am/λm) between wavy surfaces. Furthermore, for example, in the case where the wavelength of each of the wavy surfaces is set to equal to or less than the wavelength of visible light, the antireflection property and/or the transmission property of the liquid crystal display device can be improved.

Seventh Embodiment (An Application to an Information Input Device)

Figure 20:
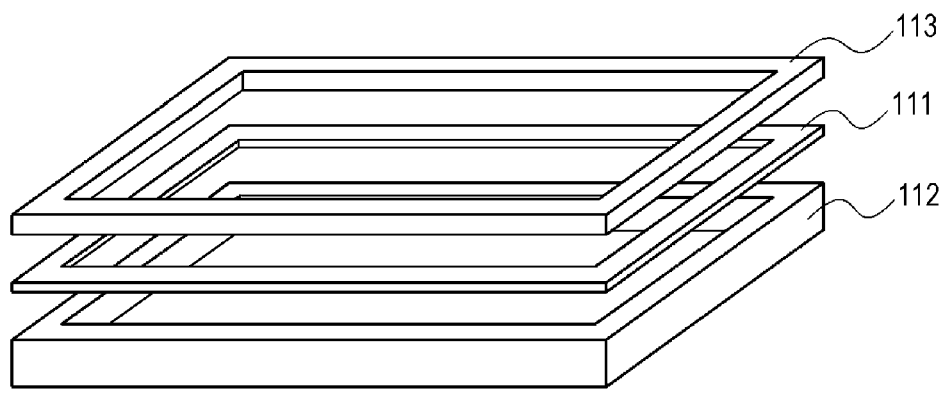
FIG. 20 is a perspective view illustrating a configuration example of a display device including a touch panel according to a seventh embodiment of the present application.

FIG. 20 is a perspective view illustrating a configuration example of a display device including a touch panel according to a seventh embodiment of the present application. As illustrated in FIG. 20, a touch panel (information input device) 111 is provided on a display device 112. The display device 112 is bonded to the touch panel 111 with, for example, an adhesive therebetween. A front panel (surface member) 113 may be further provided on a surface of the touch panel 111. The touch panel 111 is bonded to the front panel 113 with, for example, an adhesive therebetween.

Examples of the display device that can be used as the display device 112 include a liquid crystal display, a cathode ray tube (CRT) display, a plasma display panel (PDP), an electroluminescence (EL) display, and a surface-conduction electron-emitter display (SED). The touch panel 111 is a resistance film touch panel or a capacitive touch panel. An example of the resistance film touch panel is a matrix resistance film touch panel. Examples of the capacitive touch panel include projection-type capacitive touch panels using a wire sensor or an ITO grid.

Figure 21A:
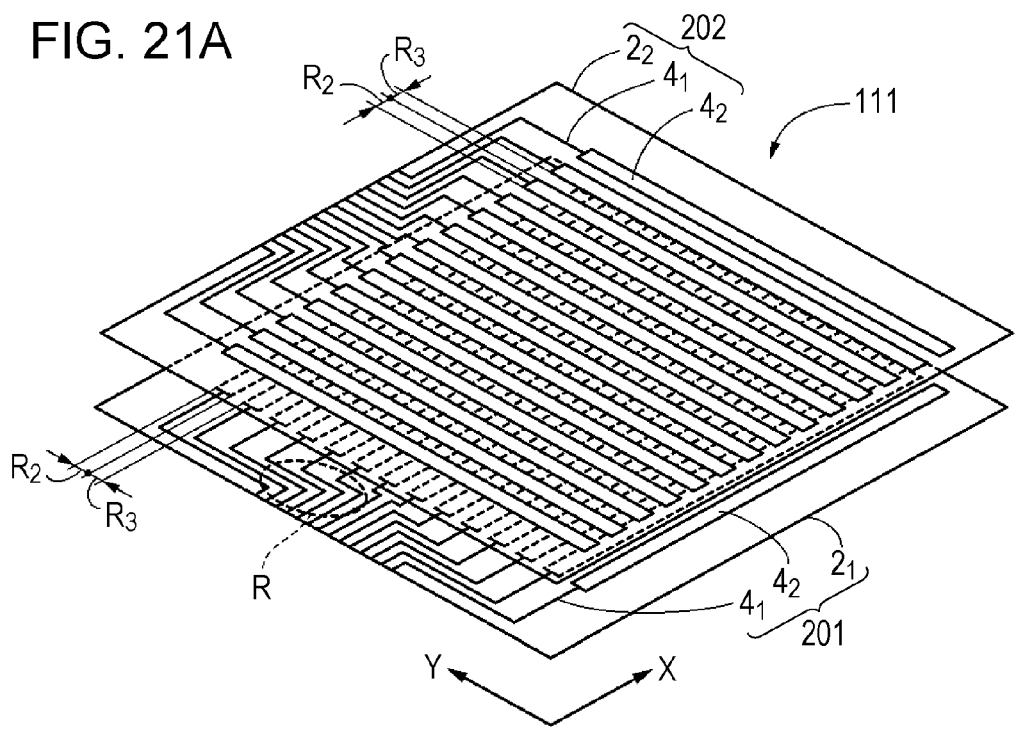
FIG. 21A is a perspective view illustrating a first configuration example of the touch panel according to the seventh embodiment of the present application.

FIG. 21A is a perspective view illustrating a first configuration example of the touch panel according to the seventh embodiment of the present application. A touch panel 111 is a matrix resistance film touch panel, and includes a first conductive element 201 and a second conductive element 202 arranged so as to face each other at a predetermined distance with a dot spacer (not illustrated) therebetween.

Figure 21B:
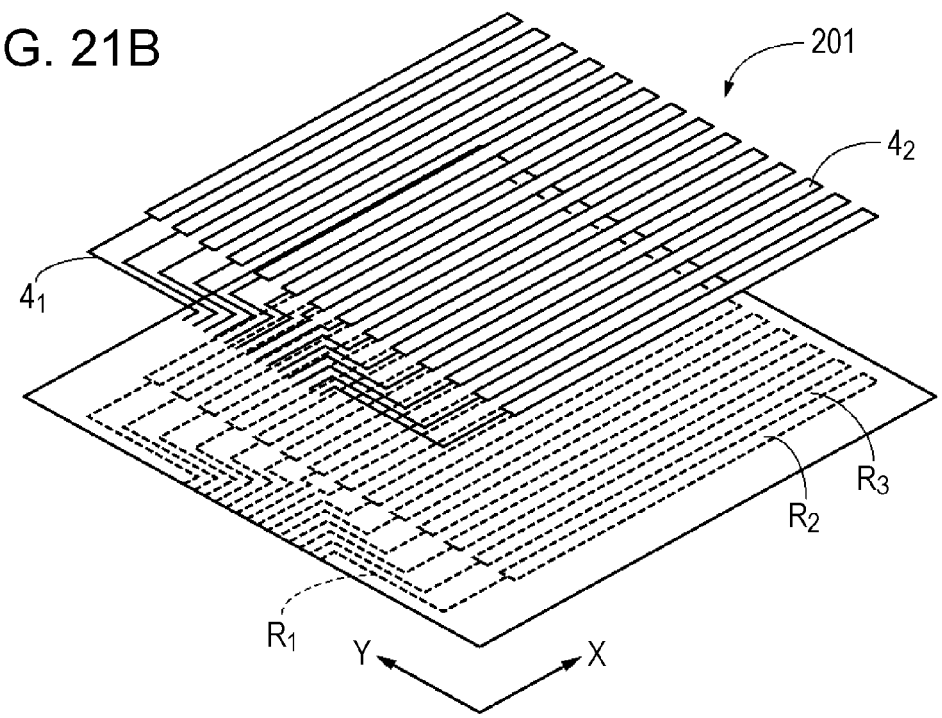
FIG. 21B is an exploded perspective view illustrating a configuration example of a first conductive element.

FIG. 21B is an exploded perspective view illustrating a configuration example of the first conductive element 201. The second conductive element 202 has a configuration substantially the same as that of the first conductive element 201. Therefore, illustration of an exploded perspective view of the second conductive element 202 is omitted. A rectangular second region $R_2$ and a rectangular third region $R_3$ are alternately repeatedly set on one of two main surfaces of a first base $2_1$, the one main surface facing a second base $2_2$. The surface structures of the second region $R_2$ and the third region $R_3$ of the first base $2_1$ are respectively similar to the surface structures of the second region $R_2$ and the third region $R_3$ of any of the first to fifth embodiments described above.

For example, as illustrated in FIG. 19A, a wavy surface Sw2 is formed in the second region $R_2$ on the surface of the first base, and a second layer $4_2$ is continuously formed on the wavy surface Sw2. On the other hand, a wavy surface Sw3 is formed in the third region $R_3$ on the surface of the first base, and a layer such as a first layer $4_1$ or the second layer $4_2$ is not formed on the wavy surface Sw3. Accordingly, a plurality of horizontal (X) electrodes (first electrodes) composed of the continuously formed second layer $4_2$ are formed in a stripe shape on one of the two main surfaces of the first base $2_1$, the one main surface facing the second base $2_2$.

A rectangular second region $R_2$ and a rectangular third region $R_3$ are alternately repeatedly set on one of two main surfaces of the second base $2_2$, the one main surface facing the first base $2_1$. The surface structures of the second region $R_2$ and the third region $R_3$ of the second base $2_2$ are respectively similar to the surface structures of the second region $R_2$ and the third region $R_3$ of any of the first to fifth embodiments described above.

For example, as illustrated in FIG. 19A, a wavy surface Sw2 is formed in the second region $R_2$ on the surface of the second base, and a second layer $4_2$ is continuously formed on the wavy surface Sw2. On the other hand, a wavy surface Sw3 is formed in the third region $R_3$ on the surface of the second base, and a layer such as a first layer $4_1$ or the second layer $4_2$ is not formed on the wavy surface Sw3. Accordingly, a plurality of vertical (Y) electrodes (second electrodes) composed of the continuously formed second layer $4_2$ are formed in a stripe shape on one of the two main surfaces of the second base $2_2$, the one main surface facing the first base $2_1$.

The second regions $R_2$ of the first base $2_1$ and the second regions $R_2$ of the second base $2_2$ are in an orthogonal relation to each other. That is, the second layer (horizontal electrode) $4_2$ of the first base $2_1$ and the second layer (vertical electrode) $4_2$ of the second base $2_2$ are in an orthogonal relation to each other.

Figure 22:
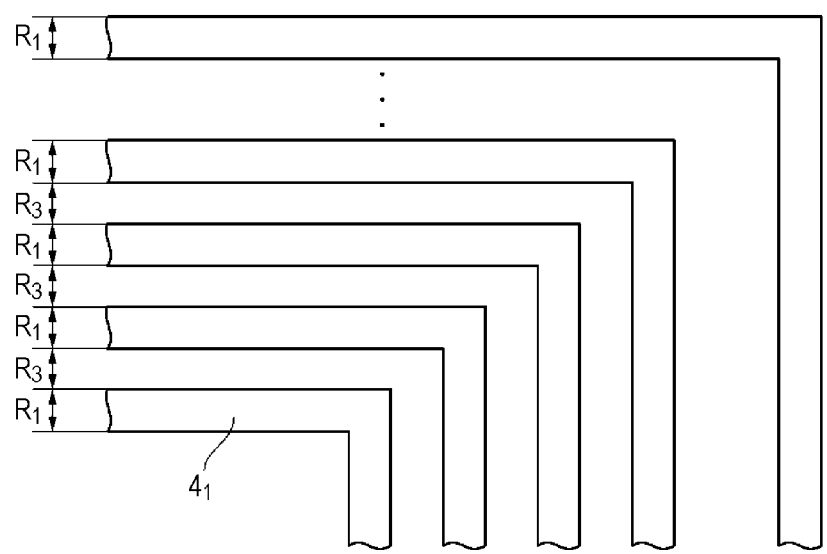
FIG. 22 is an enlarged plan view of a region R illustrated in FIG. 21A.

FIG. 22 is an enlarged plan view of a region R illustrated in FIG. 21A. A first region $R_1$ is set at an end of the second region $R_2$ of the first base $2_1$. The first region $R_1$ has, for example, a long, narrow shape such as a linear shape. An end of the first region $R_1$ is connected to an end of the second region $R_2$, and another end of the first region $R_1$ is connected to a flexible printed circuit (FPC) provided on a peripheral portion of the first base $2_1$. The third region $R_3$ is set in the peripheral portion other than the two ends of the first region $R_1$. The surface structure of the first region $R_1$ is similar to the surface structure of the first region $R_1$ of any of the first to fifth embodiments described above.

For example, as illustrated in FIG. 19A, a planar surface Sp1 is formed in the first region $R_1$ on the surface of the first base, and a first layer $4_1$ is continuously formed on the planar surface Sp1. On the other hand, for example, the wavy surface Sw3 is formed in the third region $R_3$ on the surface of the first base, and a layer such as the first layer $4_1$ or the second layer $4_2$ is not formed on the wavy surface Sw3. Accordingly, the first layer $4_1$ which is a wiring is led from an end of the second layer $4_2$ which is a horizontal electrode, and extends to a region where the FPC is formed. The first layer $4_1$ which is a wiring is electrically connected to a driving circuit through the FPC formed in this region.

Alternatively, as illustrated in FIG. 19B, a wavy surface Sw1 may be formed in the first region $R_1$, and the first layer $4_1$ may be continuously formed on the wavy surface Sw1.

The first region $R_1$ is set at an end of the second region $R_2$ of the second base $2_2$ as in the first base $2_1$, and the first layer $4_1$ is continuously formed in this first region $R_1$. Accordingly, the first layer $4_1$ which is a wiring is led from an end of the second layer $4_2$ which is a vertical electrode, and extends to a region where an FPC is formed.

Figure 23A:
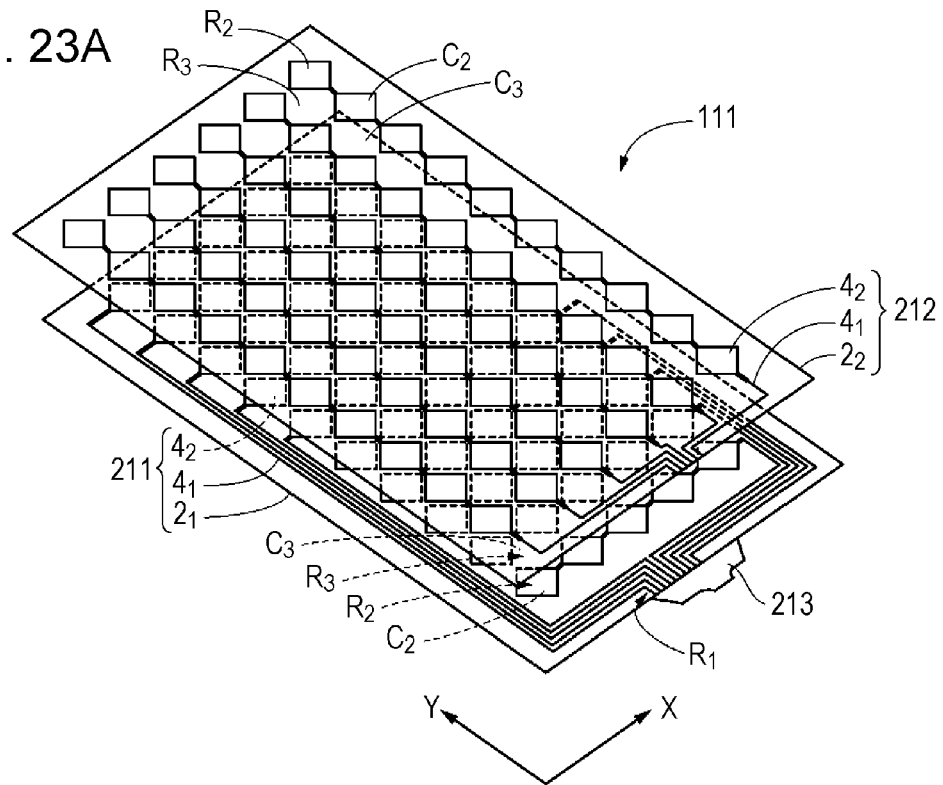
FIG. 23A is a perspective view illustrating a second configuration example of the touch panel according to the seventh embodiment of the present application.

FIG. 23A is a perspective view illustrating a second configuration example of the touch panel according to the seventh embodiment of the present application. This touch panel is a projection-type capacitive touch panel using an ITO grid, and includes a first conductive element 211 and a second conductive element 212, which are overlapped with each other.

Figure 23B:
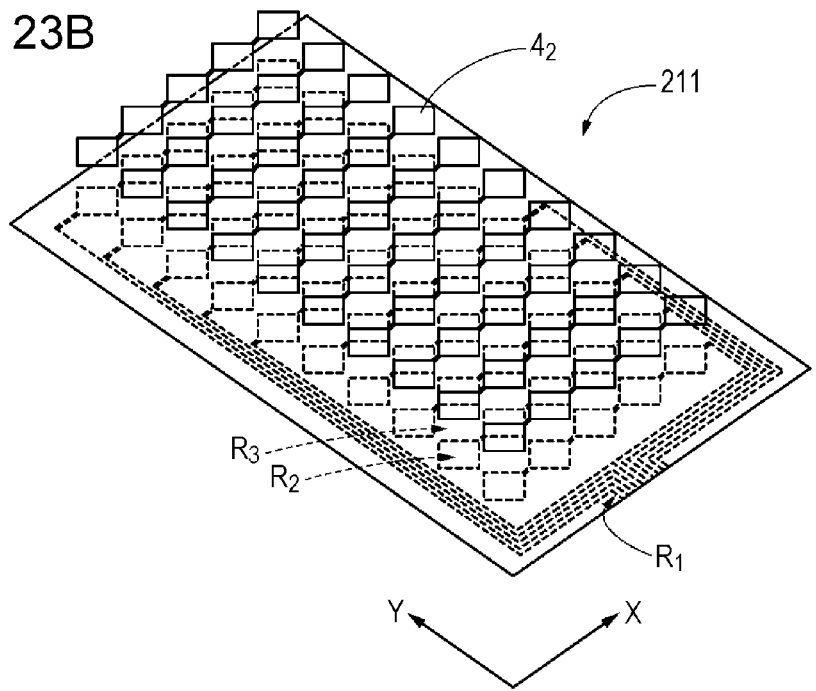
FIG. 23B is an exploded perspective view illustrating a configuration example of a first conductive element.

FIG. 23B is an exploded perspective view illustrating a configuration example of the first conductive element 211. The second conductive element 212 has a configuration substantially the same as that of the first conductive element 211. Therefore, illustration of an exploded perspective view of the second conductive element 212 is omitted. A second region $R_2$ and a third region $R_3$ are alternately repeatedly set on one of two main surfaces of a first base $2_1$, the one main surface facing a second base $2_2$, so that adjacent second regions $R_2$ are separated from each other with a third region $R_3$ interposed therebetween. Similarly, a second region $R_2$ and a third region $R_3$ are alternately repeatedly set on one of two main surfaces of the second base $2_2$, the one main surface facing the first base $2_1$, so that adjacent second regions $R_2$ are separated from each other with a third region $R_3$ interposed therebetween. The surface structures of the second region $R_2$ and the third region $R_3$ of the first base $2_1$ are respectively similar to the surface structures of the second region $R_2$ and the third region $R_3$ of any of the first to fifth embodiments described above. The surface structures of the second region $R_2$ and the third region $R_3$ of the second base $2_2$ are respectively similar to the surface structures of the second region $R_2$ and the third region $R_3$ of any of the first to fifth embodiments described above.

The second region $R_2$ of the first base $2_1$ is formed by repeatedly connecting unit regions $C_2$ each having a predetermined shape to each other in the X-axis direction. The third region $R_3$ interposed between the second regions $R_2$ of the first base $2_1$ is formed by repeatedly connecting unit regions $C_3$ each having a predetermined shape to each other in the X-axis direction. The second region $R_2$ of the second base $2_2$ is formed by repeatedly connecting unit regions $C_2$ each having a predetermined shape to each other in the Y-axis direction. The third region $R_3$ interposed between the second regions $R_2$ of the second base $2_2$ is formed by repeatedly connecting unit regions $C_3$ each having a predetermined shape to each other in the Y-axis direction. Examples of the shape of each of the unit regions $C_2$ and $C_3$ include, but are not limited to, a rhombus (diamond), a triangle, and a rectangle.

For example, as illustrated in FIG. 19A, a wavy surface Sw2 is formed in the second region $R_2$ on the surface of the first base or on the surface of the second base, and a second layer $4_2$ is continuously formed on the wavy surface Sw2. On the other hand, a wavy surface Sw3 is formed in the third region $R_3$ on the surface of the first base or on the surface of the second base, and a layer such as a first layer $4_1$ or the second layer $4_2$ is not formed on the wavy surface Sw3. Accordingly, a plurality of horizontal (X) electrodes (first electrodes) composed of the continuously formed second layer $4_2$ are arranged on one of the two main surfaces of the first base $2_1$, the one main surface facing the second base $2_2$. Similarly, a plurality of vertical (Y) electrodes (second electrodes) composed of the continuously formed second layer $4_2$ are arranged on one of the two main surfaces of the second base $2_2$, the one main surface facing the first base $2_1$. The horizontal electrodes and the vertical electrodes each have the same shape as the corresponding second region $R_2$.

The horizontal electrodes of the first conductive element 211 and the vertical electrodes of the second conductive element 212 are in an orthogonal relation to each other. In the state where the first conductive element 211 and the second conductive element 212 are overlapped with each other, the second region $R_2$ of the first conductive element 211 is overlapped with the third region $R_3$ of the second conductive element 212, and the third region $R_3$ of the first conductive element 211 is overlapped with the second region $R_2$ of the second conductive element 212.

A first region $R_1$ is set at an end of the second region $R_2$ of the first base $2_1$. The first region $R_1$ has, for example, a long, narrow shape such as a linear shape. An end of the first region $R_1$ is connected to an end of the second region $R_2$, and another end of the first region $R_1$ is connected to a flexible printed circuit (FPC) provided on a peripheral portion of the first base $2_1$. The third region $R_3$ is set in the peripheral portion other than the two ends of the first region $R_1$. The surface structure of the first region $R_1$ is similar to the surface structure of the first region $R_1$ of any of the first to fifth embodiments described above.

For example, as illustrated in FIG. 19A, a planar surface Sp1 is formed in the first region $R_1$ on the surface of the first base, and a first layer $4_1$ is continuously formed on the planar surface Sp1. On the other hand, for example, the wavy surface Sw3 is formed in the third region $R_3$ on the surface of the first base, and a layer such as the first layer $4_1$ or the second layer $4_2$ is not formed on the wavy surface Sw3. Accordingly, the first layer $4_1$ which is a wiring is led from an end of the second layer $4_2$ which is a horizontal electrode, and extends to a region where the FPC is formed. The first layer $4_1$ which is a wiring is electrically connected to a driving circuit through the FPC formed in this region.

Alternatively, as illustrated in FIG. 19B, a wavy surface Sw1 may be formed in the first region $R_1$, and the first layer $4_1$ may be continuously formed on the wavy surface Sw1.

The first region $R_1$ is set at an end of the second region $R_2$ of the second base $2_2$ as in the first base $2_1$, and the first layer $4_1$ is continuously formed in this first region $R_1$. Accordingly, the first layer $4_1$ which is a wiring is led from an end of the second layer $4_2$ which is a vertical electrode, and extends to a region where an FPC is formed.

In the seventh embodiment, for example, electrodes and wiring of a touch panel 111 can be formed by utilizing a difference in the ratio (Am/m) between wavy surfaces. Furthermore, for example, in the case where the wavelength of each of the wavy surfaces is set to equal to or less than the wavelength of visible light, the antireflection property and/or the transmission property of the touch panel 111 can be improved.

In the information input device according to the seventh embodiment, a low reflection and a high transmittance can be realized regardless of, for example, the presence or absence of the second layer $4_2$ forming the horizontal electrodes and the vertical electrodes, and thus visual recognition of the electrodes can be suppressed. In contrast, in existing information input devices (such as a matrix resistance film touch panel and a capacitive touch panel) in which electrodes composed of a layer such as a conductive layer are formed on a surface of a base, the reflectivity of the layer such as a conductive layer is different from the reflectivity of the base. Consequently, the electrodes are visible and the display quality tends to degrade.

Eighth Embodiment
(An Application to an IC Card)

Figure 24A:
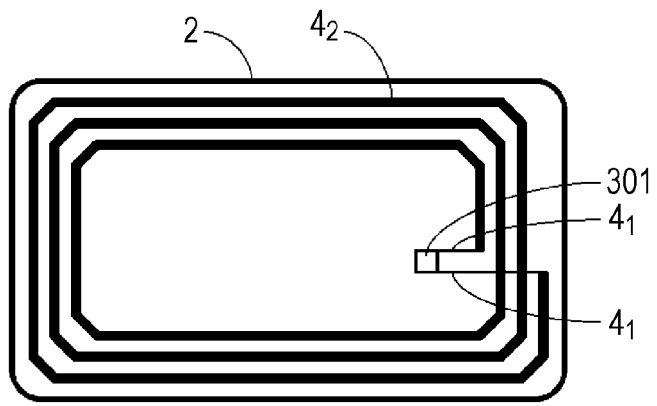
FIG. 24A is a plan view illustrating a configuration example of an IC card according to an eighth embodiment of the present application.

FIG. 24A is a plan view illustrating a configuration example of an IC card according to an eighth embodiment of the present application. As illustrated in FIG. 24A, this IC card is a so-called non-contact IC card, and includes a base 2, a second layer $4_2$ forming an antenna coil, and an IC chip 301. Both ends of the antenna coil composed of the second layer $4_2$ are each connected to the IC chip 301 through wirings composed of a first layer $4_1$. An outer packaging material (not illustrated) is provided on both surfaces of the base 2.

The shape of the base 2 may be a film shape, a sheet shape, or a substrate shape, but is not limited thereto. The material of the base 2 can be appropriately selected and used in accordance with characteristics necessary for the IC card. From the standpoint of durability, convenience, etc., a flexible resin material is preferably used as the material of the base 2. Examples of the resin material include, but are not particularly limited to, polyethylene naphthalate (PEN), polyethylene terephthalate (PET), polyimides (PI), and polyesters. The material can be appropriately selected from other existing resin materials and used in accordance with characteristics necessary for the IC card.

Figure 24B:
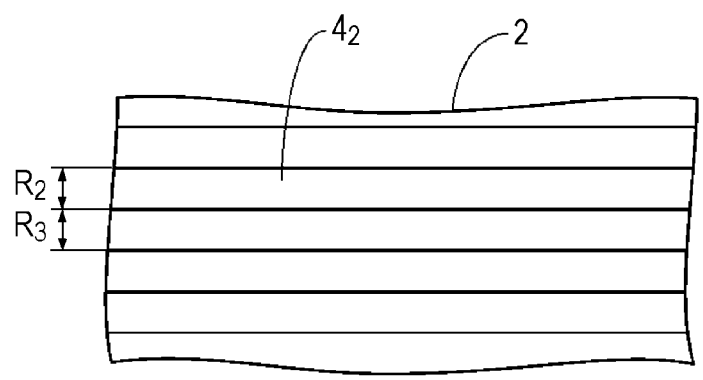
FIG. 24B is an enlarged plan view illustrating a region where an antenna coil illustrated in FIG. 24A is formed.

FIG. 24B is an enlarged plan view illustrating a region where the antenna coil illustrated in FIG. 24 A is formed. For example, a second region $R_2$ and a third region $R_3$ are alternately formed in a spiral manner on a peripheral portion of a main surface of the base 2. The surface structures of the second region $R_2$ and the third region $R_3$ of the base 2 are similar to the surface structures of the base of the conductive element according to any of the first to fifth embodiments described above.

For example, as illustrated in FIG. 19A, a wavy surface Sw2 is formed in the second region $R_2$ on the surface of the base, and a second layer $4_2$ is continuously formed on the wavy surface Sw2. On the other hand, a wavy surface Sw3 is formed in the third region $R_3$ on the surface of the base, and a layer such as the first layer $4_1$ or the second layer $4_2$ is not formed on the wavy surface Sw3. Accordingly, on the peripheral portion of the main surface of the base 2, the antenna coil composed of the continuously formed second layer $4_2$ is formed so as to conform to the shape of the second region $R_2$.

Figure 24C:
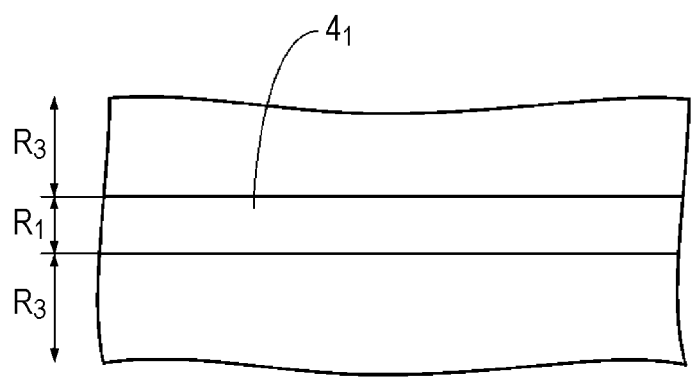
FIG. 24C is an enlarged plan view illustrating a region where wiring illustrated in FIG. 24A is formed.

FIG. 24C is an enlarged plan view illustrating a region where the wiring illustrated in FIG. 24 A is formed. A first region $R_1$ is set at an end of the second region $R_2$ of the base 2. The first region $R_1$ has, for example, a long, narrow shape such as a linear shape. An end of the first region $R_1$ is connected to an end of the second region $R_2$, and another end of the first region $R_1$ is connected to, for example, a terminal formation region of the IC chip 301. The third region $R_3$ is set in the peripheral portion other than the two ends of the first region $R_1$. The surface structure of the first region $R_1$ is similar to the surface structure of the first region $R_1$ of any of the first to fifth embodiments described above.

For example, as illustrated in FIG. 19A, a planar surface Sp1 is formed in the first region $R_1$ on the surface of the base, and a first layer $4_1$ is continuously formed on the planar surface Sp1. On the other hand, for example, the wavy surface Sw3 is formed in the third region $R_3$ on the surface of the base, and a layer such as the first layer $4_1$ or the second layer $4_2$ is not formed on the wavy surface Sw3. Accordingly, a wiring is led from an end of the second layer $4_2$ which is the antenna coil, and extends to the terminal formation region of the IC chip 301. The first layer $4_1$ which is the wiring is electrically connected to the IC chip 301 through a terminal formed in this terminal formation region.

Alternatively, as illustrated in FIG. 19B, a wavy surface Sw1 may be formed in the first region $R_1$, and the first layer $4_1$ may be continuously formed on the wavy surface Sw1.

The outer packaging material forms two main surfaces of the IC card and contains, as a main component, a polymer material such as polyethylene terephthalate (PET), polybutylene terephthalate (PBT), polyethylene glycol (PEG), or oriented PET. However, the outer packaging material is not particularly limited to these materials and can be appropriately selected from other existing resin materials and used in accordance with characteristics necessary for the IC card.

The antenna coil is an electromagnetic induction coil having a loop coil shape, the coil being formed on the base 2 so as to extend along the peripheral edges of the base 2 a plurality of times. Both ends of the antenna coil are connected to the IC chip 301. The antenna coil receives an alternating magnetic field generated from a reader/writer to induce an alternating voltage, and supplies the alternating voltage to the IC chip 301.

The IC chip 301 is driven by the electric power supplied from the antenna coil and controls various components inside the IC card. For example, the IC chip 301 communicates with the reader/writer through the antenna coil. Specifically, the IC chip 301 performs, for example, mutual authentication and data exchange with the reader/writer.

In the eighth embodiment, an antenna coil of an IC card can be formed by utilizing a difference in the ratio (Am/λm) between wavy surfaces. Accordingly, productivity of the IC card can be improved.

Ninth Embodiment
(An Application to a Display Device)

Figure 25A:
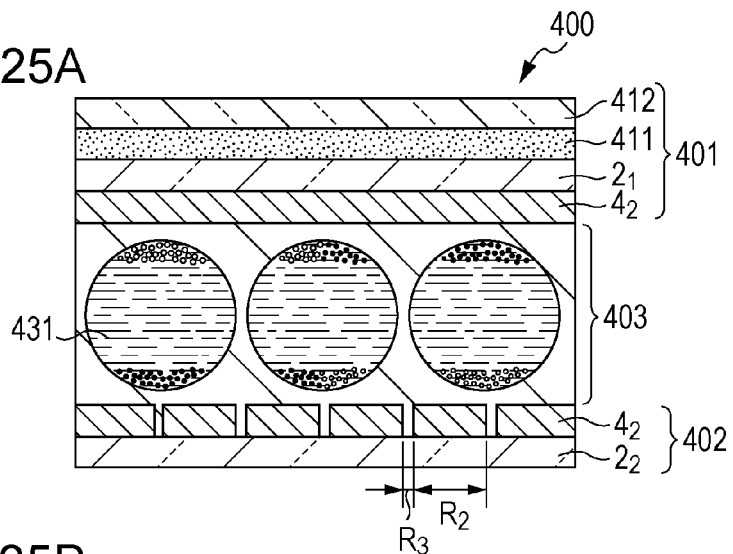
FIG. 25A is a cross-sectional view illustrating a configuration example of a display device according to a ninth embodiment of the present application.
Figure 25B:
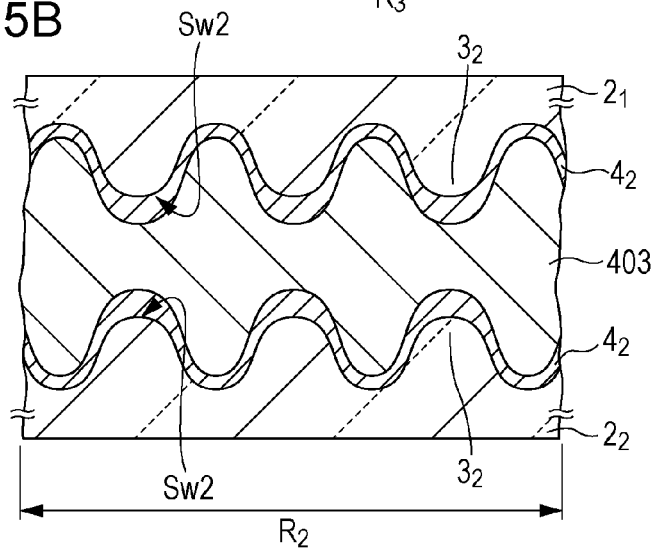
FIG. 25B is an enlarged cross-sectional view illustrating a wiring area illustrated in FIG. 25A.
Figure 25C:
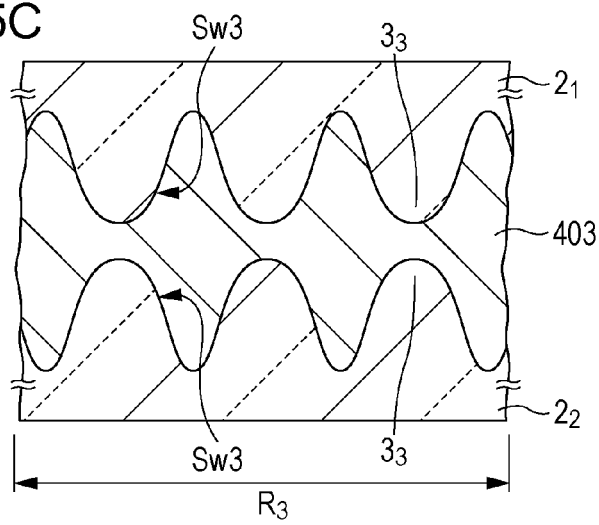
FIG. 25C is an enlarged cross-sectional view illustrating a non-wiring area illustrated in FIG. 25A.

FIG. 25A is a cross-sectional view illustrating a configuration example of a display device according to a ninth embodiment of the present application. FIG. 25B is an enlarged cross-sectional view illustrating a wiring area illustrated in FIG. 25 A. FIG. 25C is an enlarged cross-sectional view illustrating a non-wiring area illustrated in FIG. 25 A. In the ninth embodiment, components the same as the components in the sixth embodiment or components corresponding to the components in the sixth embodiment are assigned the same reference numerals. A display device 400 is so-called microcapsule electrophoretic electronic paper, and includes a first conductive element 401, a second conductive element 402 arranged so as to face the first conductive element 401, and a microcapsule layer (medium layer) 403 arranged between the conductive elements 401 and 402. A description will be made of an example in which the present application is applied to microcapsule electrophoretic electronic paper. However, the electronic paper is not limited to this example, and the present application is applicable to any electronic paper as long as the electronic paper includes conductive elements facing each other and a medium layer arranged between the conductive elements. Herein, the medium includes not only liquid and solid but also gas such as air. The medium may contain components such as capsules, pigments, and particles. In addition to the electronic paper using the microcapsule electrophoresis electronic method, examples of the electronic paper, to which the present application is applicable, include electronic paper using a twist ball method, a thermal rewritable method, a toner display method, an in-plane electrophoresis method, or an electronic liquid powder method.

The microcapsule layer 403 contains a large number of microcapsules 431. For example, a transparent liquid (dispersion medium) containing black particles and white particles dispersed therein is enclosed in each of the microcapsules 431.

As illustrated in FIGS. 25B and 25C, the first conductive element 401 includes a first base $2_1$ having a wavy surface Sw2 and a wavy surface Sw3 that face the second conductive element 402 and a second layer $4_2$ formed on the wavy surface Sw2. If necessary, the first base $2_1$ may be bonded to a support 412 composed of glass or the like with a bonding layer 411 composed of, for example, an adhesive therebetween. As illustrated in FIGS. 25B and 25C, the second conductive element 402 includes a second base $2_2$ having a wavy surface Sw2 and a wavy surface Sw3 that face the first conductive element 401 and a second layer $4_2$ formed on the wavy surface Sw2.

The second layer $4_2$ provided on each of the first base $2_1$ and the second base $2_2$ is formed in a predetermined electrode pattern in accordance with the driving method of the display device 400. Examples of the driving method include a simple matrix driving method, an active matrix driving method, and a segment driving method.

In the ninth embodiment, configurations other than the above are the same as those of the sixth embodiment.

[Configurations of the Present Application]

The present application can also provide the following configurations:

(1) A conductive element including a base having a first wavy surface, a second wavy surface, and a third wavy surface; a first layer provided on the first wavy surface; and a second layer provided on the second wavy surface, wherein the first layer has a multilayer structure in which two or more sublayers are stacked, the second layer has a single-layer or multilayer structure including part of the sublayers constituting the first layer, the first layer and the second layer form a conductive pattern portion, and the first wavy surface, the second wavy surface, and the third wavy surface satisfy the following relationship:

$$0 \leq (Am1/\lambda m1) < (Am2/\lambda m2) < (Am3/\lambda m3) \leq 1.8$$

where Am1 is a mean amplitude of vibrations of the first wavy surface, Am2 is a mean amplitude of vibrations of the second wavy surface, Am3 is a mean amplitude of vibrations of the third wavy surface, λm1 is a mean wavelength of the first wavy surface, λm2 is a mean wavelength of the second wavy surface, and λm3 is a mean wavelength of the third wavy surface.

(2) The conductive element according to item (1), wherein the first wavy surface, the second wavy surface, and the third wavy surface satisfy the following relationships:

$$(Am1/\lambda m1)=0 \text{ and } 0 (Am2/\lambda m2)<(Am3/\lambda m3) \leq 1.8,$$
and a wavelength λ2 of the second wavy surface and a wavelength λ3 of the third wavy surface are each equal to or less than a wavelength of visible light.

(3) The conductive element according to item (1), wherein the first wavy surface, the second wavy surface, and the third wavy surface satisfy the following relationship:

$$0<(Am1/\lambda m1)<(Am2/\lambda m2)<(Am3/\lambda m3)\leq 1.8,\ \text{and}$$

a wavelength λ1 of the first wavy surface, a wavelength λ2 of the second wavy surface, and a wavelength λ3 of the third wavy surface are each equal to or less than a wavelength of visible light.

(4) The conductive element according to item (1), wherein the first wavy surface, the second wavy surface, and the third wavy surface satisfy the following relationships:

$$(Am1/\lambda m1)=0\ \text{and}\ 0<(Am2/\lambda m2)<(Am3/\lambda m3)\leq 1.8,\ \text{and}$$

a wavelength λ2 of the second wavy surface and a wavelength λ3 of the third wavy surface are each 100 μm or less.

(5) The conductive element according to item (1), wherein the first wavy surface, the second wavy surface, and the third wavy surface satisfy the following relationship:

$$0<(Am1/\lambda m1)<(Am2/\lambda m2)<(Am3/\lambda m3)\leq 1.8,\ \text{and}$$

a wavelength λ1 of the first wavy surface, a wavelength λ2 of the second wavy surface, and a wavelength λ3 of the third wavy surface are each 100 μm or less.

(6) The conductive element according to any one of items (1) to (5), further including a third layer provided on the third wavy surface, wherein the third layer includes part of sublayers constituting the second layer, and the first layer, the second layer, and the third layer satisfy the following relationship:

$$S1>S2>S3$$

where S1 is a unit area of the first layer, S2 is a unit area of the second layer, and S3 is a unit area of the third layer.

(7) The conductive element according to item (6), wherein the first layer and the second layer are continuously formed on the first wavy surface and the second wavy surface, respectively, and the third layer is discontinuously formed on the third wavy surface.

(8) The conductive element according to any one of items (1) to (5), further including a third layer provided on the third wavy surface wherein the first layer, the second layer, and the third layer satisfy the following relationship:

$$d1>d2>d3$$

where d1 is a mean thickness of the first layer, d2 is a mean thickness of the second layer, and d3 is a mean thickness of the third layer.

(9) The conductive element according to any one of items (1) to (8), wherein the first layer includes a conductive sublayer, a first functional sublayer provided on the conductive sublayer, and a second functional sublayer provided on the first functional sublayer, and the second layer includes the conductive sublayer.

(10) The conductive element according to item (9), wherein a second functional sublayer is further provided between the conductive sublayer and the first functional sublayer.

(11) The conductive element according to item (9) or (10), wherein the conductive sublayer is a transparent conductive sublayer containing an oxide semiconductor, and the oxide semiconductor contains indium tin oxide or zinc oxide.

(12) The conductive element according to item (11), wherein the oxide semiconductor is in a mixed state of an amorphous phase and a polycrystalline phase.

(13) The conductive element according to any one of items (9) to (12), wherein the first functional sublayer and the second functional sublayer are composed of different materials.

(14) The conductive element according to any one of items (9) to (13), wherein the first functional sublayer and the second functional sublayer are metal sublayers, and the metal sublayers each contain at least one selected from the group consisting of Ag, Al, Au, Pt, Pd, Ni, Cr, Nb, W, Mo, Ti, Cu, and Nd.

(15) The conductive element according to any one of items (9) to (13), wherein the first functional sublayer and the second functional sublayer each contain at least one selected from the group consisting of oxides and transition metal compounds.

(16) The conductive element according to any one of items (9) to (15), wherein the first functional sublayer and the second functional sublayer each contain at least one of a sublayer in a mixed state of an amorphous phase and a polycrystalline phase and a polycrystalline sublayer.

(17) A wiring element including the conductive element according to any one of items (1) to (16).

(18) An information input device including the conductive element according to any one of items (1) to (16).

(19) A display device including the conductive element according to any one of items (1) to (16).

(20) An electronic apparatus including the conductive element according to any one of items (1) to (16).

(21) A master for preparing the conductive element according to any one of items (1) to (16).

(22) A method for producing a conductive element, the method including forming a stacked film on a surface of a base having a first wavy surface, a second wavy surface, and a third wavy surface by stacking two or more sublayers; and forming a conductive pattern portion by removing the stacked film located on the third wavy surface, among the first wavy surface, the second wavy surface, and the third wavy surface, by leaving, as a first layer, the stacked film located on the first wavy surface, and leaving, as a second layer, part of the sublayers constituting the stacked film located on the second wavy surface, wherein the first wavy surface, the second wavy surface, and the third wavy surface satisfy the following relationship:

$$0\leq(Am1/\lambda m1)<(Am2/\lambda m2)<(Am3/\lambda m3)\leq 1.8$$

where Am1 is a mean amplitude of vibrations of the first wavy surface, Am2 is a mean amplitude of vibrations of the second wavy surface, Am3 is a mean amplitude of vibrations of the third wavy surface, λm1 is a mean wavelength of the first wavy surface, λm2 is a mean wavelength of the second wavy surface, and λm3 is a mean wavelength of the third wavy surface.

EXAMPLES

The present application will now be specifically described by way of Examples. However, the present application is not limited to the following Examples.

In the following Examples, the surface resistance of a conductive sheet was measured using a four-probe resistance measuring device. A probe diameter R of a probe tip was 100 μm, and the pitch of the probe was 1 mm.

Reference Example 1

(Transfer Step)

Figure 26A:
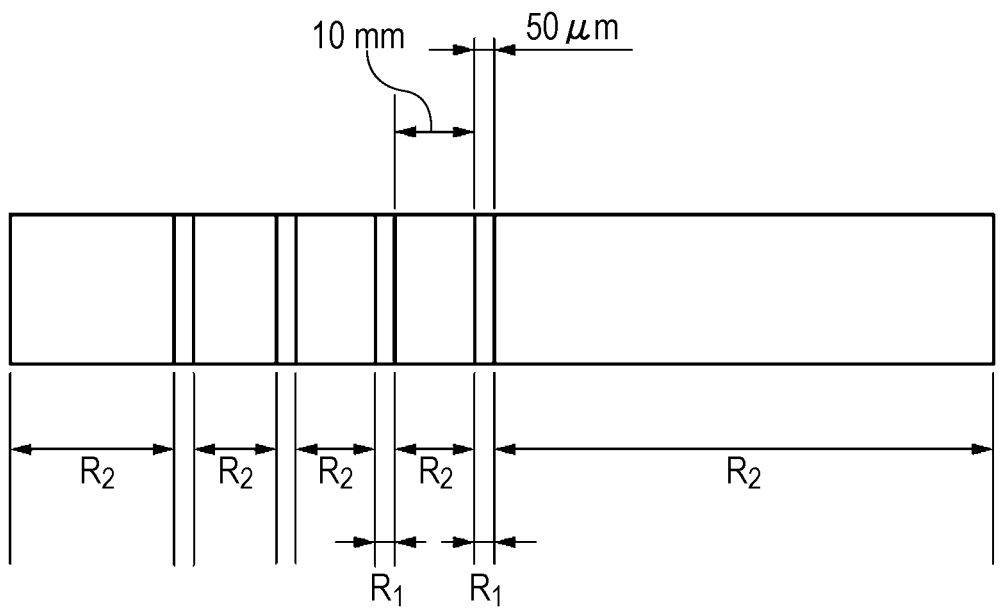
FIG. 26A is a schematic view illustrating a forming surface of a quartz master used for preparing a transparent conductive sheet according to Reference Example 1.

First, as illustrated in FIG. 26A, a quartz master including a planer region (first region) $R_1$ and a nanostructure-arranged region (second region) $R_2$ formed on a forming surface thereof in a stripe shape was prepared. Next, an ultraviolet-curable resin was applied onto the forming surface of the quartz master, and a PET sheet having an easily adhesive layer thereon was brought into close contact with the ultraviolet-curable resin. The PET sheet was then detached while curing the ultraviolet-curable resin by irradiation of ultraviolet rays, thus preparing an optical sheet in which a large number of projecting nanostructures were formed in the nanostructure-arranged region (second region) $R_2$ and a planar surface was formed in the planer region (first region) $R_1$ on the surface of the PET sheet. The array pitch of the structures was 250 nm, and the height of each the structures was 200 nm. The shape of each of the structures was a truncated cone shape, and the arrangement of the structures had a hexagonal lattice pattern.

(Film Formation Step)

Next, an ITO layer was formed on the forming surface of the optical sheet by a sputtering method. The ultimate degree of vacuum was set to 0.00015 Pa, and the degree of vacuum during deposition was set to 0.24 Pa. During the deposition, Ar gas and $O_2$ gas were introduced at a mixing ratio of $Ar:O_2=200:13$. The deposition conditions were adjusted so that a film thickness of 30 nm in terms of flat sheet was obtained. Note that the film thickness in terms of flat sheet is substantially equal to the film thickness at an apex portion of each of the structures.

(Annealing Step)

Next, the optical sheet having the ITO layer thereon was subjected to annealing in air at 150° C. for 30 minutes. Polycrystallization of the ITO layer was accelerated by this annealing. Next, the ITO layer was measured by X-ray diffraction (XRD) in order to confirm the accelerated state of polycrystallization. A peak attributable to $In_2O_3$ was observed.

(Removal Step)

Next, the optical sheet having been subjected to the annealing treatment was immersed in a solution with a pH of about 3 for 20 seconds.

(Washing Step)

Next, the optical sheet having been subjected to the removal treatment was washed with pure water.

Thus, a target transparent conductive sheet was prepared.

(Conduction/non-conduction Evaluation)

Figure 26B:
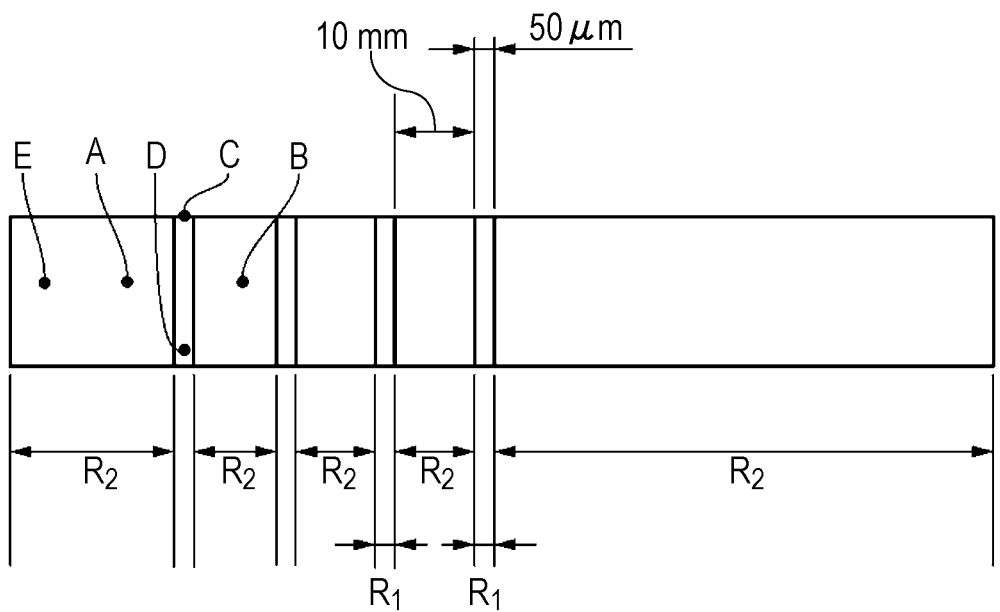
FIG. 26B is a schematic view illustrating points for evaluating conduction/non-conduction of the transparent conductive sheet according to Reference Example 1.

Conduction and non-conduction of a surface of the transparent conductive sheet according to Reference Example 1 prepared as described above were evaluated at points illustrated in FIG. 26B using a tester. The evaluation results are shown in Table 1.

Table 1 shows evaluation results of the transparent conductive sheet according to Reference Example 1.

TABLE 1

| | Between A and B | Between E and A | Between C and D |
|---|---|---|---|
| Reference Example 1 | Insulated | Insulated | 2,000 Ω (Conducted) |

Table 1 shows the following.

Of the surface of the transparent conductive sheet, the nanostructure-arranged region (second region) $R_2$ is in an insulating state, whereas the planer region (first region) $R_1$ is in a conductive state. Accordingly, a desired conductive pattern such as a wiring or electrode pattern can be formed on the surface of a base by simply sequentially performing the transfer step, the film formation step, and the removal step. Consequently, the throughput can be improved.

Example 1

Transfer Step

First, a quartz master including a first region having a planar surface Sp1, a second region having a wavy surface Sw2, and a third region having a wavy surface Sw3 that were sequentially formed on a forming surface thereof in a stripe shape was prepared.

Next, an ultraviolet-curable resin was applied onto the forming surface of the quartz master, and a PET sheet having an easily adhesive layer thereon was brought into close contact with the ultraviolet-curable resin. The PET sheet was then detached while curing the ultraviolet-curable resin by irradiation of ultraviolet rays, thus preparing an optical sheet (nanoimprint film) on which the first region, the second region, and the third region were transferred.

(Measurement of Shapes)

Next, the mean wavelengths λm and the mean amplitudes Am of vibrations of each of the wavy surface Sw2 and the wavy surface Sw3 on the transfer surface of the optical sheet were measured. A ratio Am/λm was determined from the measurement values. The results are shown in Table 2.

(Film Formation Step)

A stacked film was formed on the forming surface of the optical sheet by a sputtering method.

The configuration of the stacked film is as follows:

$TiO_x$ sublayer (second functional sublayer)/ITO sublayer (adhesive sublayer)/Ag sublayer (first functional sublayer)/ITO sublayer (adhesive sublayer)/$TiO_x$ sublayer (second functional sublayer)/ITO sublayer (conductive sublayer)/forming surface of optical sheet Deposition conditions of the respective sublayers will be described below.

$TiO_x$ sublayer (second functional sublayer)
  Degree of vacuum during deposition: about 0.28 Pa
  Type of gas: Mixed gas of Ar gas and $O_2$ gas
  Film thickness in terms of flat sheet: 10 nm
ITO sublayer (adhesive sublayer)
  Ultimate degree of vacuum: 0.00015 Pa
  Degree of vacuum during deposition: 0.24 Pa
  Type of gas: Mixed gas of Ar gas and $O_2$ gas
  Mixing ratio (volume ratio) of mixed gas: $Ar:O_2=200:16$
  Film thickness in terms of flat sheet: 20 nm
Ag sublayer (first functional sublayer)
  Degree of vacuum during deposition: 0.11 Pa
  Type of gas: Ar gas
  Gas flow rate: 100 sccm
  Film thickness in terms of flat sheet: 100 nm
ITO sublayer (conductive sublayer)
  Ultimate degree of vacuum: 0.00015 Pa
  Degree of vacuum during deposition: 0.24 Pa
  Type of gas: Mixed gas of Ar gas and $O_2$ gas
  Mixing ratio (volume ratio) of mixed gas: $Ar:O_2=200:16$
  Film thickness in terms of flat sheet: 40 nm Herein, the term "film thickness in terms of flat sheet" refers to a film thickness obtained when an ITO sublayer, a $TiO_x$ sublayer, or a Ag sublayer is formed on a flat sheet under the same deposition conditions as in the case where an ITO sublayer, a $TiO_x$ sublayer, or a Ag sublayer is formed on the surface of the above-described optical sheet. The film thickness in terms of flat sheet is substantially equal to the film thickness at an apex portion of a wavy surface of the optical sheet.
(Measurement of Surface Resistance)
Next, the surface resistance of the conductive sheet (i.e., optical sheet) prepared as described above was measured.
(Removal Step)
Next, the conductive sheet was immersed in a solution with a pH of about 3 for 60 seconds.
(Washing Step)
Next, the conductive sheet was washed with pure water. Thus, a target conductive sheet was prepared.
(Measurement of Surface Resistance)
Next, the surface resistance of the conductive sheet prepared as described above was measured.

Example 2

A conductive sheet was prepared as in Example 1 except that a $ZrO_x$ sublayer was used as the second functional sublayer instead of the $TiO_x$ sublayer, and the surface resistance before and after the removal step was measured.

Example 3

A conductive sheet was prepared as in Example 1 except that a $TaO_x$ sublayer was used as the second functional sublayer instead of the $TiO_x$ sublayer, and the surface resistance before and after the removal step was measured.

Example 4

A conductive sheet was prepared as in Example 1 except that a $NbO_x$ sublayer was used as the second functional sublayer instead of the $TiO_x$ sublayer, and the surface resistance before and after the removal step was measured.

Example 5

A conductive sheet was prepared as in Example 1 except that a $SiN_x$ sublayer was used as the second functional sublayer instead of the $TiO_x$ sublayer, and the surface resistance before and after the removal step was measured.

Example 6

A conductive sheet was prepared as in Example 1 except that a $SiO_x$ sublayer was used as the second functional sublayer instead of the $TiO_x$ sublayer, and the surface resistance before and after the removal step was measured.

Example 7

A conductive sheet was prepared as in Example 6 except that a $SnO_2$ sublayer was used as the adhesive sublayer instead of the ITO sublayer, and the surface resistance before and after the removal step was measured.

Example 8

A conductive sheet was prepared as in Example 6 except that an $In_2O_3$ sublayer was used as the adhesive sublayer instead of the ITO sublayer, and the surface resistance before and after the removal step was measured.

Table 2 shows the measurement results of the conductive sheets of Examples 1 to 8.

TABLE 2

|  |  | Planar surface (First region) | Wavy surface (second region) | Wavy surface (Third region) |
|---|---|---|---|---|
| Example 1 | Mean wavelength λm (nm) | — | 250 | 250 |
|  | Mean amplitude Am of vibrations (nm) | — | 130 | 160 |
|  | Ratio (Am/λm) | — | 0.52 | 0.64 |
|  | Layer configuration before removal | $TiO_x$ sublayer/ITO sublayer/Ag sublayer/ITO sublayer/$TiO_x$ sublayer/ITO sublayer | | |
|  | Layer configuration after removal | All sublayers remained | Three sublayers remained (ITO sublayer/$TiO_x$ sublayer/ITO sublayer) | All sublayers were removed |
|  | Change in surface resistance before and after removal | Hardly changed (Maintained a low resistance) | Increased by about 100 times (Changed to a high resistance) | Changed from a conductive state to an insulating state |
| Example 2 | Mean wavelength λm (nm) | — | 250 | 250 |
|  | Mean amplitude Am of vibrations (nm) | — | 130 | 160 |
|  | Ratio (Am/λm) | — | 0.52 | 0.64 |
|  | Layer configuration before removal | $ZrO_x$ sublayer/ITO sublayer/Ag sublayer/ITO sublayer/$ZrO_x$ layer/ITO sublayer | | |
|  | Layer configuration after removal | All sublayers remained | Three sublayers remained (ITO sublayer/$ZrO_x$ sublayer/ITO sublayer) | All sublayers were removed |
|  | Change in surface resistance before and after removal | Hardly changed (Maintained a low resistance) | Increased by about 100 times (Changed to a high resistance) | Changed from a conductive state to an insulating state |
| Example 3 | Mean wavelength λm (nm) | — | 250 | 250 |
|  | Mean amplitude Am of vibrations (nm) | — | 130 | 160 |
|  | Ratio (Am/λm) | — | 0.52 | 0.64 |

TABLE 2-continued

|  |  | Planar surface (First region) | Wavy surface (second region) | Wavy surface (Third region) |
|---|---|---|---|---|
|  | Layer configuration before removal | TaO$_x$ sublayer/ITO sublayer/Ag sublayer/ITO sublayer/TaO$_x$ sublayer/ITO sublayer | | |
|  | Layer configuration after removal | All sublayers remained | Three sublayers remained (ITO sublayer/TaO$_x$ sublayer/ITO sublayer) | All sublayers were removed |
|  | Change in surface resistance before and after removal | Hardly changed (Maintained a low resistance) | Increased by about 100 times (Changed to a high resistance) | Changed from a conductive state to an insulating state |
| Example 4 | Mean wavelength λm (nm) | — | 250 | 250 |
|  | Mean amplitude Am of vibrations (nm) | — | 130 | 160 |
|  | Ratio (Am/λm) | — | 0.52 | 0.64 |
|  | Layer configuration before removal | NbO$_x$ sublayer/ITO sublayer/Ag sublayer/ITO sublayer/NbO$_x$ sublayer/ITO sublayer | | |
|  | Layer configuration after removal | All sublayers remained | Three sublayers remained (ITO sublayer/NbO$_x$ sublayer/ITO sublayer) | All sublayers were removed |
|  | Change in surface resistance before and after removal | Hardly changed (Maintained a low resistance) | Increased by about 100 times (Changed to a high resistance) | Changed from a conductive state to an insulating state |
| Example 5 | Mean wavelength λm (nm) | — | 250 | 250 |
|  | Mean amplitude Am of vibrations (nm) | — | 130 | 160 |
|  | Ratio (Am/λm) | — | 0.52 | 0.64 |
|  | Layer configuration before removal | SiN$_x$ sublayer/ITO sublayer/Ag sublayer/ITO sublayer/SiN$_x$ sublayer/ITO sublayer | | |
|  | Layer configuration after removal | All sublayers remained | Three sublayers remained (ITO sublayer/SiN$_x$ sublayer/ITO sublayer) | All sublayers were removed |
|  | Change in surface resistance before and after removal | Hardly changed (Maintained a low resistance) | Increased by about 100 times (Changed to a high resistance) | Changed from a conductive state to an insulating state |
| Example 6 | Mean wavelength λm (nm) | — | 250 | 250 |
|  | Mean amplitude Am of vibrations (nm) | — | 130 | 160 |
|  | Ratio (Am/λm) | — | 0.52 | 0.64 |
|  | Layer configuration before removal | SiO$_x$ sublayer/ITO sublayer/Ag sublayer/ITO sublayer/SiO$_x$ sublayer/ITO sublayer | | |
|  | Layer configuration after removal | All sublayers remained | Three sublayers remained (ITO sublayer/SiO$_x$ sublayer/ITO sublayer) | All sublayers were removed |
|  | Change in surface resistance before and after removal | Hardly changed (Maintained a low resistance) | Increased by about 100 times (Changed to a high resistance) | Changed from a conductive state to an insulating state |
| Example 7 | Mean wavelength λm (nm) | — | 250 | 250 |
|  | Mean amplitude Am of vibrations (nm) | — | 130 | 160 |
|  | Ratio (Am/λm) | — | 0.52 | 0.64 |
|  | Layer configuration before removal | SiO$_x$ sublayer/SnO$_2$ sublayer/Ag sublayer/SnO$_2$ sublayer/SiO$_x$ sublayer/ITO sublayer | | |
|  | Layer configuration after removal | All sublayers remained | Three sublayers remained (SnO$_2$ sublayer/SiO$_x$ sublayer/ITO sublayer) | All sublayers were removed |
|  | Change in surface resistance before and after removal | Hardly changed (Maintained a low resistance) | Increased by about 100 times (Changed to a high resistance) | Changed from a conductive state to an insulating state |
| Example 8 | Mean wavelength λm (nm) | — | 250 | 250 |
|  | Mean amplitude Am of vibrations (nm) | — | 130 | 160 |
|  | Ratio (Am/λm) | — | 0.52 | 0.64 |
|  | Layer configuration before removal | SiO$_x$ sublayer/In$_2$O$_3$ sublayer/Ag sublayer/In$_2$O$_3$ sublayer/SiO$_x$ sublayer/ITO sublayer | | |
|  | Layer configuration after removal | All sublayers remained | Three sublayers remained (In$_2$O$_3$ sublayer/SiO$_x$ sublayer/ITO sublayer) | All sublayers were removed |

TABLE 2-continued

|  | Planar surface (First region) | Wavy surface (second region) | Wavy surface (Third region) |
| --- | --- | --- | --- |
| Change in surface resistance before and after removal | Hardly changed (Maintained a low resistance) | Increased by about 100 times (Changed to a high resistance) | Changed from a conductive state to an insulating state |

The following was found from the above evaluation results.

In the first region having the planar surface Sp1 of the surface of each of the conductive sheets, all the sublayers remained even after the removal step, and thus a low resistance was maintained.

In the second region having the wavy surface Sw2 of the surface of each of the conductive sheets, the stacked film was opaque and had a low resistance before the removal step but became transparent and had a high resistance after the removal step. It is believed that this is because the Ag sublayer and the upper sublayers formed on the Ag sublayer were removed in the removal step, and the bottom ITO sublayer etc. remained.

In the third region having the wavy surface Sw3 of the surface of each of the conductive sheets, the stacked film was opaque and had a low resistance before the removal step but became transparent and was in an insulating state after the removal step. It is believed that this is because all the sublayers were removed in the removal step.

Reference Example 2-1

(Film Formation Step)

First, a PET sheet having a smooth surface was prepared. Next, an ITO layer was formed on the PET sheet by a sputtering method. The ultimate degree of vacuum was set to 0.00015 Pa, and the degree of vacuum during deposition was set to 0.24 Pa. During the deposition, Ar gas and $O_2$ gas were introduced at a mixing ratio of Ar:$O_2$=20:1. The deposition conditions were adjusted so that the ITO layer had a thickness of 30 nm.

(Annealing Step)

Next, the PET sheet having the ITO layer thereon was subjected to annealing in air at 150° C. for 60 minutes. Polycrystallization of the ITO layer was accelerated by this annealing. Next, the ITO layer was measured by X-ray diffraction (XRD) in order to confirm the accelerated state of polycrystallization. A peak attributable to $In_2O_3$ was observed.

Thus, a target optical sheet was prepared.

Reference Example 2-2

Film Formation Step and Annealing Step

First, the film formation step and the annealing step were performed as in Reference Example 2-1 to prepare a PET sheet having an annealed ITO layer.

(Removal Step)

Next, the PET sheet having been subjected to the annealing treatment was immersed in a solution with a pH of about 3 for 10 seconds to etch the ITO layer.

(Washing Step)

Next, the PET sheet having been subjected to the removal treatment was sequentially washed with pure water, isopropyl alcohol (IPA), and pure water.

Thus, a target optical sheet was prepared.

Reference Example 2-3

An optical sheet was prepared as in Reference Example 2-2 except that the immersion time was changed to 20 seconds.

Reference Example 2-4

An optical sheet was prepared as in Reference Example 2-2 except that the immersion time was changed to 30 seconds.

Reference Example 2-5

An optical sheet was prepared as in Reference Example 2-2 except that the immersion time was changed to 40 seconds.

Reference Example 2-6

An optical sheet was prepared as in Reference Example 2-2 except that the immersion time was changed to 50 seconds.

Reference Example 2-7

An optical sheet was prepared as in Reference Example 2-2 except that the immersion time was changed to 60 seconds.

Reference Example 3-1

(Transfer Step)

First, a quartz master including recessed nanostructures formed on a forming surface thereof was prepared. Next, an ultraviolet-curable resin was applied onto the quartz master having the nanostructures thereon, and a PET sheet having an easily adhesive layer thereon was brought into close contact with the ultraviolet-curable resin. The PET sheet was then detached while curing the ultraviolet-curable resin by irradiation of ultraviolet rays, thus preparing a PET sheet having a large number of nanostructures on the surface thereof.

The detailed configuration of the nanostructures formed on the surface of the PET sheet is as follows:

Arrangement of the structures: hexagonal lattice arrangement

Recessed or projecting shape of the structure: projecting shape

Entire shape of the structure: truncated cone shape

Array pitch of the structures: 250 nm

Height of the structure: 90 nm

Aspect ratio of the structure: 0.36

(Film Formation Step)

Next, an ITO layer was formed on the surface of the PET sheet having the nanostructures thereon by a sputtering method. The ultimate degree of vacuum was set to 0.00015 Pa, and the degree of vacuum during deposition was set to 0.24 Pa. During the deposition, Ar gas and $O_2$ gas were introduced at a mixing ratio of Ar:$O_2$=20:1. The deposition conditions were adjusted so that a film thickness of 30 nm in terms of flat sheet was obtained. The term "film thickness in terms of flat sheet" refers to a film thickness obtained when an ITO layer is formed on a flat sheet under the same deposition conditions as in the case where an ITO layer is formed on the surface of the PET sheet having the nanostructures thereon. According to a finding obtained by the engineers of the present application, the film thickness in terms of flat sheet is substantially equal to the film thickness at an apex portion of each of the structures.
(Annealing Step)
Next, the PET sheet having the ITO layer thereon was subjected to annealing in air at 150° C. for 60 minutes. Polycrystallization of the ITO layer was accelerated by this annealing. Next, the ITO layer was measured by X-ray diffraction (XRD) in order to confirm the accelerated state of polycrystallization. A peak attributable to $In_2O_3$ was observed.

Thus, a target optical sheet was prepared.

Reference Example 3-2

(Film Formation Step and Annealing Step)
First, the film formation step and the annealing step were performed as in Reference Example 3-1 to prepare a PET sheet having an annealed ITO layer.
(Removal Step)
Next, the PET sheet having been subjected to the annealing treatment was immersed in a solution with a pH of about 3 for 10 seconds to remove the ITO layer.
(Washing Step)
Next, the PET sheet having been subjected to the removal treatment was sequentially washed with pure water, IPA, and pure water.

Thus, a target optical sheet was prepared.

Reference Example 3-3

An optical sheet was prepared as in Reference Example 3-2 except that the immersion time was changed to 20 seconds.

Reference Example 4-1

An optical sheet was prepared as in Reference Example 3-1 except that the array pitch of the structures was set to 250 nm, the height of the structure was changed to 120 nm, and the aspect ratio was changed to 0.48.

Reference Example 4-2

An optical sheet was prepared as in Reference Example 3-2 except that the array pitch of the structures was set to 250 nm, the height of the structure was changed to 120 nm, and the aspect ratio was changed to 0.48.

Reference Example 4-3

An optical sheet was prepared as in Reference Example 3-3 except that the array pitch of the structures was set to 250 nm, the height of the structure was changed to 120 nm, and the aspect ratio was changed to 0.48.

Reference Example 5-1

An optical sheet was prepared as in Reference Example 3-1 except that the array pitch of the structures was set to 250 nm, the height of the structure was changed to 155 nm, and the aspect ratio was changed to 0.62.

Reference Example 5-2

An optical sheet was prepared as in Reference Example 3-2 except that the array pitch of the structures was set to 250 nm, the height of the structure was changed to 155 nm, and the aspect ratio was changed to 0.62.

Reference Example 5-3

An optical sheet was prepared as in Reference Example 3-3 except that the array pitch of the structures was set to 250 nm, the height of the structure was changed to 155 nm, and the aspect ratio was changed to 0.62.

Reference Example 6-1

Film Formation Step and Annealing Step
The film formation step and the annealing step were performed as in Reference Example 3-1 except that the following prism sheet (manufactured by Sumitomo 3M Limited, trade name: T-BEF) was used to prepare a prism sheet having an annealed ITO layer.

Thus, a target optical sheet was prepared.
The detailed configuration of the prism sheet is as follows:
Arrangement of prisms (structures): one-dimensional arrangement
Recessed or projecting shape of the prism: projecting shape
Shape of the prism: columnar shape having an isosceles triangular cross section
Array pitch of the prisms: 10 μm
Height of the prism: 5 μm
Aspect ratio of the prism: 0.50

Reference Example 6-2

Film Formation Step and Annealing Step
First, the film formation step and the annealing step were performed as in Reference Example 6-1 to prepare a prism sheet having an annealed ITO layer.
(Removal Step)
Next, the prism sheet having been subjected to the annealing treatment was immersed in a solution with a pH of about 3 for 10 seconds to etch the ITO layer.
(Washing Step)
Next, the prism sheet having been subjected to the removal treatment was sequentially washed with pure water, IPA, and pure water.

Thus, a target optical sheet was prepared.

Reference Example 6-3

An optical sheet was prepared as in Reference Example 6-2 except that the immersion time was changed to 20 seconds.

Reference Example 6-4

An optical sheet was prepared as in Reference Example 6-2 except that the immersion time was changed to 30 seconds.

Reference Example 6-5

An optical sheet was prepared as in Reference Example 6-2 except that the immersion time was changed to 40 seconds.
(Surface Resistance)
The surface resistance of the surface of each of the optical sheets of Reference Examples 2-1 to 6-5 prepared as described above was measured by a four-probe method. The results are shown in Table 3.

(Reciprocal of Initial Rate of Change)

The reciprocal of an initial rate of change (i.e., the change in the imaginary thickness) for the surface of each of the optical sheets of Reference Examples 2-1 to 6-5 prepared as described above was determined by the formula below. The results are shown in Table 4 and FIG. 27.

(Reciprocal of initial rate of change)=(surface resistance of sample before removal)/(surface resistance of sample after removal)

Table 3 shows the evaluation results of the surface resistance of the optical sheets according to Reference Examples 2-1 to 6-5.

TABLE 3

| | Pitch | Height | Aspect ratio | Immersion time (sec) | | | | | | |
|---|---|---|---|---|---|---|---|---|---|---|
| | | | | 0 | 10 | 20 | 30 | 40 | 50 | 60 |
| Reference Examples 2-1 to 2-7 | 0 | 0 | 0.00 | 208 | 187 | 193 | 194 | 197 | 201 | 201.8 |
| Reference Examples 3-1 to 3-3 | 250 nm | 90 nm | 0.36 | 228 | 568 | ∞ | — | — | — | — |
| Reference Examples 4-1 to 4-3 | 250 nm | 120 nm | 0.48 | 258 | 2,900 | ∞ | — | — | — | — |
| Reference Examples 5-1 to 5-3 | 250 nm | 155 nm | 0.62 | 309 | 9,000 | ∞ | — | — | — | — |
| Reference Examples 6-1 to 6-5 | 10 μm | 5 μm | 0.50 | 282 | 634 | 740 | 3,000 | ∞ | — | — |

Unit: Ω/sq.

Table 4 shows the evaluation results of the reciprocal of the initial rate of change of the optical sheets according to Reference Examples 2-1 to 6-5.

TABLE 4

| | Pitch | Height | Aspect ratio | Immersion time (sec) | | | | | | |
|---|---|---|---|---|---|---|---|---|---|---|
| | | | | 0 | 10 | 20 | 30 | 40 | 50 | 60 |
| Reference Examples 2-1 to 2-7 | 0 | 0 | 0.00 | 1 | 1.11 | 1.08 | 1.07 | 10.6 | 1.03 | 1.03 |
| Reference Examples 3-1 to 3-3 | 250 nm | 90 nm | 0.36 | 1 | 0.40 | 0 | — | — | — | — |
| Reference Examples 4-1 to 4-3 | 250 nm | 120 nm | 0.48 | 1 | 0.09 | 0 | — | — | — | — |
| Reference Examples 5-1 to 5-3 | 250 nm | 155 nm | 0.62 | 1 | 0.03 | 0 | — | — | — | — |
| Reference Examples 6-1 to 6-5 | 10 μm | 5 μm | 0.50 | 1 | 0.44 | 0.38 | 0.09 | 0 | — | — |

Figure 27:
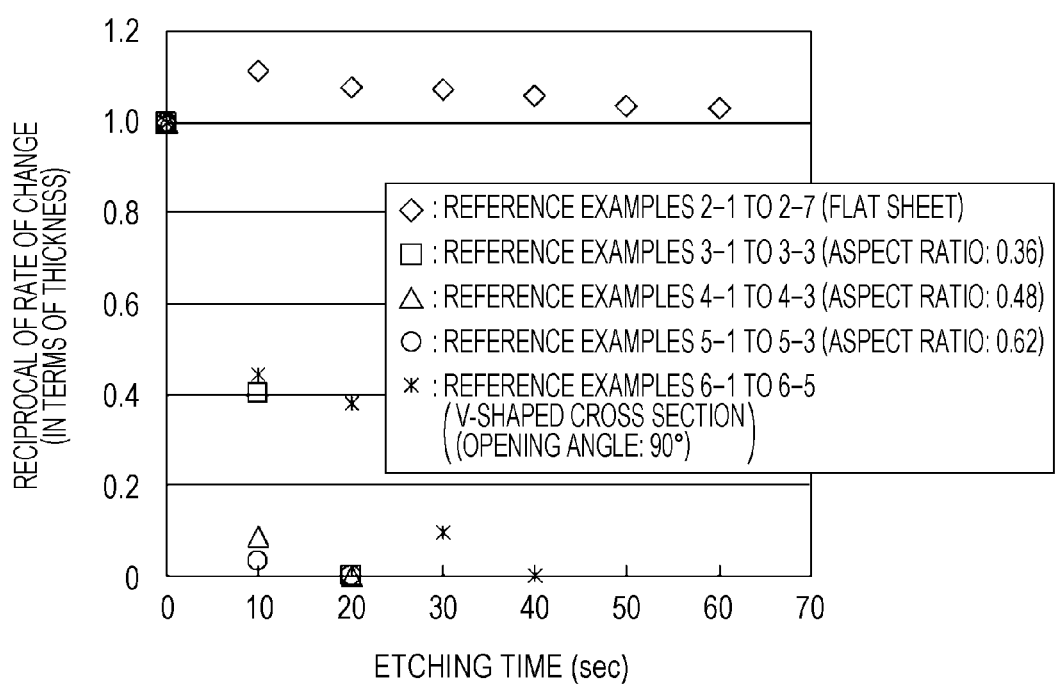
FIG. 27 is a graph showing a relationship between the etching time and the reciprocal of an initial rate of change (change in the imaginary thickness).

The following was found from Tables 3 and 4 and FIG. 27.

In Reference Examples 2-1 to 2-7, in each of which an ITO layer was formed on a flat surface, there is a tendency that the thickness of the ITO layer is hardly changed by the removal and the surface resistance remains substantially constant. In contrast, in Reference Examples 3-1 to 3-3, Reference Examples 4-1 to 4-3, and Reference Examples 5-1 to 5-3, in each of which an ITO layer was formed on a large number of structures, there is a tendency that the thickness of the ITO layer is rapidly reduced by the removal and the surface resistance is rapidly increased.

In Reference Examples 6-1 to 6-5, in each of which a large number of structures were formed at an array pitch on the order of micrometers, there is a similar tendency to that in Reference Examples 3-1 to 3-3, Reference Examples 4-1 to 4-3, and Reference Examples 5-1 to 5-3, in each of which a large number of structures were formed at an array pitch on the order of nanometers.

While embodiments of the present application have been specifically described, the present application is not limited to the foregoing embodiments. Various modifications can be made on the basis of the technical idea of the present application.

For example, the configurations, methods, steps, shapes, materials, numerical values, and the like described in the above embodiments are merely exemplary, and other configurations, methods, steps, shapes, materials, numerical values, and the like, all of which are different from the above, may be used if necessary.

Furthermore, the configurations, methods, steps, shapes, materials, numerical values, and the like described in the above embodiments may be combined with each other without departing from the gist of the present application.

In the above embodiments, a description has been made of examples in which the present application is applied to a single-layer conductive element having a wiring pattern on one surface or both surfaces thereof. However, the present application is not limited thereto, and is applicable to a multilayer conductive element.

In the above embodiments, a description has been made of, as an example, the case where a wiring pattern is formed on a planar surface of a base. However, the surface on which the wiring pattern is formed is not limited to a planar surface. Alternatively, a wiring pattern may be formed on a curved surface of a base.

In the above embodiments, a description has been made of examples in which the present application is applied to a liquid crystal display device. However, the present application is not limited thereto, and is applicable to various display devices (such as an EL device and electronic paper) driven by a passive matrix driving method.

In the above embodiments, a description has been made of an example in which the present application is applied to a projection-type capacitive touch panel in which two bases are overlapped with each other. However, the present application is not limited thereto. The present application is applicable to, for example, a projection-type capacitive touch panel including a single base having electrodes on both surfaces thereof.

In the above embodiments, a description has been made of an example in which the present application is applied to a display device which is an example of an electronic apparatus. However, the present application is not limited thereto. The present application is applicable to various electronic apparatuses including a display device, a wiring element (such as a printed board), etc.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A conductive element comprising:
   a base having a first wavy surface, a second wavy surface, and a third wavy surface;
   a first layer provided on the first wavy surface; and
   a second layer provided on the second wavy surface,
   wherein the first layer has a multilayer structure in which two or more sublayers are stacked,
   the second layer has a single-layer or multilayer structure including part of the sublayers constituting the first layer,
   the first layer and the second layer form a conductive pattern portion, and
   the first wavy surface, the second wavy surface, and the third wavy surface satisfy the following relationship:

$0 \le (Am1/\lambda m1) < (Am2/\lambda m2) < (Am3/\lambda m3) \le 1.8$ where Am1 is a mean amplitude of vibrations of the first wavy surface, Am2 is a mean amplitude of vibrations of the second wavy surface, Am3 is a mean amplitude of vibrations of the third wavy surface, $\lambda m1$ is a mean wavelength of the first wavy surface, $\lambda m2$ is a mean wavelength of the second wavy surface, and $\lambda m3$ is a mean wavelength of the third wavy surface.

2. The conductive element according to claim 1,
   wherein the first wavy surface, the second wavy surface, and the third wavy surface satisfy the following relationships:

$(Am1/\lambda m1)=0$ and $0<(Am2/\lambda m2)<(Am3/\lambda m3) \le 1.8$, and a wavelength $\lambda 2$ of the second wavy surface and a wavelength $\lambda 3$ of the third wavy surface are each equal to or less than a wavelength of visible light.

3. The conductive element according to claim 1,
   wherein the first wavy surface, the second wavy surface, and the third wavy surface satisfy the following relationship:

$0<(Am1/\lambda m1)<(Am2/\lambda m2)<(Am3/\lambda m3) \le 1.8$, and a wavelength $\lambda 1$ of the first wavy surface, a wavelength $\lambda 2$ of the second wavy surface, and a wavelength $\lambda 3$ of the third wavy surface are each equal to or less than a wavelength of visible light.

4. The conductive element according to claim 1,
   wherein the first wavy surface, the second wavy surface, and the third wavy surface satisfy the following relationships:

$(Am1/\lambda m1)=0$ and $0<(Am2/\lambda m2)<(Am3/\lambda m3) \le 1.8$, and a wavelength $\lambda 2$ of the second wavy surface and a wavelength $\lambda 3$ of the third wavy surface are each 100 µm or less.

5. The conductive element according to claim 1,
   wherein the first wavy surface, the second wavy surface, and the third wavy surface satisfy the following relationship:

$0<(Am1/\lambda m1)<(Am2/\lambda m2)<(Am3/\lambda m3) \le 1.8$, and a wavelength $\lambda 1$ of the first wavy surface, a wavelength $\lambda 2$ of the second wavy surface, and a wavelength $\lambda 3$ of the third wavy surface are each 100 µm or less.

6. The conductive element according to claim 1, further comprising:
   a third layer provided on the third wavy surface,
   wherein the third layer includes part of sublayers constituting the second layer, and
   the first layer, the second layer, and the third layer satisfy the following relationship:

$S1>S2>S3$ where S1 is a unit area of the first layer, S2 is a unit area of the second layer, and S3 is a unit area of the third layer.

7. The conductive element according to claim 6,
   wherein the first layer and the second layer are continuously formed on the first wavy surface and the second wavy surface, respectively, and
   the third layer is discontinuously formed on the third wavy surface.

8. The conductive element according to claim 1, further comprising:
   a third layer provided on the third wavy surface,
   wherein the first layer, the second layer, and the third layer satisfy the following relationship:

$d1>d2>d3$ where d1 is a mean thickness of the first layer, d2 is a mean thickness of the second layer, and d3 is a mean thickness of the third layer.

9. The conductive element according to claim 1,
   wherein the first layer includes a conductive sublayer, a first functional sublayer provided on the conductive sublayer, and a second functional sublayer provided on the first functional sublayer, and
   the second layer includes the conductive sublayer.

10. The conductive element according to claim 9, wherein a second functional sublayer is further provided between the conductive sublayer and the first functional sublayer.

11. The conductive element according to claim 9,
wherein the conductive sublayer is a transparent conductive sublayer containing an oxide semiconductor, and
the oxide semiconductor contains indium tin oxide or zinc oxide.

12. The conductive element according to claim 11, wherein the oxide semiconductor is in a mixed state of an amorphous phase and a polycrystalline phase.

13. The conductive element according to claim 9, wherein the first functional sublayer and the second functional sublayer are composed of different materials.

14. The conductive element according to claim 13,
wherein the first functional sublayer and the second functional sublayer are metal sublayers, and
the metal sublayers each contain at least one selected from the group consisting of Ag, Al, Au, Pt, Pd, Ni, Cr, Nb, W, Mo, Ti, Cu, and Nd.

15. The conductive element according to claim 13, wherein the first functional sublayer and the second functional sublayer each contain at least one selected from the group consisting of oxides and transition metal compounds.

16. The conductive element according to claim 15, wherein the first functional sublayer and the second functional sublayer each contain at least one of a sublayer in a mixed state of an amorphous phase and a polycrystalline phase and a polycrystalline sublayer.

17. A wiring element comprising the conductive element according to claim 1.

18. An information input device comprising the conductive element according to claim 1.

19. A display device comprising the conductive element according to claim 1.

20. An electronic apparatus comprising the conductive element according to claim 1.

21. A master for preparing the conductive element according to claim 1.

* * * * *